US010199337B2

(12) United States Patent
Park et al.

(10) Patent No.: US 10,199,337 B2
(45) Date of Patent: Feb. 5, 2019

(54) ELECTRONIC COMPONENT PACKAGE AND METHOD OF MANUFACTURING THE SAME

(71) Applicant: SAMSUNG ELECTRO-MECHANICS CO., LTD., Suwon-si, Gyeonggi-do (KR)

(72) Inventors: Dae Hyun Park, Suwon-si (KR); Han Kim, Suwon-si (KR); Kang Heon Hur, Suwon-si (KR); Young Gwan Ko, Suwon-si (KR); Jung Ho Shim, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/144,162

(22) Filed: May 2, 2016

(65) Prior Publication Data

US 2016/0338202 A1    Nov. 17, 2016

(30) Foreign Application Priority Data

May 11, 2015  (KR) .................. 10-2015-0065177
Oct. 5, 2015   (KR) .................. 10-2015-0139682
Apr. 19, 2016  (KR) .................. 10-2016-0047455

(51) Int. Cl.
*H05K 7/00*      (2006.01)
*H01L 23/00*     (2006.01)
(Continued)

(52) U.S. Cl.
CPC .............. *H01L 24/00* (2013.01); *H01L 23/48* (2013.01); *H01L 24/19* (2013.01); *H01L 21/568* (2013.01);
(Continued)

(58) Field of Classification Search
CPC ........... H01L 2224/48091; H01L 23/48; H01L 24/00; H01L 24/19; H01L 2924/00014;
(Continued)

(56) References Cited

U.S. PATENT DOCUMENTS 8,064,215 B2   11/2011  Chung et al.
8,227,927 B2    7/2012  Chen et al.
(Continued)

FOREIGN PATENT DOCUMENTS

JP    2003-309213 A    10/2003
JP    2003-309243 A    10/2003
(Continued)

OTHER PUBLICATIONS

Notice of Allowance issued in related U.S. Appl. No. 15/297,831, dated Jan. 30, 2018.
(Continued)

*Primary Examiner* — Yuriy Semenenko
(74) *Attorney, Agent, or Firm* — McDermott Will & Emery LLP

(57) ABSTRACT

An electronic component package and a method of manufacturing the same are provided. The electronic component package includes a frame having a through-hole, an electronic component disposed in the through-hole of the frame, and a redistribution part disposed at one side of the frame and the electronic component. One or more first wiring layers of the frame are electrically connected to the electronic component through the redistribution part.

2 Claims, 62 Drawing Sheets

(51) Int. Cl.
*H01L 23/48* (2006.01)
*H05K 1/02* (2006.01)
*H05K 1/18* (2006.01)
*H01L 21/56* (2006.01)

(52) U.S. Cl.
CPC ............ *H01L 2224/04105* (2013.01); *H01L 2224/12105* (2013.01); *H01L 2224/16227* (2013.01); *H01L 2224/24195* (2013.01); *H01L 2224/32145* (2013.01); *H01L 2224/32225* (2013.01); *H01L 2224/48091* (2013.01); *H01L 2224/48227* (2013.01); *H01L 2224/73204* (2013.01); *H01L 2224/73253* (2013.01); *H01L 2224/73265* (2013.01); *H01L 2225/0651* (2013.01); *H01L 2225/06517* (2013.01); *H01L 2225/06558* (2013.01); *H01L 2225/1035* (2013.01); *H01L 2225/1041* (2013.01); *H01L 2225/1058* (2013.01); *H01L 2924/00014* (2013.01); *H01L 2924/15311* (2013.01); *H01L 2924/181* (2013.01); *H01L 2924/19105* (2013.01); *H01L 2924/3025* (2013.01); *H01L 2924/3511* (2013.01); *H05K 1/0271* (2013.01); *H05K 1/185* (2013.01); *H05K 2201/10674* (2013.01)

(58) Field of Classification Search
CPC ............. H01L 21/4853; H01L 21/4857; H01L 21/486; H01L 21/568; H01L 21/6836; H01L 2221/68372; H01L 2221/68386; H01L 2224/0401
See application file for complete search history.

(56) References Cited

U.S. PATENT DOCUMENTS

| | | | |
|---|---|---|---|
| 8,320,134 B2* | 11/2012 | Su | H01L 23/49827 174/262 |
| 8,432,022 B1 | 4/2013 | Huemoeller et al. | |
| 8,704,365 B2 | 4/2014 | Park et al. | |
| 8,736,033 B1* | 5/2014 | Chuo | H01L 23/552 257/659 |
| 8,941,230 B2 | 1/2015 | Kyozuka et al. | |
| 2007/0045821 A1 | 3/2007 | Cho et al. | |
| 2007/0096292 A1 | 5/2007 | Machida | |
| 2009/0085192 A1 | 4/2009 | Hsu et al. | |
| 2009/0218118 A1 | 9/2009 | Tani | |
| 2009/0237900 A1* | 9/2009 | Origuchi | H01L 23/49838 361/763 |
| 2010/0159647 A1 | 6/2010 | Ito et al. | |
| 2010/0301474 A1 | 12/2010 | Yang | |
| 2011/0024899 A1 | 2/2011 | Masumoto et al. | |
| 2011/0068459 A1 | 3/2011 | Pagaila et al. | |
| 2011/0215464 A1 | 9/2011 | Guzek et al. | |
| 2012/0313226 A1 | 12/2012 | Koizumi et al. | |
| 2013/0106549 A1* | 5/2013 | Nezu | H01F 5/06 336/96 |
| 2013/0249115 A1* | 9/2013 | Lin | H01L 23/13 257/777 |
| 2014/0070396 A1* | 3/2014 | Kyozuka | H01L 24/19 257/698 |
| 2014/0291859 A1 | 10/2014 | Kiwanami et al. | |
| 2014/0360765 A1* | 12/2014 | Kiwanami | H05K 1/185 174/260 |
| 2015/0001708 A1* | 1/2015 | Lin | H01L 23/49811 257/737 |
| 2015/0016078 A1 | 1/2015 | Yang et al. | |
| 2015/0062848 A1 | 3/2015 | Lee et al. | |
| 2015/0200185 A1* | 7/2015 | Yu | H01L 24/17 257/737 |
| 2015/0364394 A1* | 12/2015 | Lin | H01L 24/03 257/734 |
| 2016/0027766 A1 | 1/2016 | Chung | |
| 2016/0081194 A1* | 3/2016 | Sato | H05K 1/185 361/761 |

FOREIGN PATENT DOCUMENTS

| | | |
|---|---|---|
| JP | 2007-123524 A | 5/2007 |
| JP | 2014-056925 A | 3/2014 |
| JP | 2014-192452 A | 10/2014 |
| JP | 2015-050457 A | 3/2015 |
| KR | 10-2012-0098844 A | 9/2012 |
| WO | 2011/090570 A2 | 7/2011 |

OTHER PUBLICATIONS

Office Action issued incorresponding Japanese Patent Application No. 2016-093940, dated Jun. 5, 2018.
Non-Final Office Action issued in corresponding parent Patent U.S. Appl. No. 15/944,321, dated Aug. 16, 2018.
Korean Office Action issued in Application No. 10-2016-0047455 dated Dec. 17, 2018, with English translation.
Office Action issued in related U.S. Appl. No. 15/877,021, dated Jul. 19, 2018.

* cited by examiner

II-II'

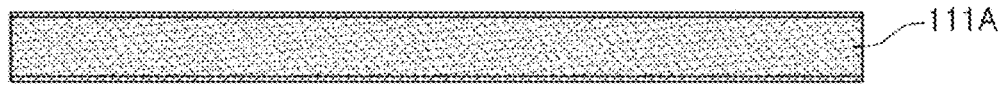
FIG. 14A
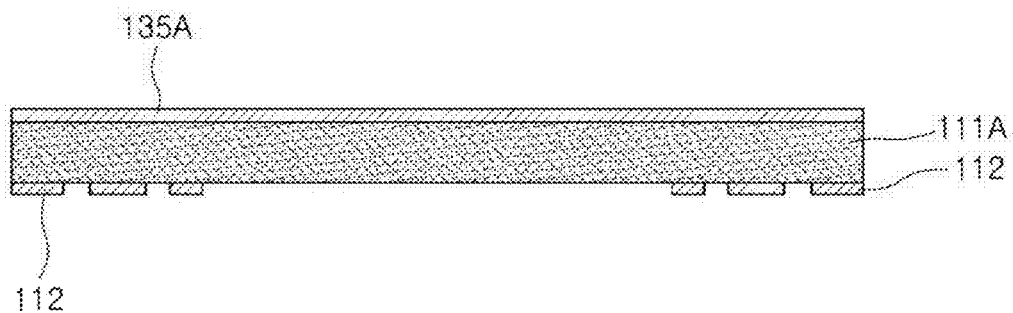
FIG. 14B
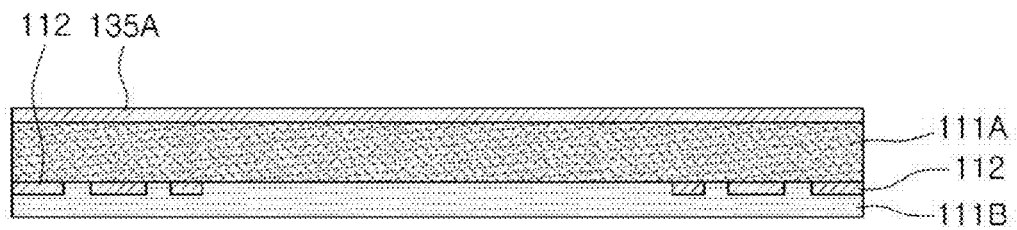
FIG. 14C
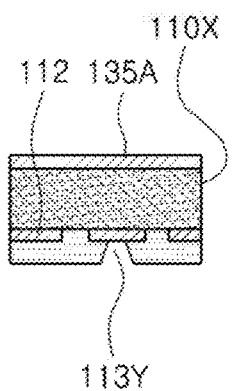 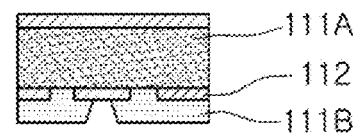
FIG. 14D

ELECTRONIC COMPONENT PACKAGE AND METHOD OF MANUFACTURING THE SAME

CROSS-REFERENCE TO RELATED APPLICATIONS

This application claims benefits of priorities to Korean Patent Application Nos. 10-2015-0065177 filed on May 11, 2015, 10-2015-0139682 filed on Oct. 5, 2015, and 10-2016-0047455 filed on Apr. 19, 2016, with the Korean Intellectual Property Office, the disclosures of which are incorporated herein by reference.

BACKGROUND

1. Field

The present disclosure relates to an electronic component package and a method of manufacturing the same.

2. Description of Related Art

An electronic component package is defined as package technology for electrically connecting an electronic component to a printed circuit board (PCB), such as a main board of an electronic device, or the like, and protecting the electronic component from external impact, and is distinguished from an embedded technology of embedding an electronic component in a printed circuit board, such as an interposer substrate. Meanwhile, one of the main recent trends within the development of technology related to electronic components is to reduce a size of electronic components. Therefore, in a package field, and in accordance with a rapid increase in a demand for compact electronic components, or the like, implementation of an electronic component package having a small size and including a plurality of pins has been demanded.

One type of package technology suggested in order to satisfy the technical demand as described above is a wafer level package (WLP) using a redistribution wiring of an electrode pad of an electrode component formed on a wafer. An example of the wafer level package includes a fan-in wafer level package and a fan-out wafer level package. In particular, the fan-out wafer level package has a compact size and is advantageous in implementing a plurality of pins. Therefore, recently, the fan-out wafer level package has been actively developed.

Meanwhile, due to structural characteristics of the wafer level package, a redistribution part is secured after the electronic component is disposed on the wafer. In this case, a defect occurring in processes after the electronic component is disposed causes a decrease in a yield of the electronic component.

SUMMARY

An aspect of the present disclosure may provide an electronic component package in which a problem that a yield of an electronic component is decreased may be solved, a method of manufacturing the same, and a package-on-package structure.

According to an aspect of the present disclosure, a new package structure in which wiring layers capable of performing a redistribution function of an electronic component may be introduced before an electronic component is disposed may be provided.

According to an aspect of the present disclosure, an electronic component package may include: a frame having a through-hole and one or more first wiring layers; an electronic component disposed in the through-hole of the frame; and a redistribution part disposed on one side of the frame and the electronic component, wherein the one or more first wiring layers are electrically connected to the electronic component through the redistribution part.

According to another aspect of the present disclosure, an electronic component package may include: a frame including a first insulating layer, two or more wiring layers disposed below the first insulating layer, and a second insulating layer disposed between the two or more wiring layers; an electronic component disposed in a through-hole penetrating through the frame; and a redistribution part electrically connected to the two or more wiring layers and the electronic component and disposed on the electric component, wherein the two or more wiring layers and the second insulating layer are disposed between the redistribution part and the first insulating layer.

According to another aspect of the present disclosure, a method of manufacturing an electronic component package may include: forming a frame by preparing a first insulating layer, forming a first wiring layer at one side of the first insulating layer, forming a second insulating layer embedding the first wiring layer therein at one side of the first insulating layer, and forming a through-hole penetrating through the first and second insulating layers; disposing an electronic component in the through-hole of the frame; and forming a redistribution part at one side of the frame and the electronic component, wherein the first wiring layer is formed before the disposing of the electronic component.

According to another aspect of the present disclosure, a method of manufacturing an electronic component package may include: preparing a frame including a plurality of insulating layers and a plurality of wiring layers; forming a through-hole penetrating through the entire frame; attaching the frame and an electronic component onto a temporary substrate, wherein the electronic component is positioned within the through-hole of the frame; encapsulating the electronic component by filling an encapsulant at least into the through-hole of the frame; separating the temporary substrate from surfaces of the frame, the encapsulant, and the electronic component; and forming a redistribution part onto the surfaces of the frame, the encapsulant, and the electronic component, and thus the redistribution part electrically connects the electronic component to the plurality of wiring layers of the frame.

BRIEF DESCRIPTION OF DRAWINGS

The above and other aspects, features, and advantages of the present disclosure will be more clearly understood from the following detailed description taken in conjunction with the accompanying drawings, in which:

FIGS. 14A through 14L are schematic views illustrating examples of processes of manufacturing the electronic component package of FIG. 12;

DETAILED DESCRIPTION

Figure 1:
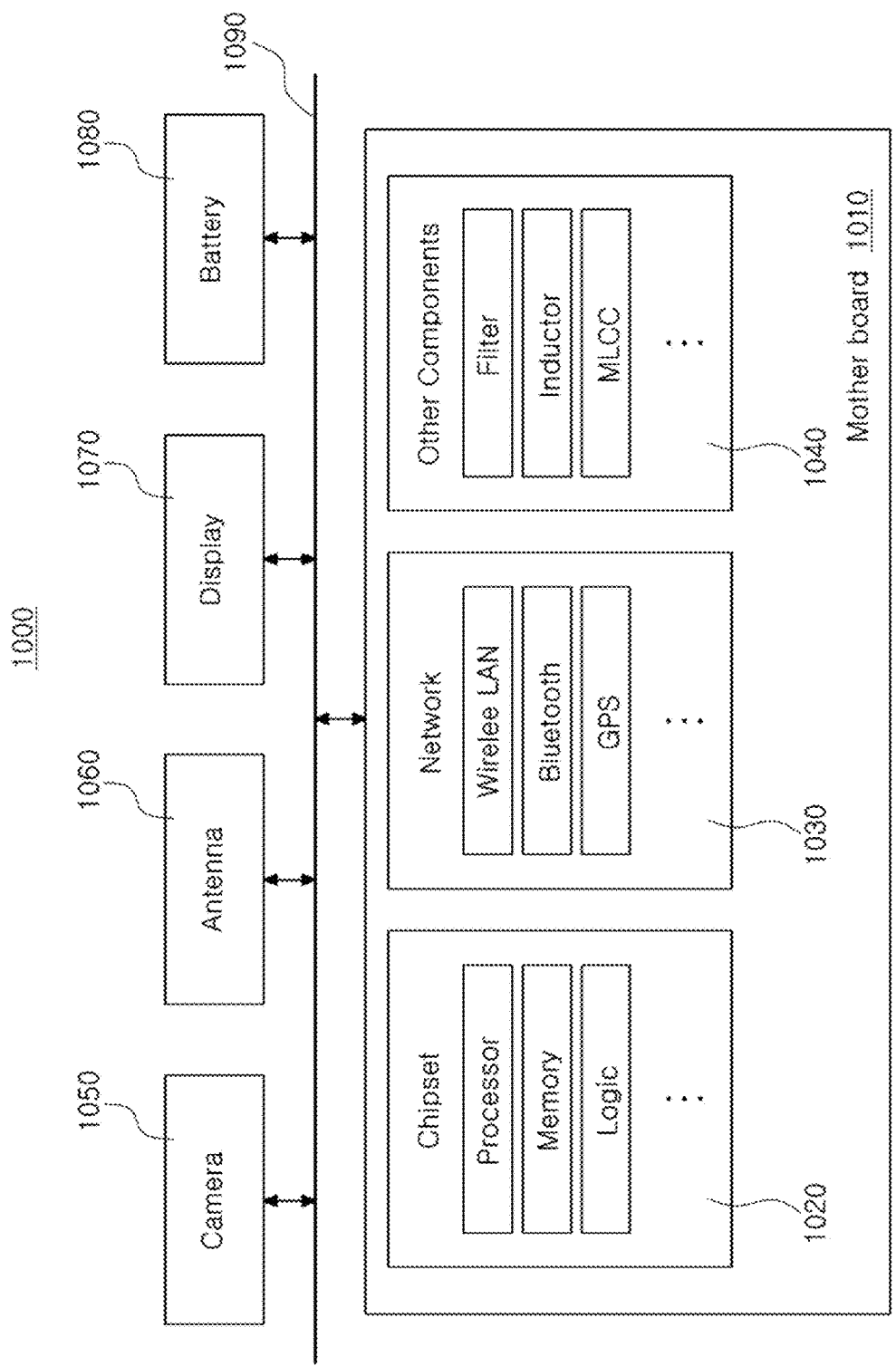
FIG. 1 is a block diagram schematically illustrating an example of an electronic device system.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted by one or a combination thereof.

The contents of the present disclosure described below may have a variety of configurations and propose only a required configuration herein, but are not limited thereto.

Electronic Device

FIG. 1 is a block diagram schematically illustrating an example of an electronic device system.

Referring to FIG. 1, an electronic device 1000 may accommodate a mother board 1010 therein. Chip related components 1020, network related components 1030, other components 1040, and the like, may be physically and/or electrically connected to the mother board 1010. These components may be connected to other components to be described below by various signal lines 1090.

The chip related components 1020 may include a memory chip such as a volatile memory (for example, a dynamic random access memory (DRAM)), a non-volatile memory (for example, a read only memory (ROM)), a flash memory, etc.; an application processor chip such as a central processor (for example, a central processing unit (CPU)), a graphics processor (for example, a graphic processing unit (GPU)), a digital signal processor, a cryptographic processor, a micro processor, a micro controller, etc.; a logic chip such as an analog-to-digital converter, an application-specific integrated circuit (ASIC), etc.; and the like. However, the chip related components 1020 are not limited thereto, and may also include other types of chip related components. In addition, these components 1020 may be combined with each other.

The network related components 1030 may include protocols such as wireless fidelity (Wi-Fi) (Institute of Electrical and Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, 5G protocols, and any other wireless and wired protocols designated after the above-mentioned protocols. However, the network related components 1030 are not limited thereto, and may also include any of a plurality of other wireless or wired standards or protocols. In addition, these components 1030 may be combined with each other together with the chip related components 1020 described above.

Other components 1040 may include a high frequency inductor, a ferrite inductor, a power inductor, ferrite beads, a low temperature co-firing ceramic (LTCC), an electromagnetic interference (EMI) filter, a multilayer ceramic capacitor (MLCC), and the like. However, the other components 1040 are not limited thereto, and may also include passive components used for various other purposes, and the like. In addition, these components 1040 may be combined with each other together with the chip related components 1020 and/or the network related components 1030 described above.

The electronic device 1000 may include other components that may or may not be physically and/or electrically connected to the mother board 1010 depending on a kind thereof. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage (for example, a hard disk drive) (not illustrated), a compact disk (CD) (not illustrated), a digital versatile disk (DVD) (not illustrated), and the like. However, these other components are not limited thereto, and may also include other components used for various purposes depending on a kind of electronic device 1000.

The electronic device 1000 may be a smartphone, a personal digital assistant, a digital video camera, a digital still camera, a network system, a computer, a monitor, a tablet, a laptop, a netbook, a television, a video game console, a smart watch, or the like. However, the electronic device 1000 is not limited thereto, and may also be any other electronic device processing data.

Figure 2:
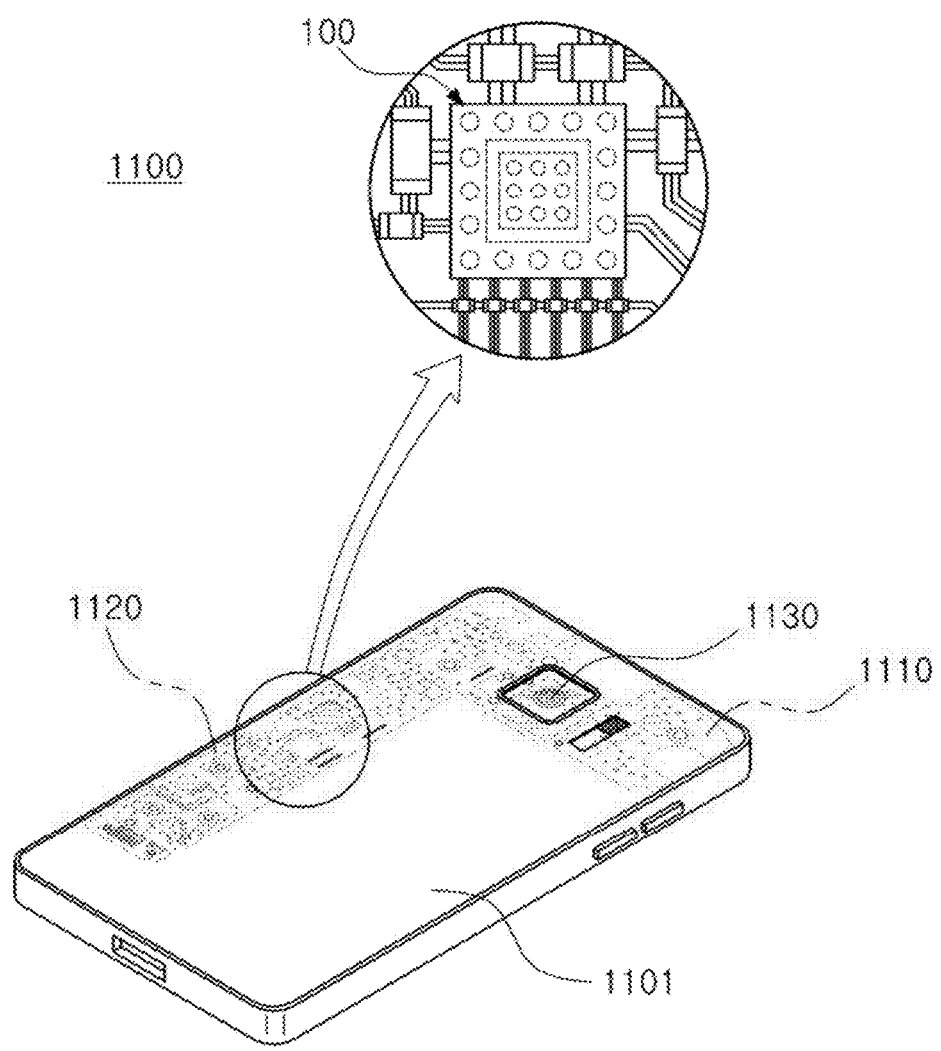
FIG. 2 is a view schematically illustrating an example of an electronic component package used in an electronic device.

FIG. 2 is a view schematically illustrating an example of an electronic component package used in an electronic device.

The electronic component package may be used for various purposes in the various electronic devices 1000 as described above. For example, a main board 1110 may be accommodated in a body 1101 of a smartphone 1100, and various electronic components 1120 may be physically and/or electrically connected to the main board 1110. In addition, another component that may be or may not be physically and/or electrically connected to the main board 1110, such as a camera 1130, may be accommodated in the body 1101. Here, some of the electronic components 1120 may be the chip related components as described above, and the electronic component package 100 may be, for example, an application processor among the chip related components, but is not limited thereto.

Electronic Component Package

Figure 3:
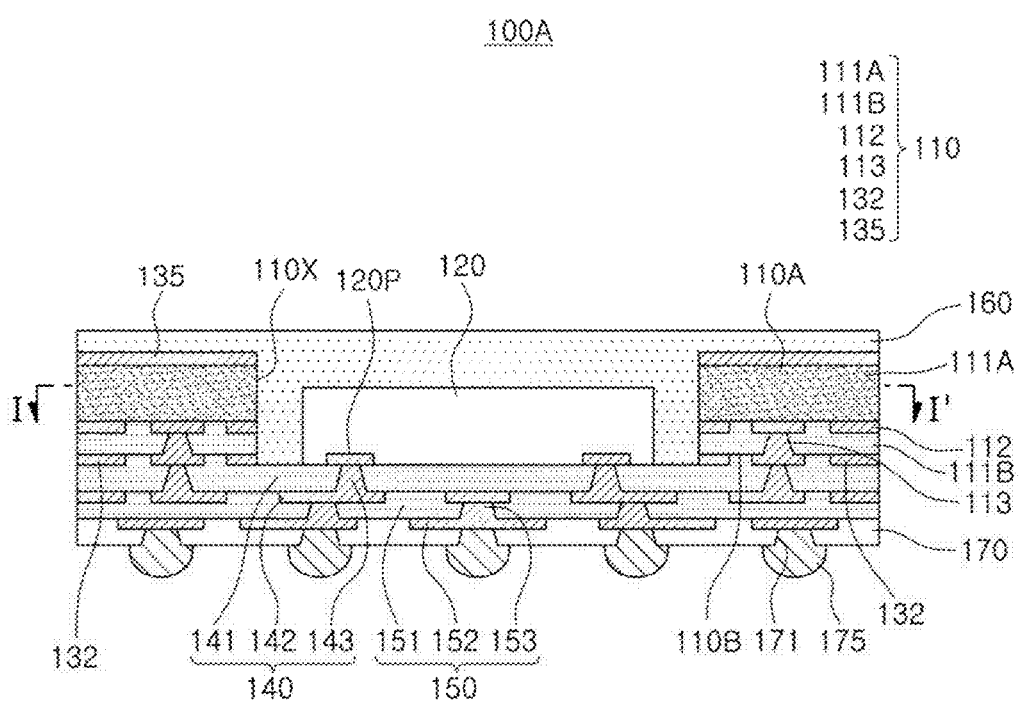
FIG. 3 is a cross-sectional view schematically illustrating an example of an electronic component package.

FIG. 3 is a cross-sectional view schematically illustrating an example of an electronic component package.

Figure 4:
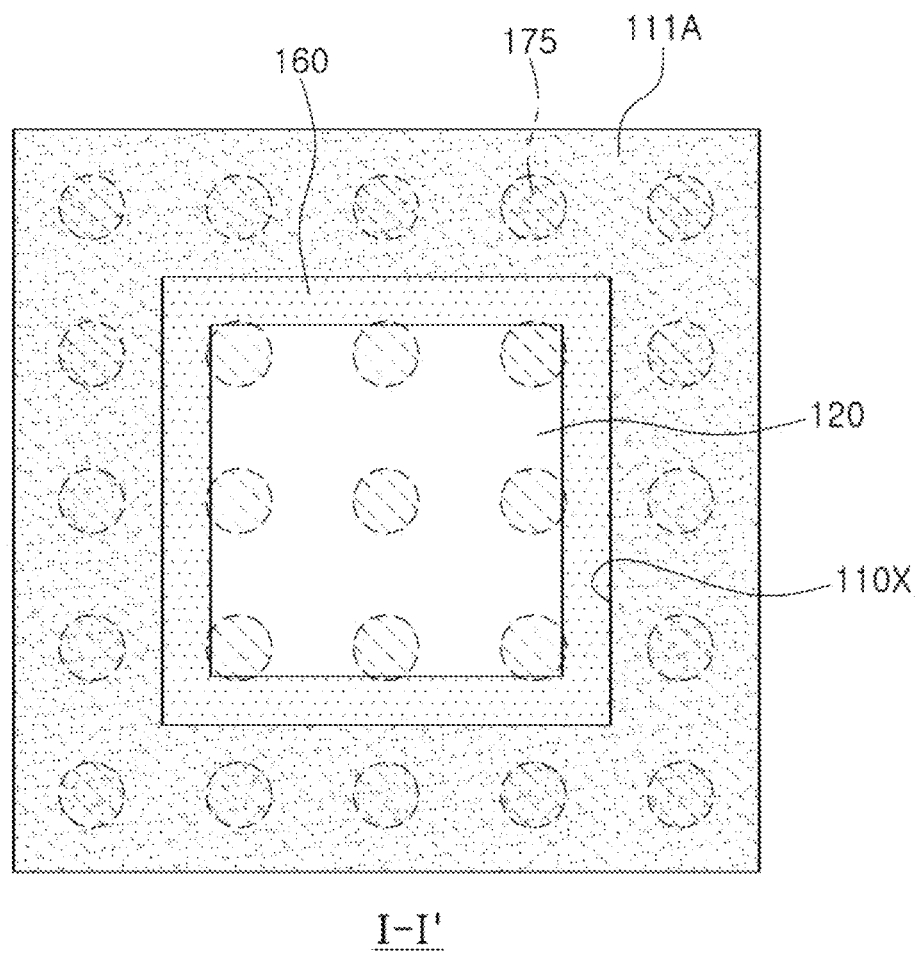
FIG. 4 is a schematic plan view of the electronic component package taken along line I-I' of FIG. 3.

FIG. 4 is a schematic plan view of the electronic component package taken along line I-I' of FIG. 3.

Referring to FIGS. 3 and 4, an electronic component package 100A according to an example may include a frame 110 having a through-hole 110X, an electronic component 120 disposed in the through-hole 110X of the frame 110, redistribution parts 140 and 150 disposed below the frame 110 and the electronic component 120, and an encapsulant 160 encapsulating the electronic component 120. The frame 110 may include a first insulating layer 111A, a second insulating layer 111B, a first wiring layer 112 disposed between the first and second insulating layers 111A and 111B, a metal layer 135 disposed on an upper surface of the first insulating layer 111A, a second wiring layer 132 disposed on a lower surface of the second insulating layer 111B, and vias 113 penetrating through the second insulating layer 111B. The through-hole 110X may sequentially penetrate through the metal layer 135, the first insulating layer 111A, the first wiring layer 112, the second insulating layer 111B, and the second wiring layer 132.

As described above, recently, the fan-out wafer level package having a small size and being advantageous in implementing a plurality of pins has been actively developed. Here, generally, the wafer level package has a structure in which the surrounding of the electronic component is simply molded and enclosed with an encapsulant such as an epoxy molding compound (EMC), or the like, and redistribution parts are formed below the wafer level package to implement redistribution of the electronic component. Here, as the number of layers implementing the redistribution part is increased, the probability that a defect will occur in a process of forming the redistribution part is increased, which causes a decrease in a yield of the electronic component since the electronic component is generally disposed in the electronic component package before the redistribution part is formed.

In addition, since the surrounding of the electronic component is simply encapsulated and enclosed with the encapsulant, it is difficult to control warpage occurring due to various causes, there is a limitation in fixing the electronic component, and it is difficult to utilize an encapsulating region as a routing region, and thus a degree of freedom of a design, or the like, is reduced.

Conversely, in a case in which the frame 110 that may perform a redistribution function of the electronic component is introduced into an encapsulant 160 encapsulating the electronic component 120 before the electronic component 120 is disposed, as in the electronic component package 100A according to an example, the numbers of layers of the redistribution parts 140 and 150 formed after the electronic component 120 is disposed may be reduced. Therefore, a problem in which the yield of the electronic component 120 is decreased due to a process defect after the electronic component 120 is disposed may be solved.

In addition, since rigidity of the electronic component package 100A may be improved through the frame 110, warpage may be more easily controlled, and since the electronic component 120 is disposed in the through-hole 110X of the frame 110, the electronic component 120 may be more firmly fixed through wall-surface adhesion. Moreover, since an upper surface 110A and a lower surface 110B of the frame 110 may be utilized as the routing region, a degree of freedom of a design may be improved. At least one of the first wiring layer 112 and the second insulating layer 111B may be at a level between upper and lower surfaces of the electronic component 120. The upper surface of the electronic component 120 as shown in FIG. 3 is at a level below the upper surface 110A of the frame 110 with respect to the redistribution parts 140 and 150; the present disclosure, however, is not limited thereto. The upper surface of the electronic component 120 may be at the same level as or above the upper surface 110A of the frame 110 but below an upper surface of the metal layer 135, or at the same level as or above the upper surface of the metal layer 135, with respect to the redistribution parts 140 and 150, as long as the metal layer 135 and the electronic component 120 are both covered by the encapsulant 160.

Hereinafter, respective components included in the electronic component package 100A according to an example will be described in more detail.

The purpose of the frame 110 may be to basically maintain the rigidity of the electronic component package 100A. The frame 110 may have the through-hole 110X enclosing the surrounding of the electronic component 120, and may enable the wall-surface adhesion of the electronic component 120 since the electronic component 120 is disposed in the through-hole 110X. The frame 110 may include the first wiring layer 112 and the second wiring layer 132. Since the first wiring layer 112 and the second wiring layer 132 are formed before the electronic component 120 is disposed, they may solve the problem in which the yield of the electronic component 120 is decreased. The frame 110 may provide a wider routing region to the electronic component package 100A, thereby further improving the degree of freedom of the design of the electronic component package 100A. In addition, a relative flat exterior surface of the encapsulant 160 encapsulating the electronic component 120 in the electronic component package 100A and uniformity of a thickness of the electronic component package 100A (not including protrusions of first external connection terminals 175 which will be described later) may be secured through the frame 110.

The frame 110 may have the upper surface 110A and the lower surface 110B opposing the upper surface 110A. The first insulating layer 111A, the second insulating layer 111B, and the first wiring layer 112 may be disposed between the upper surface 110A and the lower surface 110B. The frame 110 may have the through-hole 110X, which penetrates between the upper surface 110A and the lower surface 110B. The second wiring layer 132 may be disposed on the lower surface 110B of the frame. The frame 110 may include the vias 113 electrically connecting the first wiring layer 112 and the second wiring layer 132 to each other. The frame 110 may be a concept including components disposed between the upper surface 110A and the lower surface 110B, and components disposed on the upper surface 110A and the lower surface 110B. As an example, the frame 110 may be an upper concept including the first insulating layer 111A, the second insulating layer 111B, the first wiring layer 112, the second wiring layer 132, and the vias 113. The through-hole 110X may sequentially penetrate through the metal layer 135, the first insulating layer 111A, the first wiring layer 112, the second insulating layer 111B, and the second wiring layer 132.

The first insulating layer 111A may substantially maintain the rigidity of the electronic component package 100A, and a material of the first insulating layer 111A is not particularly limited as long as it may support the electronic component package 100A. For example, an insulating material may be used as a material of the first insulating layer 111A. Here, the insulating material may be a thermosetting resin such as an epoxy resin, a thermoplastic resin such as a polyimide resin, a resin having a reinforcement material such as a glass fiber and/or an inorganic filler impregnated in the thermosetting resin and the thermoplastic resin, such as a pre-preg, Ajinomoto Build up Film (ABF), FR-4, Bismaleimide Triazine (BT), or the like. Alternatively, a metal having excellent rigidity and thermal conductivity may be used as a material of the first insulating layer 111A. Here, the metal may be an Fe—Ni based alloy. In this case, a Cu plating may also be formed on a surface of the Fe—Ni based alloy in order to secure adhesion between the Fe—Ni based alloy and the encapsulant, an interlayer insulating material, or the like. In addition to the materials as described above, glass, ceramic, plastic, or the like, may also be used as a material of the first insulating layer 111A. A thickness of the first insulating layer 111A is not particularly limited, but may be designed depending on a thickness of the electronic component 120. For example, a thickness of the first insulating layer 111A may be about 100 μm to 500 μm depending on a kind of electronic component 120.

The second insulating layer 111B may be a kind of build-up layer for introducing the first wiring layer 112 and the second wiring layer 132, and a material of the second insulating layer 111B is not particularly limited as long as it is an insulating material. Here, the insulating material may be a thermosetting resin such as an epoxy resin, a thermoplastic resin such as a polyimide resin, a resin having a reinforcement material such as a glass fiber or an inorganic filler impregnated in the thermosetting resin and the thermoplastic resin, such as a pre-preg, ABF, FR-4, BT, or the like. Meanwhile, in a case in which a photosensitive insulating material such as a photo imagable dielectric (PID) resin is used as a material of the second insulating layer 111B, the second insulating layer 111B may be formed at a more reduced thickness, and via holes may be formed by a photolithography method. Therefore, sizes of the vias may be reduced, and thus a fine pitch (for example, 30 μm or less) may be easily implemented. A thickness of the second insulating layer 111B is not particularly limited, but may be variously designed depending on design particulars. For example, a thickness of the second insulating layer 111B except for the first wiring layer 112 may be about 5 μm to 20 μm, and a thickness of the second insulating layer 111B when considering a thickness of the first wiring layer 112 may be about 15 μm to 70 μm.

The first insulating layer 111A and the second insulating layer 111B may be formed of different materials. For example, the first insulating layer 111A may be formed of a material having particularly excellent rigidity, and the second insulating layer 111B may be formed of a photosensitive insulating material regardless of rigidity. As described above, materials appropriate for roles of the respective insulating layers 111A and 111B in the electronic component package may be selected and used. For example, the first insulating layer 111A may have an elastic modulus larger than that of the second insulating layer 111B. In addition, the first insulating layer 111A may have a thickness greater than that of the second insulating layer 111B. The elastic moduli and the thicknesses of the respective insulating layers 111A and 111B may also be related to roles of the respective insulating layers 111A and 111B in the electronic component package, it may be advantageous in maintaining the rigidity of the electronic component package and fixing the electronic component 120 that the first insulating layer 111A has a relatively great thickness, and it may be advantageous in reducing a size of the via 113 and shortening an electrical path that the second insulating layer 111B has a reduced thickness. However, the first insulating layer 111A and the second insulating layer 111B are not limited thereto, and may also be formed of the same material and have the same thickness.

The first wiring layer 112 may be disposed between the first insulating layer 111A and the second insulating layer 111B. For example, the first wiring layer 112 may be disposed on a lower surface of the first insulating layer 111A and embedded in the second insulating layer 111B. That is, the first wiring layer 112 may be disposed in the frame 110. Here, the meaning that the first wiring layer 112 is disposed in the frame 110 is that the first wiring layer 112 is disposed between the upper surface 110A and the lower surface 110B of the frame 110. The first wiring layer 112 may perform various functions depending on a design of the corresponding layer. For example, the first wiring layer may serve as a ground (GND) pattern, a power (PWR) pattern, a signal (S) pattern, and the likes as redistribution patterns. Here, the signal (S) pattern may include various signals except for the ground (GND) pattern, the power (PWR) pattern, and the like, such as data signals, and the like. In addition, the first wiring layer 112 may serve as a via pad, or the like, as a pad pattern. As described above, since the first wiring layer 112 may perform a redistribution function, the first wiring layer 112 may share redistribution functions of the redistribution parts 140 and 150. A conductive material such as copper (Cu), aluminum (Al), silver (Ag), tin (Sn), gold (Au), nickel (Ni), lead (Pb), or alloys thereof, may be used as a material of the first wiring layer 112. A thickness of the first wiring layer 112 is also not particularly limited, but may be, for example, about 10 μm to 50 μm.

The second wiring layer 132 may be disposed on the lower surface 110B of the second insulating layer 111B. That is, the second wiring layer 132 may be disposed outside of the frame 110. Here, the meaning that the second wiring layer 132 is disposed outside of the frame 110 is that the second wiring layer 132 is not disposed between the upper surface 110A and the lower surface 110B of the frame 110. The second wiring layer 132 may also serve as a redistribution pattern and/or a pad pattern. For example, the second wiring layer 132 may serve as a ground pattern as the redistribution pattern. In addition, the second wiring layer 132 may serve as a via pad, or the like, as a pad pattern. Since the second wiring layer 132 is also formed before the electronic component 120 is disposed, the second wiring layer 132 may solve the problem in which the yield of the electronic component 120 is decreased. Thicknesses of the metal layer 135 and the second wiring layer 132 are not particularly limited, but may be variously designed depending on design particulars. For example, thicknesses of the metal layer 135 and the second wiring layer 132 may be about 10 μm to 50 μm.

The vias 113 may electrically connect the first and second wiring layers 112 and 132 formed on different layers to each other, thereby forming an electrical path within the electronic component package 100A. The via 113 may penetrate through the second insulating layer 111B. A conductive material such as copper (Cu), aluminum (Al), silver (Ag), tin (Sn), gold (Au), nickel (Ni), lead (Pb), or alloys thereof, may be used as a material of the via 113. The via 113 may be completely filled with a conductive material. Alternatively, a conductive material may be formed along a wall of the via. In addition, the via 113 may have all of the shapes known in the related art, such as a tapered shape in which a diameter of the via becomes smaller toward a lower surface, a reverse tapered shape in which a diameter of the via becomes larger toward a lower surface, a cylindrical shape, and the like.

The metal layer 135 may be disposed on the upper surface 110A of the frame 110. The metal layer 135 may be an additional component for improving heat radiation characteristics and/or blocking electromagnetic waves, and a material of the metal layer 135 is not particularly limited as long as it is a metal having high thermal conductivity. For example, a material of the metal layer 135 may be copper (Cu), aluminum (Al), silver (Ag), tin (Sn), gold (Au), nickel (Ni), lead (Pb), or alloys thereof, but is not limited thereto.

The electronic component 120 may be various active components (such as a diode, a vacuum tube, a transistor, and the like) or passive components (such as an inductor, a condenser, a resistor, and the like). Alternatively, the electronic component 120 may be an integrated circuit (IC) indicating a chip in which hundreds to millions or more elements are integrated. The electronic component 120 may be an electronic component in which an integrated circuit is packaged in a flip-chip form, if necessary. The integrated circuit may be an application processor chip such as a central processor (such as a CPU), a graphics processor (such as a GPU), a digital signal processor, a cryptographic processor, a microprocessor, a micro controller, or the like, but is not limited thereto.

The electronic component 120 may have electrode pads 120P formed based on the lower surface of the electronic component 120. The electrode pad 120P may electrically connect the electronic component 120 to another component within the electronic component package or a component outside of the electronic component package, and a material of the electrode pad 120P is not particularly limited as long as it is a conductive material. The conductive material may be copper (Cu), aluminum (Al), silver (Ag), tin (Sn), gold (Au), nickel (Ni), lead (Pb), or alloys thereof, but is not limited thereto. The electrode pad 120P may be redistributed by the first wiring layer 112, the second wiring layer 132, the redistribution parts 140 and 150, and the like. The electrode pad 120P may have an embedded form or a protruding form. When the electrode pad 120P has an embedded form, the lower surface of the electronic component 120 is an outmost surface thereof. When the electrode pad 120P has a protruding form, the lower surface of the electronic component 120 is a surface thereof from which the electrode pad 120P protrudes. A thickness of the electronic component 120 in a cross section thereof is not particularly limited, and may be changed depending on a kind of electronic component 120. For example, in a case in which the electronic component is the integrated circuit, a thickness of the electronic component may be about 100 μm to 480 μm, but is not limited thereto.

In the case in which the electronic component 120 is the integrated circuit, the electronic component may have a body (not denoted by a reference number), a passivation layer (not illustrated), and the electrode pads 120P. The body may be formed on the basis of, for example, an active wafer. In this case, silicon (Si), germanium (Ge), gallium arsenide (GaAs), or the like, may be used as a basic material of the body. The passivation layer may serve to protect the body from external factors, and may be formed of, for example, an oxide layer, a nitride layer, or the like, or may be formed of a double layer of an oxide layer and a nitride layer. A conductive material such as copper (Cu), aluminum (Al), silver (Ag), tin (Sn), gold (Au), nickel (Ni), lead (Pb), or alloys thereof, may be used as a material of the electrode pad 120P. A layer on which the electrode pads 120P are formed may become an active layer.

At least one of the first wiring layer 112 and the second insulating layer 111B may be at a level between upper and lower surfaces of the electronic component 120. The upper surface of the electronic component 120 as shown in FIG. 3 is at a level below the upper surface 110A of the frame 110 with respect to the redistribution parts 140 and 150; the present disclosure, however, is not limited thereto. The upper surface of the electronic component 120 may be at the same level as or above the upper surface 110A of the frame 110 but below an upper surface of the metal layer 135, or at the same level as or above the upper surface of the metal layer 135, with respect to the redistribution parts 140 and 150, as long as the metal layer 135 and the electronic component 120 are both covered by the encapsulant 160.

The purpose of the redistribution parts 140 and 150 may be to basically redistribute the electrode pads 120P of the electronic component 120. Tens to hundreds of electrode pads 120P having various functions may be redistributed through the redistribution parts 140 and 150, and may be physically and/or electrically externally connected through first external connection terminals 175 to be described below depending on functions thereof. The redistribution parts 140 and 150 may be connected to the electronic component 120. That is, the redistribution parts 140 and 150 may support the electronic component 120.

The redistribution parts 140 and 150 may include redistribution part insulating layers 141 and 151 and redistribution part wiring layers 142 and 152 that are alternately stacked, and redistribution part vias 143 and 153 penetrating through the redistribution part insulating layers 141 and 151 to thereby be electrically connected to the redistribution part wiring layers 142 and 152, respectively. Although the redistribution parts 140 and 150 are formed of a plurality of layers 140 and 150, respectively, in the electronic component package 100A according to an example, the redistribution parts 140 and 150 are not limited thereto, and may be formed of a single layer, respectively, depending on a kind of electronic component 120, unlike as illustrated in the drawings. Alternatively, the redistribution parts may also be formed of more layers than the plurality of layers.

Materials of the redistribution part insulating layers 141 and 151 are also not particularly limited as long as they are an insulating material, for example, a thermosetting resin such as an epoxy resin, a thermoplastic resin such as a polyimide resin, a resin having a reinforcement material such as a glass fiber or an inorganic filler impregnated in the thermosetting resin and the thermoplastic resin, such as a pre-preg, ABF, FR-4, BT, or the like. In a case in which a photosensitive insulating material such as a PID resin is used as materials of the redistribution part insulating layers 141 and 151, the redistribution part insulating layers 141 and 151 may be formed at a reduced thickness, and a fine pitch may be easily implemented. Materials of the redistribution part insulating layers 141 and 151 may be the same as each other or may be different from each other, if necessary. Thicknesses of the redistribution part insulating layers 141 and 151 are also not particularly limited. For example, thicknesses of the redistribution part insulating layers 141 and 151 except for the redistribution part wiring layers 142 and 152 may be about 5 μm to 20 μm, and thicknesses of the redistribution part insulating layers 141 and 151 when considering thicknesses of the redistribution part wiring layers 142 and 152 may be about 15 μm to 70 μm.

The redistribution part wiring layers 142 and 152 may also serve as a redistribution pattern and/or a pad pattern, and a conductive material such as copper (Cu), aluminum (Al), silver (Ag), tin (Sn), gold (Au), nickel (Ni), lead (Pb), or alloys thereof, may be used as materials of the redistribution part wiring layers 142 and 152. The redistribution part wiring layers 142 and 152 may perform various functions depending on designs of the corresponding layers. For example, the redistribution part wiring layers 142 and 152 may serve as a ground (GND) pattern, a power (PWR) pattern, a signal (S) pattern, and the like, as redistribution patterns. Here, the signal (S) pattern may include various signals except for the ground (GND) pattern, the power (PWR) pattern, and the like, such as data signals, and the like. In addition, the redistribution part wiring layers 142 and 152 may serve as a via pad, an external connection terminal pad, or the like, as a pad pattern. Thicknesses of the redistribution part wiring layers 142 and 152 are also not particularly limited, and may be, for example, about 10 μm to 50 μm. A surface treatment layer may be formed on an exposed pattern of the redistribution part wiring layer 152, if necessary. The surface treatment layer is not particularly limited as long as it is known in the related art, and may be formed by, for example, electrolytic gold plating, electroless gold plating, organic solderability preservative (OSP) or electroless tin plating, electroless silver plating, electroless nickel plating/substituted gold plating, DIG plating, hot air solder leveling (HASL), or the like.

The redistribution part vias 143 and 153 may electrically connect the wiring layers 132, 142, and 152, and the electrode pads 120P formed on different layers to each other, thereby forming an electrical path within the electronic component package 100A. A conductive material such as copper (Cu), aluminum (Al), silver (Ag), tin (Sn), gold (Au), nickel (Ni), lead (Pb), or alloys thereof, may be used as materials of the redistribution part vias 143 and 153. The redistribution part vias 143 and 153 may also be completely filled with a conductive material. Alternatively, a conductive material may be formed along walls of the redistribution part vias 143 and 153. In addition, the redistribution part vias 143 and 153 may have all of the shapes known in the related art, such as a tapered shape in which a diameter of the via becomes smaller toward a lower surface, a reverse tapered shape in which a diameter of the via becomes larger toward a lower surface, a cylindrical shape, and the like.

The redistribution parts 140 and 150 may connect the frame 110 and the electronic component 120 to each other. Here, the meaning that the frame 110 and the electronic component 120 are connected to each other by the redistribution parts 140 and 150 is that the frame 110 and the electronic component 120 are spaced apart from each other, but the redistribution parts 140 and 150 are connected to both of the frame 110 and the electronic component 120, and thus the frame 110 and the electronic component 120 are connected to each other through the redistribution parts 140 and 150.

The frame 110 may be electrically connected to the electronic component 120 by a bypass. The redistribution parts 140 and 150 may be electrically connected directly to the electronic component 120. That is, since the frame 110 is positioned at a side portion of the electronic component, it may be electrically connected to the electronic component 120 through the redistribution parts 140 and 150. That is, the first wiring layer 112 and the second wiring layer 132 of the frame 110 may be electrically connected to the electronic component 120 through the redistribution parts 140 and 150, and the redistribution parts 140 and 150 may be electrically connected directly to the electronic component 120. The first wiring layer 112 and the second wiring layer 132 of the frame 110 may not be directly electrically connected to the electronic component 120.

The purpose of the encapsulant 160 may be to protect the electronic component 120. To this end, the encapsulant 160 may encapsulate at least portions of the frame 110 and the electronic component 120. An encapsulating form is not particularly limited, but may be a form enclosing the electronic component 120. For example, the encapsulant 160 may cover the electronic component 120, and may be provided in the remaining space within the through-hole 110X of the frame 110. In addition, the encapsulant 160 may also cover the frame 110. The encapsulant 160 may be provided in the through-hole 110X, thereby serving to reduce buckling of the electronic component 120 while serving as an adhesive. The encapsulant 160 may cover all the surfaces of the electronic component 120 except the lower surface of the electronic component 120. The encapsulant 160 may cover only a portion of the lower surface of the electronic component 120 depending on a protruding form of the electrode pad 120P of the electronic component 120.

The encapsulant 160 may include a plurality of layers formed of a plurality of materials. For example, a space within the through-hole 110X may be filled with a first encapsulant, and the frame 110 and the electronic component 120 may be covered with a second encapsulant. Alternatively, the frame 110 and the electronic component 120 may be covered at a predetermined thickness while filling the space within the through-hole 110X using the first encapsulant, and the second encapsulant may be again covered at a predetermined thickness on the first encapsulant. In addition to the form described above, various forms may be used. An interval of the space within the through-hole 110X filled with the encapsulant 160 is not particularly limited, and may be optimized by those skilled in the art. For example, an interval of the space within the through-hole 110X filled with the encapsulant 160 may be about 10 μm to 150 μm, but is not limited thereto.

A detailed material of the encapsulant 160 is not particularly limited. For example, an insulating material may be used as a material of the encapsulant 160. Here, the insulating material may be a thermosetting resin such as an epoxy resin, a thermoplastic resin such as a polyimide resin, a resin having a reinforcement material such as a glass fiber and/or an inorganic filler impregnated in the thermosetting resin and the thermoplastic resin, such as a pre-preg, ABF, or the like. In addition, known molding material such as an EMC, or the like, may also be used. It may be more effective in controlling warpage to use an insulating resin such as a glass fiber and/or an inorganic filler as a material of the encapsulant 160.

The encapsulant 160 may have an elastic modulus lower than that of a material of the first insulating layer 111A of the frame 110. For example, an elastic modulus of the encapsulant 160 may be 15 GPa or less, such as about 50 MPa to 15 GPa. As the elastic modulus of the encapsulant 160 becomes relatively small, warpage of the electronic component package 100A may be reduced through a buckling effect and a stress dispersing effect for the electronic component 120. In detail, since the encapsulant 160 is provided in the space of the through-hole 110X, the encapsulant 160 may have the buckling effect for the electronic component 120, and since the encapsulant 160 covers the electronic component 120, the encapsulant 160 may disperse and alleviate stress generated in the electronic component 120. However, in a case in which the elastic modulus of the encapsulant 160 is excessively small, the encapsulant 160 may be excessively deformed, and thus the encapsulant 160 may not perform a basic role of the encapsulant. The elastic module is defined as a ratio between stress and deformation, and may be measured through a tension test specified in KS M 3001, KS M 527-3, ASTM D882, and the like.

The encapsulant 160 may contain conductive particles in order to block electromagnetic waves, if necessary. For example, the conductive particle may be any material that may block electromagnetic waves, such as copper (Cu), aluminum (Al), silver (Ag), tin (Sn), gold (Au), nickel (Ni), lead (Pb), solder, or the like, but is not particularly limited thereto.

The electronic component package 100A according to an example may further include a passivation layer 170 disposed below the redistribution parts 140 and 150. The purpose of the passivation layer 170 may be to protect the redistribution parts 140 and 150 from external physical or chemical damage, or the like. The passivation layer 170 may have first opening parts 171 exposing at least portions of the redistribution part wiring layer 152 of the redistribution parts 140 and 150. Although the first opening parts 171 may expose portions of an upper surface of the redistribution part wiring layer 152, the first opening parts 171 may also expose side surfaces of the redistribution part wiring layer 152 in some cases.

A material of the passivation layer 170 is not particularly limited. For example, a solder resist may be used as a material of the passivation layer 170. In addition, the same material as that of the second insulating layer 111B of the frame 110 and/or the redistribution part insulating layers 141 and 151 of the redistribution parts 140 and 150, for example, the same PID resin, ABF, or the like, may be used as a material of the passivation layer 170. The passivation layer 170 is generally a single layer, but may also be formed of multiple layers, if necessary. It may be effective in improving reliability of the electronic component package to use ABF as a material of the passivation layer 170.

The electronic component package 100A according to an example may further include the first external connection terminals 175 disposed in the first opening parts 171 of the passivation layer 170 to thereby be externally exposed. The purpose of the first external connection terminals 175 may be to physically and/or electrically externally connect the electronic component package 100A. For example, the electronic component package 100A may be mounted on the main board of the electronic device through the first external connection terminals 175. The first external connection terminals 175 may be disposed in the first opening parts 171, and may be connected to the redistribution part wiring layer 152 exposed through the first opening part 171. Therefore, the first external connection terminals 175 may also be electrically connected to the electronic component 120.

The first external connection terminal 175 may be formed of a conductive material, such as copper (Cu), aluminum (Al), silver (Ag), tin (Sn), gold (Au), nickel (Ni), lead (Pb), solder, or the like, but is not particularly limited thereto. The first external connection terminal 175 may be a land, a ball, a pin, or the like. The first external connection terminal 175 may be formed of multiple layers or a single layer. In a case in which the first external connection terminal 175 is formed of multiple layers, the first external connection terminal 175 may contain a copper pillar and a solder, and in a case in which the first external connection terminal 175 is formed of a single layer, the first external connection terminal 175 may contain a tin-silver solder or copper. However, this is only an example, and the first external connection terminal 175 is not limited thereto.

At least one of the first external connection terminals 175 may be disposed in a fan-out region. The fan-out region is defined as a region except for a region in which the electronic component is disposed. That is, the electronic component package 100A according to an example may be a fan-out package. The fan-out package may have reliability greater than that of a fan-in package, may implement a plurality of I/O terminals, and may easily perform 3D interconnection. In addition, since the fan-out package may be mounted on the electronic device without using a separate substrate as compared to a ball grid array (BGA) package, a land grid array (LGA) package, or the like, the fan-out package may be manufactured at a reduced thickness, and may have excellent price competitiveness.

The number, an interval, a disposition form, and the like, of first external connection terminals 175 are not particularly limited, and may be sufficiently modified depending on design particulars by those skilled in the art. For example, the number of first external connection terminals 175 may be several ten to several thousand depending on the number of electrode pads 120P of the electronic component 120. However, the number of first external connection terminals 175 is not limited thereto, and may also be several tens to several thousand or more or several ten to several thousand or less.

FIGS. 5A through 5L are schematic views illustrating examples of processes of manufacturing the electronic component package 100A.

Figure 5A:
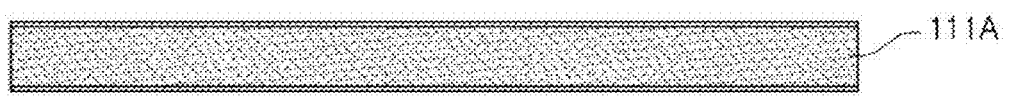
FIGS. 5A through 5L are schematic views illustrating examples of processes of manufacturing the electronic component package of FIG. 3.

Referring to FIG. 5A, the first insulating layer 111A may be prepared. The first insulating layer 111A may be manufactured and utilized at various sizes in order to facilitate mass production. That is, after the first insulating layer 111A having a large size is prepared, a plurality of electronic component packages 100A may be manufactured through a process to be described below. Then, the plurality of electronic component packages 100A may be singulated into individual unit packages through a sawing process. A fiducial mark for excellent pick-and-place (P&P) may be present in the first insulating layer 111A, if necessary. Since a position at which the electronic component 120 is mounted may be more clearly recognized through the fiducial mark, completeness of manufacturing may be improved. Thin metal layers, such as copper clad laminates (CCLs) (not denoted by a reference numeral), or the like, may be formed on upper and lower surfaces of the first insulating layer 111A, and may serve as basic seed layers for forming the wiring layers, and the like, in a subsequent process.

Figure 5B:
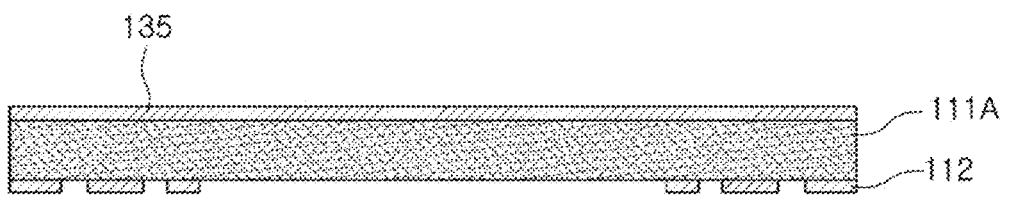

Referring to FIG. 5B, the metal layer 135 and the first wiring layer 112 may be formed on the upper surface and the lower surface of the first insulating layer 111A, respectively. The metal layer 135 and the first wiring layer 112 may be formed by a known method. For example, the metal layer 135 and the first wiring layer 112 may be formed by electrolytic copper plating, electroless copper plating, or the like, using a dry film pattern. In more detail, the metal layer 135 and the first wiring layer 112 may be formed using a method such as chemical vapor deposition (CVD), physical vapor deposition (PVD), sputtering, a subtractive process, an additive process, a semi-additive process (SAP), a modified semi-additive process (MSAP), or the like, but are not limited thereto.

Figure 5C:
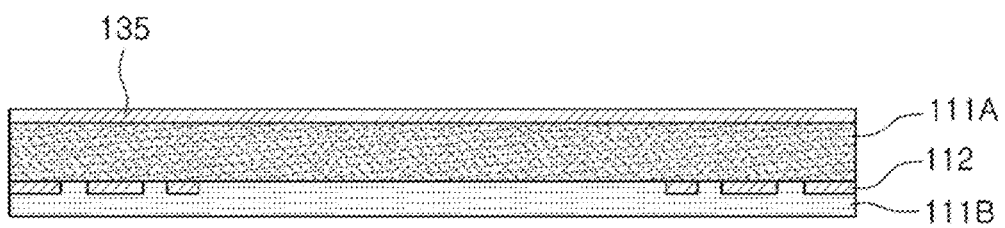

Referring to FIG. 5C, the second insulating layer 111B may be formed on the lower surface of the first insulating layer 111A. The second insulating layer 111B may also be formed by a known method. For example, the second insulating layer 111B may be formed by a method of laminating a precursor of the second insulating layer 111B on the lower surface of the first insulating layer 111A and then hardening the precursor, a method of applying a material for forming the second insulating layer 111B onto the lower surface of the first insulating layer 111A and then hardening the material, or the like, but is not limited thereto. As the method of laminating the precursor, for example, a method of performing a hot press process of pressing the precursor for a predetermined time at a high temperature, decompressing the precursor, and then cooling the precursor to room temperature, cooling the precursor in a cold press process, and then separating a work tool, or the like, may be used. As the method of applying the material, for example, a screen printing method of applying ink with a squeegee, a spray printing method of applying ink in a mist form, or the like, may be used. The hardening process, which is a post-process, may be a process of drying the material so as to not be completely hardened in order to use a photolithography method, or the like.

Figure 5D:
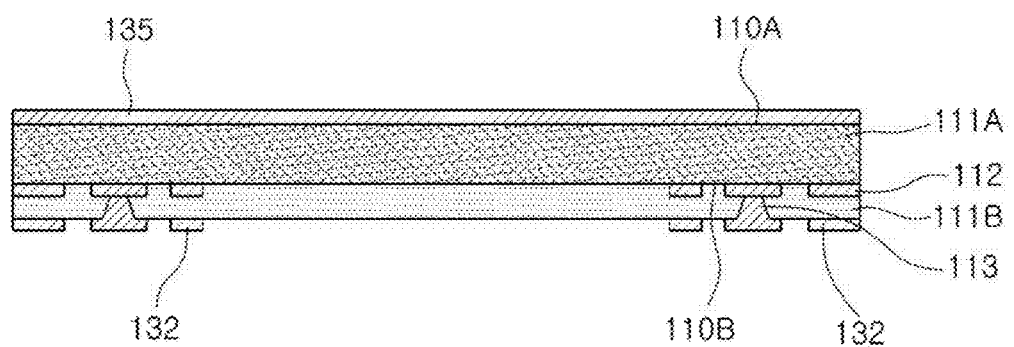

Referring to FIG. 5D, the second wiring layer 132 may be formed beneath the second insulating layer 111B, and the vias 113 may be formed in the second insulating layer 111B. Via holes (not illustrated) may be formed using a mechanical drill and/or a laser drill. Here, the laser drill may be a CO2 laser or a YAG laser, but is not limited thereto. In a case in which the via holes (not illustrated) are formed using the mechanical drill and/or the laser drill, a desmear process may be performed on the via holes to remove resin smear in the via holes (not illustrated). The desmear process may be performed using, for example, a permanganate method. In a case in which the second insulating layer 111B contains the PID resin, or the like, the via holes may also be formed by a photolithography method. After the via holes are formed, the second wiring layer 132 and the vias 113 may also be formed by electrolytic copper plating, electroless copper plating, or the like, using a dry film pattern. In more detail, the second wiring layer 132 and the vias 113 may be formed using a method such as CVD, PVD, sputtering, a subtractive process, an additive process, an SAP, an MSAP, or the like, but are not limited thereto.

Figure 5E:
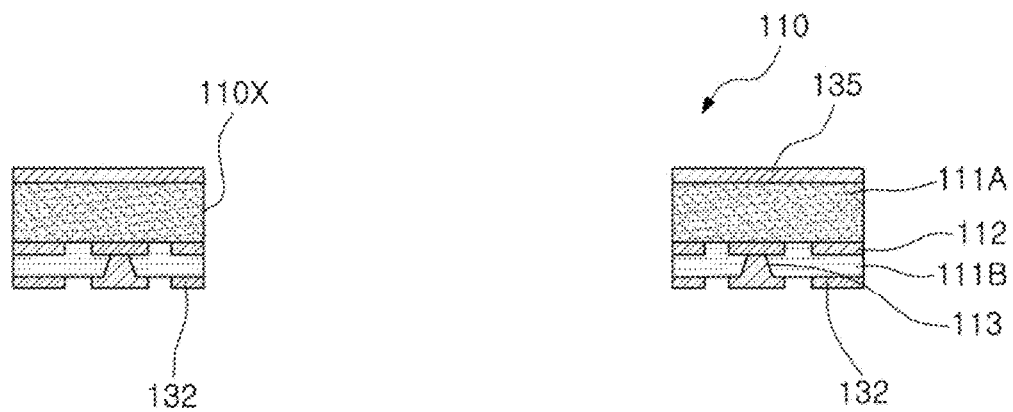

Referring to FIG. 5E, the through-hole 110X penetrating through the upper surface 110A and the lower surface 110B of the frame 110 may be formed. A method of forming the through-hole 110X is also not particularly limited. The through-hole 110X may be formed by, for example, a mechanical drill and/or a laser drill, a sandblast method using particles for polishing, a dry etching method using plasma, or the like. Likewise, in a case in which the through-hole 110X is formed using the mechanical drill and/or the laser drill, a desmear process such as a permanganate method, or the like, may be performed to remove resin smear in the through-hole 110X. A size, a shape, or the like, of the through-hole 110X may be designed depending on a size, a shape, the number, or the like, of electronic components 120 to be mounted. The frame 110 having the through-hole 110X may be formed through a series of processes.

Figure 5F:
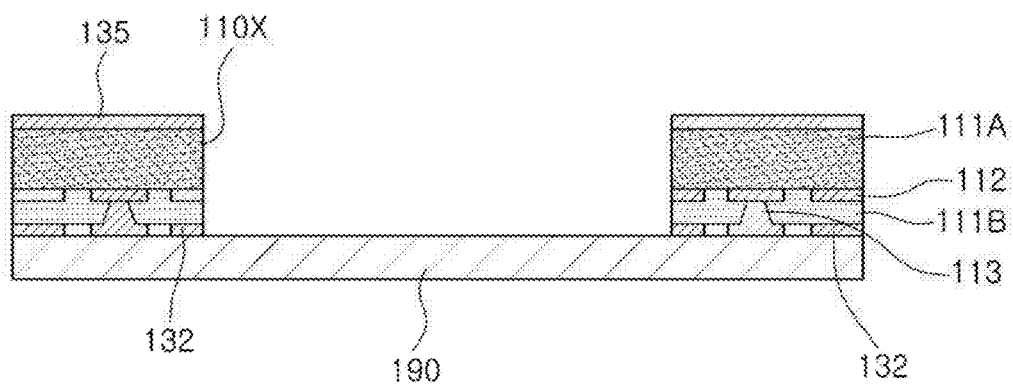

Referring to FIG. 5F, an adhesive film 190 may be attached to the second wiring layer 132. Any material that may fix the second wiring layer 132 may be used as the adhesive film 190. As a non-restrictive example of this material, tape known in the art, or the like, may be used. An example of the known tape may include a thermosetting adhesive tape of which adhesion is weakened by heat treatment, an ultraviolet-curable adhesive tape of which adhesion is weakened by ultraviolet ray irradiation, or the like.

Figure 5G:
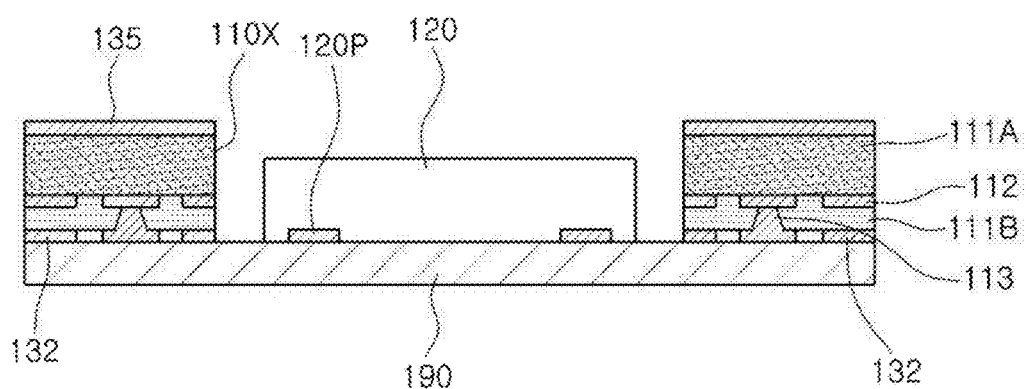

Referring to FIG. 5G, the electronic component 120 may be disposed in the through-hole 110X. In detail, the electronic component 120 may be attached to and disposed on the adhesive film 190 exposed through the through-hole 110X of the frame 110. The electronic component 120 may be disposed in a face-down form so that the electrode pads 120P are attached to the adhesive film 190. In a case in which the electrode pads 120 of the electronic component 120 have an embedded form, the lower surface of the electronic component 120 and a lower surface of the second wiring layer 132 may be substantially coplanar to each other. For example, a distance between the lower surface of the electronic component 120 and the lower surface of the second wiring layer 132 may be smaller than a thickness of the second wiring layer 132. In a case in which the electrode pads 120 of the electronic component 120 have a protruding form, the lower surface of the second wiring layer 132 and a lower surface of the electrode pad 120P may be substantially coplanar to each other. For example, a distance between the lower surface of the second wiring layer 132 and the lower surface of the electrode pad 120P may be smaller than a thickness of the second wiring layer 132.

Figure 5H:
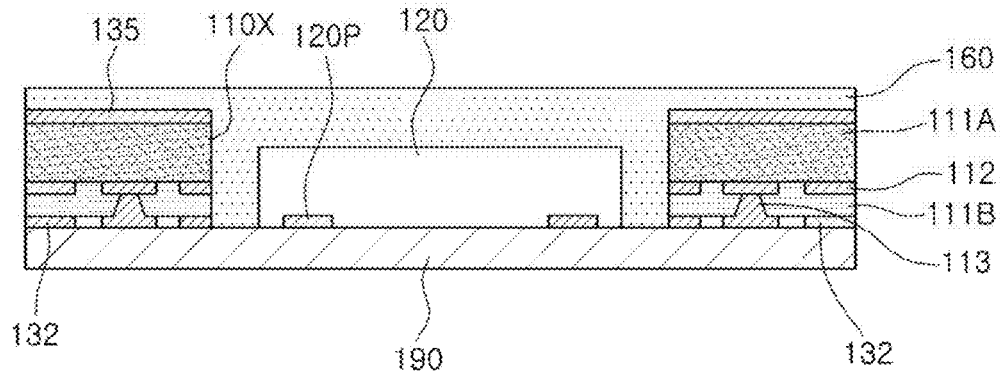

Referring to FIG. 5H, the electronic component 120 may be encapsulated using the encapsulant 160. The encapsulant 160 may cover the frame 110 and the electronic component 120, and may be provided in the space within the through-hole 110X. The encapsulant 160 may be formed by a known method. For example, the encapsulant 160 may be formed by a method of laminating a precursor of the encapsulant 160 and then hardening the precursor. Alternatively, the encapsulant 160 may be formed by a method of applying a pre-encapsulant onto the adhesive film 190 so as to encapsulate the electronic component 120 and then hardening the pre-encapsulant. The electronic component 120 may be fixed by the hardening. As the method of laminating the precursor, for example, a method of performing a hot press process of pressing the precursor for a predetermined time at a high temperature, decompressing the precursor, and then cooling the precursor to room temperature, cooling the precursor in a cold press process, and then separating a work tool, or the like, may be used. As the method of applying the pre-encapsulant, for example, a screen printing method of applying ink with a squeegee, a spray printing method of applying ink in a mist form, or the like, may be used.

Figure 5I:
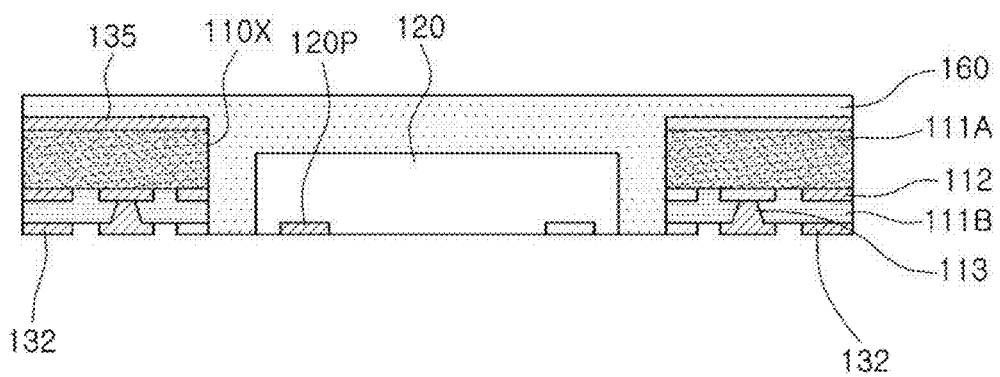

Referring to FIG. 5I, the adhesive film 190 may be peeled off. A method of peeling off the adhesive film 190 is not particularly limited, and may be a known method. For example, in a case in which the thermosetting adhesive tape of which adhesion is weakened by heat treatment, the ultraviolet-curable adhesive tape of which adhesion is weakened by ultraviolet ray irradiation, or the like, is used as the adhesive film 190, the adhesive film 190 may be peeled off after the adhesion of the adhesive film 190 is weakened by heat-treating the adhesive film 190 or may be peeled off after the adhesion of the adhesive film 190 is weakened by irradiating the adhesive film 190 with an ultraviolet ray.

Figure 5J:
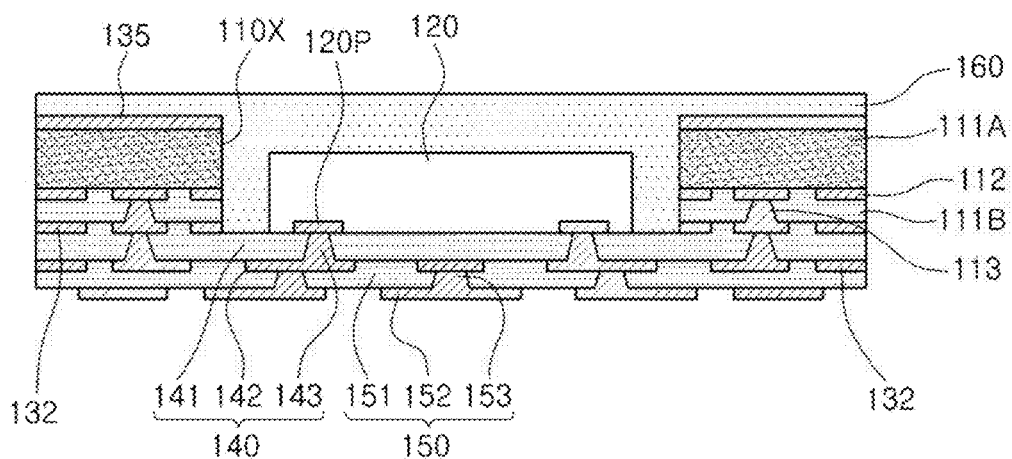

Referring to FIG. 5J, the redistribution part insulating layer 141 may be first formed below the frame 110 and the electronic component 120, and the redistribution part wiring layer 142 and the redistribution part vias 143 may be formed to form the redistribution part 140. Next, the redistribution part insulating layer 151 may again be formed below the redistribution part insulating layer 141, and the redistribution part wiring layer 152 and the redistribution part vias 153 may be formed to form the redistribution part 150. A detailed method of forming the redistribution parts 140 and 150 is the same as the method described above. An interface between the redistribution part insulating layer 141 and the encapsulant 160 may be substantially coplanar to the lower surface of the second wiring layer 132. For example, a distance between the interface and the lower surfaces of the second wiring layer 132 may be smaller than a thickness of the second wiring layer 132. Depending on whether the electrode pad 120P of the electronic component 120 protrudes, the interface may be substantially coplanar to the lower surfaces of the electronic component 120 or the lower surface of the electrode pad 120P. For example, a distance between the interface and the lower surfaces of the electronic component 120 or the lower surface of the electrode pad 120P may be smaller than a thickness of the second wiring layer 132. The interface may be present in a case in which the redistribution part insulating layer 141 and the encapsulant 160 are formed of different materials or may be present in a case in which the redistribution part insulating layer 141 and the encapsulant 160 are formed of the same material, but are formed by different steps or processes.

Figure 5K:
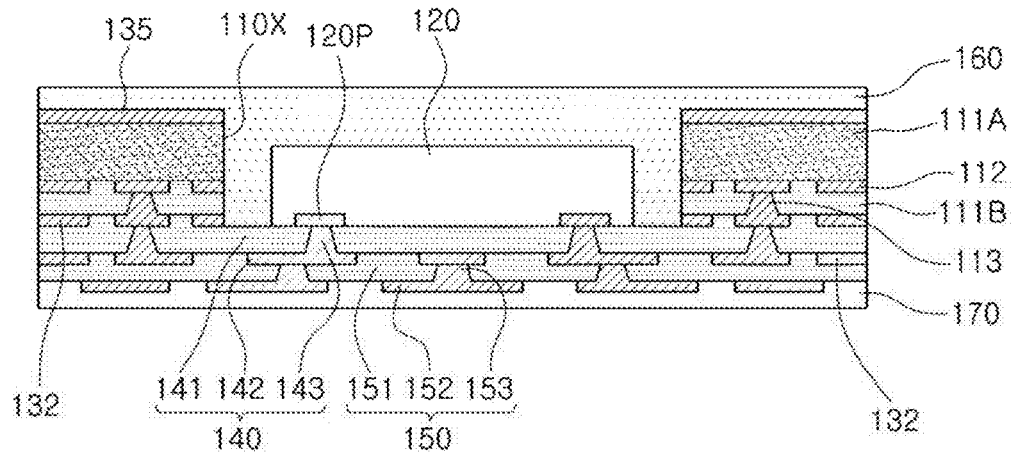

Referring to FIG. 5K, the passivation layer 170 disposed below the redistribution parts 140 and 150 may be formed. The passivation layer 170 may also be formed by a method of laminating a precursor of the passivation layer 170 and then hardening the precursor, a method of applying a material for forming the passivation layer 170 and then hardening the material, or the like. As the method of laminating the precursor, for example, a method of performing a hot press process of pressing the precursor for a predetermined time at a high temperature, decompressing the precursor, and then cooling the precursor to room temperature, cooling the precursor in a cold press process, and then separating a work tool, or the like, may be used. As the method of applying the pre-encapsulant, for example, a screen printing method of applying ink with a squeegee, a spray printing method of applying ink in a mist form, or the like, may be used. The hardening process, which is a post-process, may be a process of drying the material so as to not be completely hardened in order to use a photolithography method, or the like.

Figure 5L:
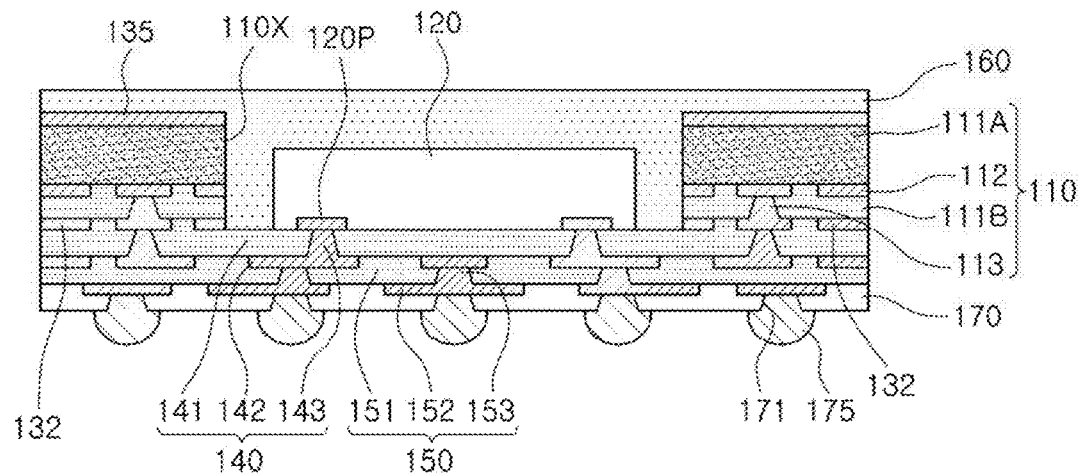

Referring to FIG. 5L, the first opening parts 171 may be formed in the passivation layer 170 so that at least portions of the redistribution part wiring layer 152 are exposed. The first opening parts 171 may be formed using a mechanical drill and/or a laser drill. Alternatively, the first opening parts 171 may be formed by a photolithography method. In a case in which the first opening parts 171 are formed using the mechanical drill and/or the laser drill, a desmear process may be performed on the first opening parts 171 using a permanganate method, or the like, to remove resin smear. Then, the first external connection terminals 175 disposed in the first opening parts 171 may be formed. A method of forming the first external connection terminals 175 is not particularly limited. That is, the first external connection terminals 175 may be formed by a method well-known in the related art depending on a structure or a form of the first external connection terminals 175. The first external connection terminals 175 may be fixed by reflow, and portions of the first external connection terminals 175 may be embedded in the passivation layer 170 in order to enhance fixing force, and the remaining portions of the first external connection terminals 175 may be externally exposed, whereby reliability may be improved. In some cases, only the first opening parts 171 may be formed, and the first external connection terminals 175 may be formed, if necessary, by a separate process by a client purchasing the electronic component package 100A.

Figure 6:
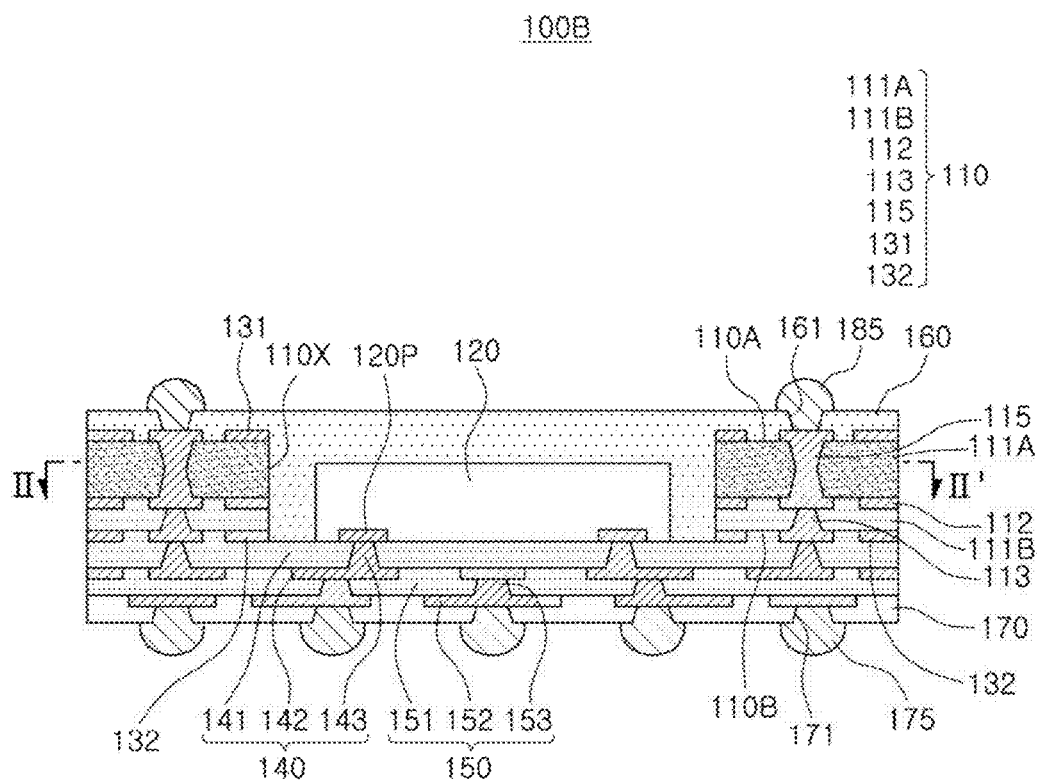
FIG. 6 is a cross-sectional view schematically illustrating another example of an electronic component package.

FIG. 6 is a cross-sectional view schematically illustrating another example of an electronic component package.

Figure 7:
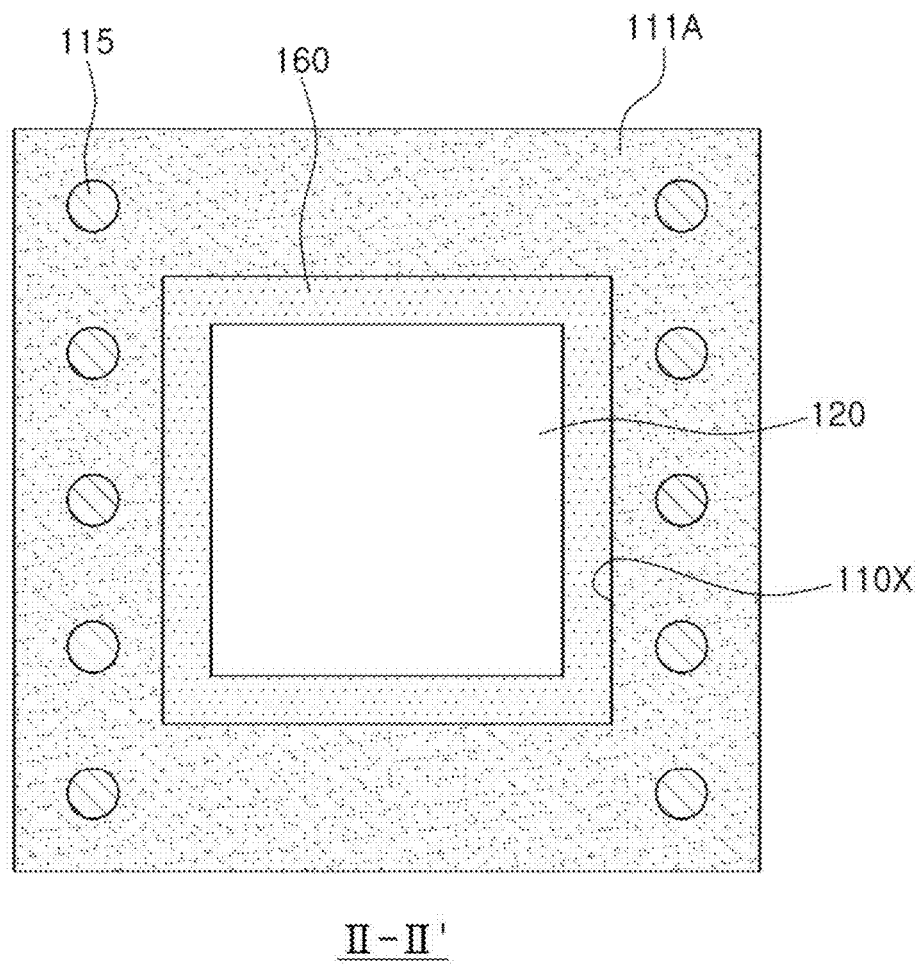
FIG. 7 is a schematic plan view of the electronic component package taken along line II-II' of FIG. 6.

FIG. 7 is a schematic plan view of the electronic component package taken along line II-II' of FIG. 6.

Referring to FIGS. 6 and 7, an electronic component package 100B according to another example may include a frame 110 having a through-hole 110X, an electronic component 120 disposed in the through-hole 110X of the frame 110, redistribution parts 140 and 150 disposed below the frame 110 and the electronic component 120, and an encapsulant 160 encapsulating the electronic component 120. The frame 110 may include a first insulating layer 111A, a second insulating layer 111B, a first wiring layer 112 disposed between the first and second insulating layers 111A and 111B, internal vias 115 penetrating through the first insulating layer 111A, vias 113 penetrating through the second insulating layer 111B, a third wiring layer 131 disposed on an upper surface 110A of the first insulating layer 111A, and a second wiring layer 132 disposed on a lower surface 110B of the second insulating layer 111B.

The through-hole 110X may sequentially penetrate through the third wiring layer 131, the first insulating layer 111A, the first wiring layer 112, the second insulating layer 111B, and the second wiring layer 132. At least one of the first wiring layer 112 and the second insulating layer 111B may be at a level between upper and lower surfaces of the electronic component 120. The upper surface of the electronic component 120 as shown in FIG. 6 is at a level below the upper surface 110A of the frame 110 with respect to the redistribution parts 140 and 150; the present disclosure, however, is not limited thereto. The upper surface of the electronic component 120 may be at the same level as or above the upper surface 110A of the frame 110 but below an upper surface of the third wiring layer 131, or at the same level as or above the upper surface of the third wiring layer 131, with respect to the redistribution parts 140 and 150, as long as the third wiring layer 131 and the electronic component 120 are both covered by the encapsulant 160.

Hereinafter, respective components included in the electronic component package 100B according to another example will be described in more detail, a description of contents overlapping the contents described above will be omitted, and contents different from the contents described above will be mainly described.

The second wiring layer 132 may be disposed on the lower surface 110B of the second insulating layer 111B. That is, the second wiring layer 132 may be disposed outside of the frame 110. The third wiring layer 131 may be disposed on the upper surface 110A of the first insulating layer 111A. That is, the third wiring layer 131 may also be disposed outside of the frame 110. Here, the meaning that the second wiring layer 132 or the third wiring layer 131 is disposed outside of the frame 110 is that the second wiring layer 132 or the third wiring layer 131 is not disposed between the upper surface 110A and the lower surface 110B of the frame 110. The third and second wiring layers 131 and 132 may also serve as a redistribution pattern and/or a pad pattern, and a conductive material such as copper (Cu), aluminum (Al), silver (Ag), tin (Sn), gold (Au), nickel (Ni), lead (Pb), or alloys thereof, may be used as materials of the third and second wiring layers 131 and 132. The third and second wiring layers 131 and 132 may perform various functions depending on designs of the corresponding layers. For example, the third and second wiring layers 131 and 132 may serve as a ground (GND) pattern, a power (PWR) pattern, a signal (S) pattern, a bond finger (BF) pattern, and the like, as redistribution patterns. Here, the signal (S) pattern may include various signals except for the ground (GND) pattern, the power (PWR) pattern, the bond finger (BF) pattern, and the like, such as data signals, and the like. In addition, the third and second wiring layers 131 and 132 may serve as a via pad, an internal via pad, an external connection terminal pad, or the like, as a pad pattern. Since the pad patterns serving as pads of the internal vias are disposed in the frame 110, the pads of the internal vias are not required to be formed on the redistribution parts 140 and 150, and thus a design area may be increased, whereby a degree of freedom of a design may be improved. Thicknesses of the third and second wiring layers 131 and 132 are also not particularly limited, and may be, for example, about 10 μm to 50 μm. A surface treatment layer may be further formed on an exposed pattern of the third wiring layer 131, if necessary. The surface treatment layer may be formed by, for example, electrolytic gold plating, electroless gold plating, OSP or electroless tin plating, electroless silver plating, electroless nickel plating/substituted gold plating, DIG plating, HASL, or the like.

The internal vias 115 penetrating through the first insulating layer 111A may serve to electrically connect the wiring layers 131 and 112 disposed in different layers to each other, and a conductive material such as copper (Cu), aluminum (Al), silver (Ag), tin (Sn), gold (Au), nickel (Ni), lead (Pb), or alloys thereof, may be used as a material of the internal vias 115. The internal vias 115 may be connected directly to the pad pattern serving as the pad of the internal via in the wiring layers 131 and 112. The number, an interval, a disposition form, and the like, of internal vias 115 are not particularly limited, and may be sufficiently modified depending on design particulars by those skilled in the art. For example, the internal vias 115 may be dispersed spaced-apart from each other only in specific regions of the first insulating layer 111A as illustrated in FIGS. 6 and 7 or may be dispersed spaced-apart from each other over an entire surface of the first insulating layer 111A, depending on a form of another electronic component package mounted on the electronic component package 100B. In a case in which a metal, such as an Fe—Ni based alloy, or the like, is used as a material of the first insulating layer 111A, an insulating material may be disposed between the metal and the internal vias 115 and/or the wiring layers 131 and 112 in order to electrically insulate between the metal and the internal vias 115 and/or the wiring layers 131 and 112. The internal via 115 may have a diameter larger than that of the via 113. The internal via 115 may have a diameter larger than that of the via 113, but is not limited thereto. The internal via 115 may have a shape, a diameter, and the like, that are substantially the same as those of the via 113 depending on the first insulating layer 111A.

In the electronic component package 100B according to another example, the encapsulant 160 may have second opening parts 161 exposing at least portions of the third wiring layer 131 disposed on the upper surface 110A of the frame 110. In addition, the electronic component package 100B according to another example may further include second external connection terminals 185 disposed in the second opening parts 161 of the encapsulant 160 to thereby be externally exposed. The purpose of the second external connection terminals 185 may be to physically and/or electrically connect another electronic component, another electronic component package, or the like, on the electronic component package 100B to the electronic component package 100B. For example, another electronic component package may be mounted on the electronic component package 100B through the second external connection terminals 185, and thus a package-on-package structure may be formed. The second external connection terminals 185 may be disposed in the second opening parts 161 of the encapsulant 160, and may be connected to the third wiring layer 131 exposed through the second opening parts 161. Therefore, the second external connection terminals 185 may also be electrically connected to the electronic component 120.

The second external connection terminal 185 may be formed of a conductive material such as copper (Cu), aluminum (Al), silver (Ag), tin (Sn), gold (Au), nickel (Ni), lead (Pb), solder, or the like, but is not particularly limited thereto. The second external connection terminal 185 may be a land, a ball, a pin, or the like. The second external connection terminal 185 may be formed of multiple layers or a single layer. In a case in which the second external connection terminal 185 is formed of multiple layers, the second external connection terminal 185 may contain a copper pillar and a solder, and in a case in which the second external connection terminal 185 is formed of a single layer, the second external connection terminal 185 may contain a tin-silver solder or copper. However, this is only an example, and the second external connection terminal 185 is not limited thereto.

FIGS. 8A through 8M are schematic views illustrating examples of processes of manufacturing the electronic component package 100B.

A description of contents overlapping the contents described above in a description for examples of processes of manufacturing the electronic component package 100B will be omitted, and contents different from the contents described above will be mainly described.

Figure 8A:
FIGS. 8A through 8M are schematic views illustrating examples of processes of manufacturing the electronic component package of FIG. 6.
Figure 8B:
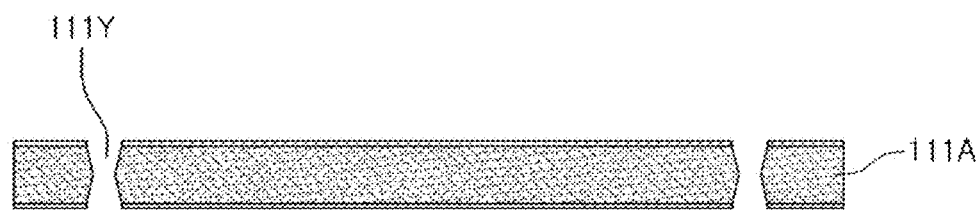
Figure 8C:
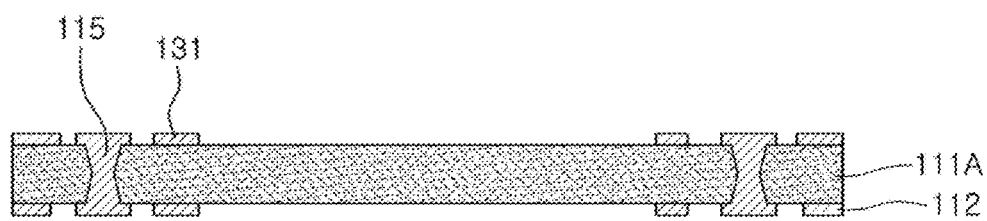
Figure 8D:
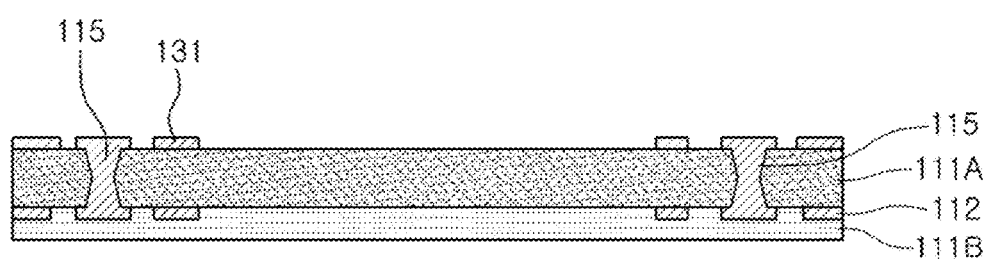
Figure 8E:
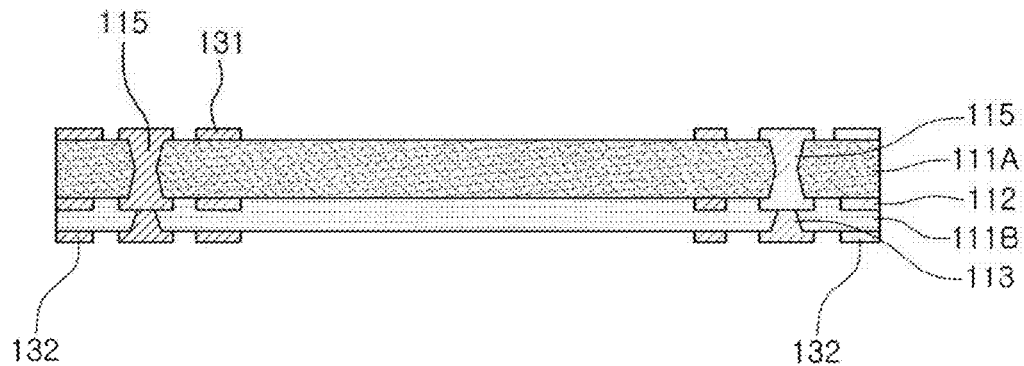
Figure 8F:
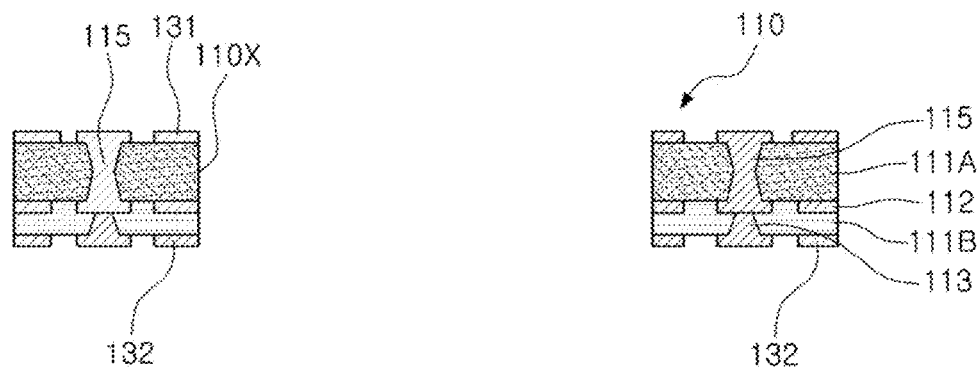

Referring to FIG. 8A, the first insulating layer 111A may be prepared. Referring to FIG. 8B, through-holes 111Y penetrating through the upper and lower surfaces of the first insulating layer 111A may be formed. The through-holes 111Y may be formed using a mechanical drill and/or a laser drill. Here, the laser drill may be a $CO_2$ laser or a YAG laser, but is not limited thereto. In a case in which the through-holes 111Y are formed using the mechanical drill and/or the laser drill, a desmear process may be performed on the through-holes 111Y to remove resin smear in the through-holes 111Y. The desmear process may be performed using, for example, a permanganate method. In some cases, the through-holes 111Y may also be formed by a photolithography method. Referring to FIG. 8C, the third and first wiring layers 131 and 112 may be formed on the upper surface and the lower surface of the first insulating layer 111A, respectively. In addition, the through-holes 111Y may be filled with a conductive material to form the internal vias 115. The internal vias 115 may also be formed by a known method. For example, the internal vias 115 may be formed by electrolytic copper plating, electroless copper plating, or the like, using a dry film pattern. In more detail, the internal vias 115 may be formed using a method such as CVD, PVD, sputtering, a subtractive process, an additive process, an SAP, an MSAP, or the like, but are not limited thereto. Referring to FIG. 8D, the second insulating layer 111B may be formed on the lower surface of the first insulating layer 111A. Referring to FIG. 8E, the second wiring layer 132 may be formed beneath the second insulating layer 111B, and the vias 113 may be formed in the second insulating layer 111B. Referring to FIG. 8F, the through-hole 110X penetrating through the first insulating layer 111A and the second insulating layer 111B may be formed. As a result, the frame 110 having the through-hole 110X may be formed.

Figure 8G:
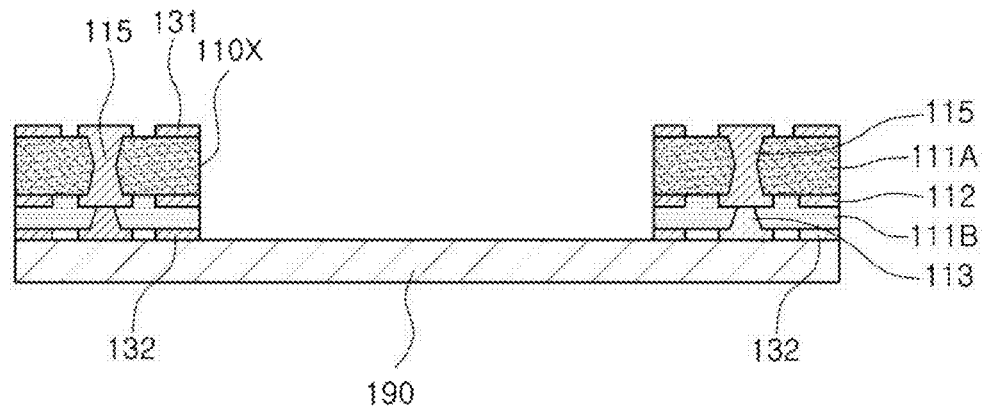
Figure 8H:
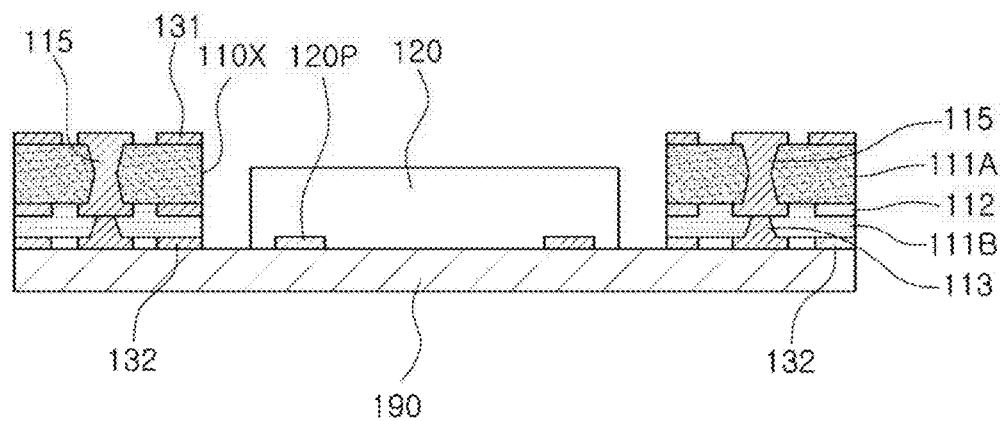
Figure 8I:
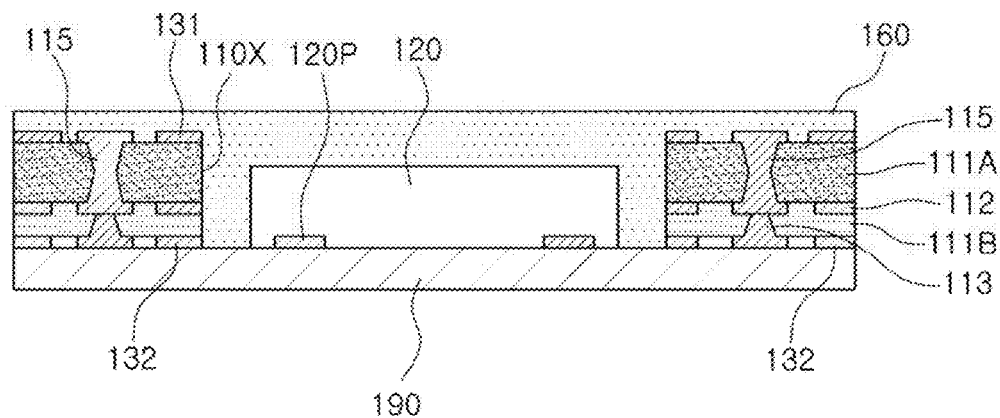
Figure 8J:
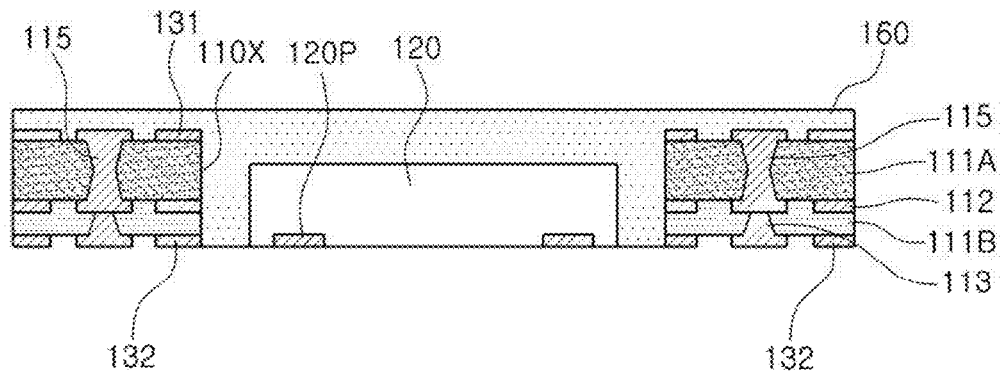
Figure 8K:
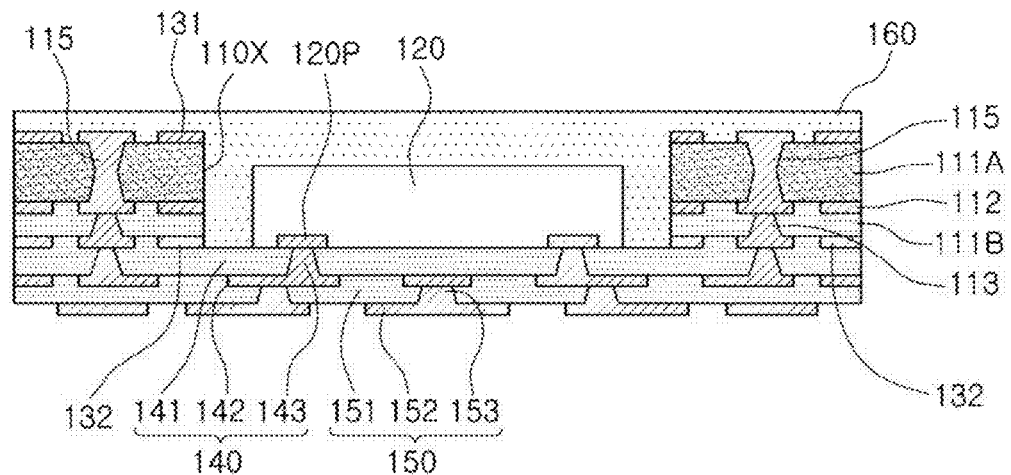
Figure 8L:
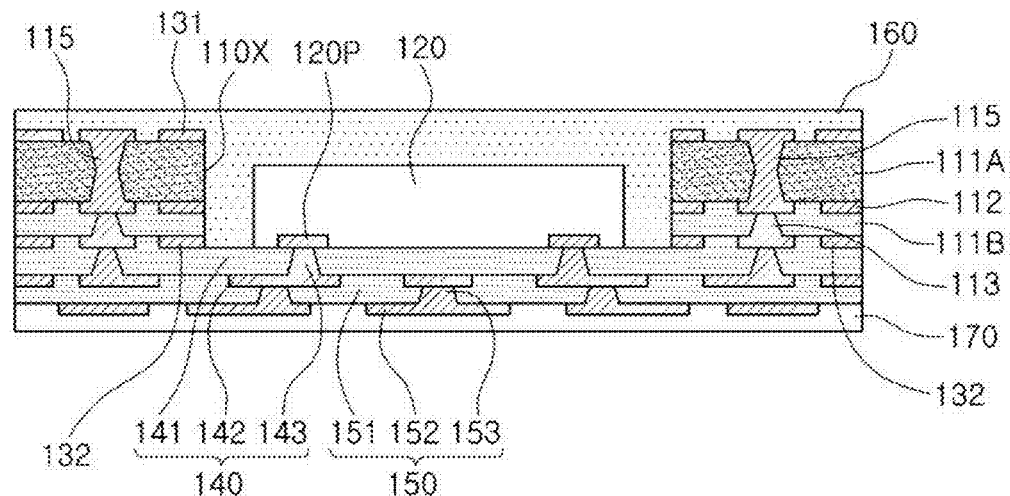
Figure 8M:
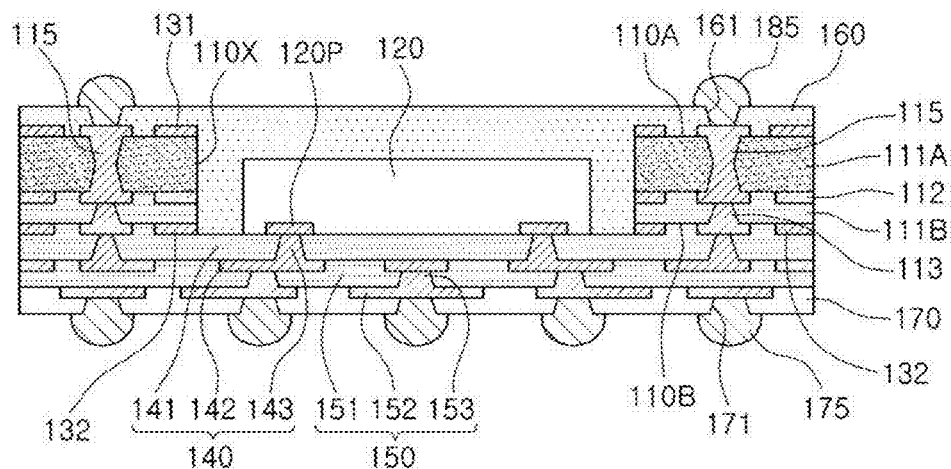

Referring to FIG. 8G, the adhesive film 190 may be attached to the second wiring layer 132. Referring to FIG. 8H, the electronic component 120 may be disposed in the through-hole 110X. Referring to FIG. 8I, the electronic component 120 may be encapsulated using the encapsulant 160. Referring to FIG. 8J, the adhesive film 190 may be peeled off. Referring to FIG. 8K, the redistribution part 140 including the redistribution part insulating layer 141, the redistribution part wiring layer 142, and the redistribution part vias 143 may be formed. Then, the redistribution part 150 including the redistribution part insulating layer 151, the redistribution part wiring layer 152, and the redistribution part vias 153 may be formed. Referring to FIG. 8L, the passivation layer 170 connected to the redistribution parts 140 and 150 may be formed. Referring to FIG. 8M, the first opening parts 171 of the passivation layer 170 and the first external connection terminals 175 disposed in the first opening parts 171 may be formed. In addition, the second opening parts 161 may be formed in an outer surface of the encapsulant 160 so that at least portions of the third wiring layer 131 are exposed, and the second external connection terminals 185 disposed in the second opening parts 161 may be formed. The second opening parts 161 may be formed using a mechanical drill and/or a laser drill. Alternatively, the second opening parts 161 may be formed by a photolithography method. In a case in which the second opening parts 161 are formed using the mechanical drill and/or the laser drill, a desmear process may be performed on the second opening parts 161 using a permanganate method, or the like, to remove resin smear. The second external connection terminals 185 may be formed by a method well-known in the related art depending on a structure or a form of the second external connection terminals 185. The second external connection terminals 185 may be fixed by reflow, and portions of the second external connection terminals 185 may be embedded in the encapsulant 160 in order to enhance fixing force, and the remaining portions of the second external connection terminals 185 may be externally exposed, whereby reliability may be improved. In some cases, only the second external connection terminals 185 disposed in the second opening parts 161 of the encapsulant 160 may be formed, and only the first opening parts 171 may be formed in the passivation layer 170 and the first external connection terminals 175 disposed in the first opening parts 171 may be formed, if necessary, by a separate process by a client purchasing the electronic component package 100B.

Figure 9:
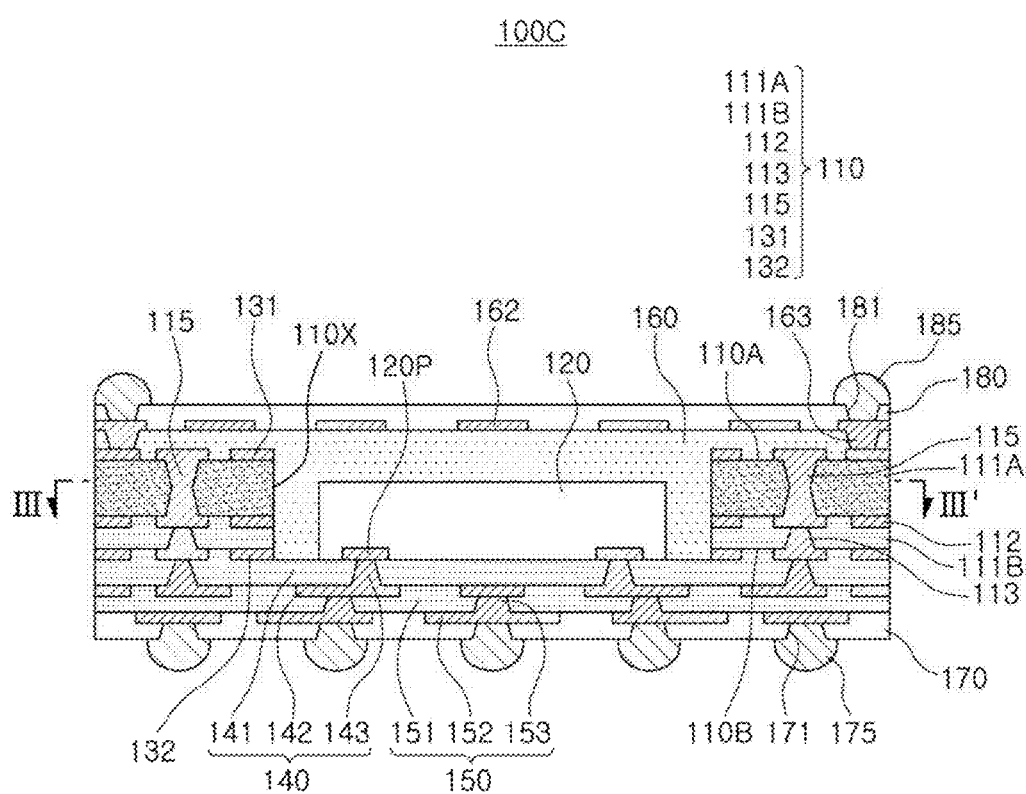
FIG. 9 is a cross-sectional view schematically illustrating another example of an electronic component package.

FIG. 9 is a cross-sectional view schematically illustrating another example of an electronic component package.

Figure 10:
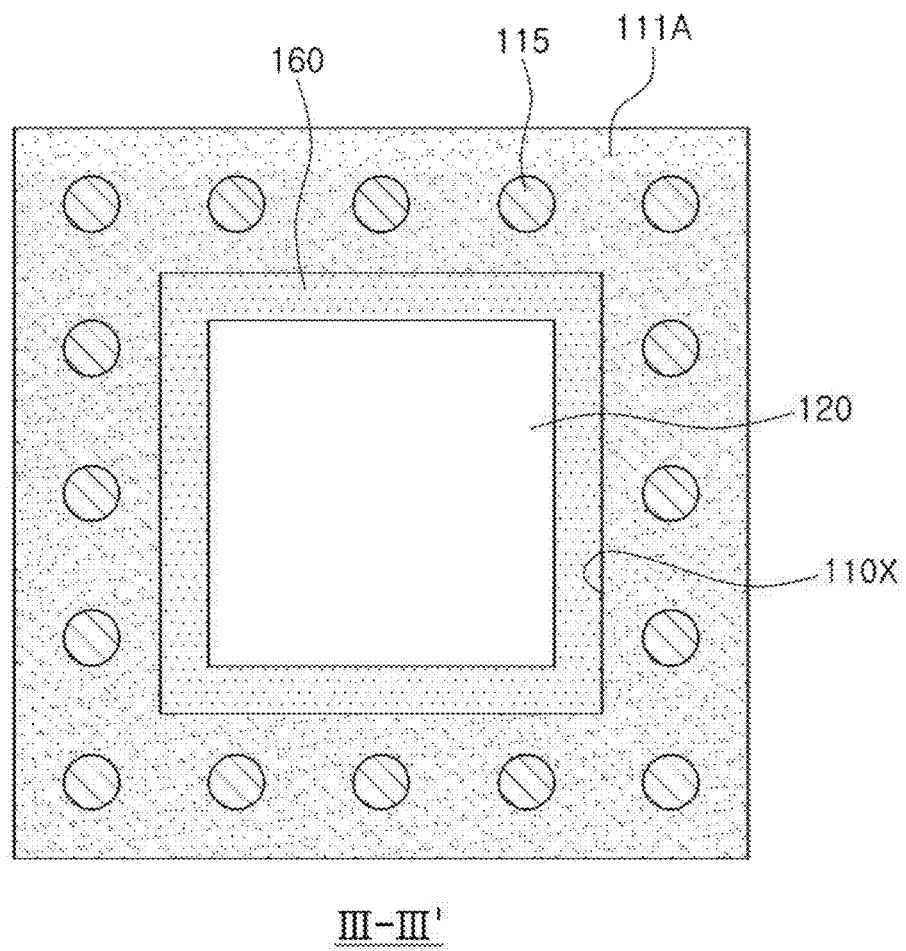
FIG. 10 is a schematic plan view of the electronic component package taken along line III-III' of FIG. 9.

FIG. 10 is a schematic plan view of the electronic component package taken along line III-III' of FIG. 9.

Referring to FIGS. 9 and 10, an electronic component package 100C according to another example may include a frame 110 having a through-hole 110X, an electronic component 120 disposed in the through-hole 110X of the frame 110, redistribution parts 140 and 150 disposed below the frame 110 and the electronic component 120, an encapsulant 160 encapsulating the electronic component 120, an outer wiring layer 162 disposed on the encapsulant 160, and outer vias 163 penetrating through the encapsulant 160. The frame 110 may include a first insulating layer 111A, a second insulating layer 111B, a first wiring layer 112 disposed between the first and second insulating layers 111A and 111B, internal vias 115 penetrating through the first insulating layer 111A, vias 113 penetrating through the second insulating layer 111B, a third wiring layer 131 disposed on an upper surface 110A of the first insulating layer 111A, and a second wiring layer 132 disposed on a lower surface 110B of the second insulating layer 111B.

The through-hole 110X may sequentially penetrate through the third wiring layer 131, the first insulating layer 111A, the first wiring layer 112, the second insulating layer 111B, and the second wiring layer 132. At least one of the first wiring layer 112 and the second insulating layer 111B may be at a level between upper and lower surfaces of the electronic component 120. The upper surface of the electronic component 120 as shown in FIG. 9 is at a level below the upper surface 110A of the frame 110 with respect to the redistribution parts 140 and 150; the present disclosure, however, is not limited thereto. The upper surface of the electronic component 120 may be at the same level as or above the upper surface 110A of the frame 110 but below an upper surface of the third wiring layer 131, or at the same level as or above the upper surface of the third wiring layer 131, with respect to the redistribution parts 140 and 150, as long as the third wiring layer 131 and the electronic component 120 are both covered by the encapsulant 160.

Hereinafter, respective components included in the electronic component package 100C according to another example will be described in more detail, a description of contents overlapping the contents described above will be omitted, and contents different from the contents described above will be mainly described.

The number, an interval, a disposition form, and the like, of internal vias 115 penetrating through the first insulating layer 111A are not particularly limited, and may be sufficiently modified depending on design particulars by those skilled in the art. For example, the internal vias 115 may be dispersed spaced-apart from each other over an entire surface of the first insulating layer 111A as illustrated in FIGS. 9 and 10 or may be dispersed spaced-apart in only specific regions of the first insulating layer 111A, depending on a form of another electronic component package mounted on the electronic component package 100C.

The outer wiring layer 162 disposed on the encapsulant 160 may also serve as a redistribution pattern and/or a pad pattern, and a conductive material such as copper (Cu), aluminum (Al), silver (Ag), tin (Sn), gold (Au), nickel (Ni), lead (Pb), or alloys thereof, may be used as a material of the outer wiring layer 162. A detailed example has been described above. The outer wiring layer 162 may perform various functions depending on a design of the corresponding layer. For example, the outer wiring layer 162 may serve as a ground (GND) pattern, a power (PWR) pattern, a signal (S) pattern, and the like, as redistribution patterns. Here, the signal (S) pattern may include various signals except for the ground (GND) pattern, the power (PWR) pattern, and the like, such as data signals, and the like. In addition, the outer wiring layer 162 may serve as a via pad, an external connection terminal pad, or the like, as a pad pattern. Since patterns of the outer wiring layer 162 may be dispersed spaced-apart from each other over an entire surface of the encapsulant 160 and the second external connection terminals 185 may also be dispersed spaced-apart from each other over an entire surface of a cover layer 180 to be described below, various designs may be possible. A thickness of the outer wiring layer 162 is also not particularly limited, but may be, for example, about 10 µm to 50 µm. A surface treatment layer may be further formed on exposed portions of the outer wiring layer 162, if necessary. The surface treatment layer may be formed by, for example, electrolytic gold plating, electroless gold plating, OSP or electroless tin plating, electroless silver plating, electroless nickel plating/substituted gold plating, DIG plating, HASL, or the like.

The outer vias 163 partially penetrating through the encapsulant 160 may electrically connect the wiring layers 131 and 162 formed on different layers to each other, thereby forming an electrical path within the electronic component package 100C. A conductive material such as copper (Cu), aluminum (Al), silver (Ag), tin (Sn), gold (Au), nickel (Ni), lead (Pb), or alloys thereof, may be used as a material of the outer via 163. The outer via 163 may be completely filled with a conductive material. Alternatively, a conductive material may be formed along a wall of the via. In addition, the outer via 163 may have all of the shapes known in the related art, such as a tapered shape in which a diameter of the via becomes smaller toward a lower surface, a reverse tapered shape in which a diameter of the via becomes larger toward a lower surface, a cylindrical shape, and the like.

The electronic component package 100C according to another example may further include the cover layer 180 disposed above the encapsulant 160. The purpose of the cover layer 180 may be to protect the encapsulant 160, the outer wiring layer 162, or the like, from external physical or chemical damage, or the like. The cover layer 180 may have third opening parts 181 exposing at least portions of the outer wiring layer 162 disposed on the encapsulant 160. Although the third opening parts 181 may expose portions of an upper surface of the outer wiring layer 162, the third opening parts 181 may also expose side surfaces of the outer wiring layer 162 in some cases. A material of the cover layer 180 is not particularly limited. For example, a solder resist may be used as a material of the cover layer 180. In addition, various PID resins, ABF, or the like, may be used as a material of the cover layer 180. The cover layer 180 may also be formed of multiple layers, if necessary.

The electronic component package 100C according to another example may further include second external connection terminals 185 disposed in the third opening parts 181 of the cover layer 180. The second external connection terminals 185 may be disposed in the third opening parts 181, and may be connected to the outer wiring layer 162 exposed through the third opening part 181. That is, the second external connection terminals 185 may be disposed in the second opening parts 161 of the encapsulant 160 as in the electronic component package 100B, or may be disposed in the third opening parts 181 of the cover layer 180 as in the electronic component package 100C.

FIGS. 11A through 11M are schematic views illustrating examples of processes of manufacturing the electronic component package 100C.

A description of contents overlapping the contents described above in a description for examples of processes of manufacturing the electronic component package 100C will be omitted, and contents different from the contents described above will be mainly described.

Figure 11A:
FIGS. 11A through 11M are schematic views illustrating examples of processes of manufacturing the electronic component package of FIG. 9.
Figure 11B:
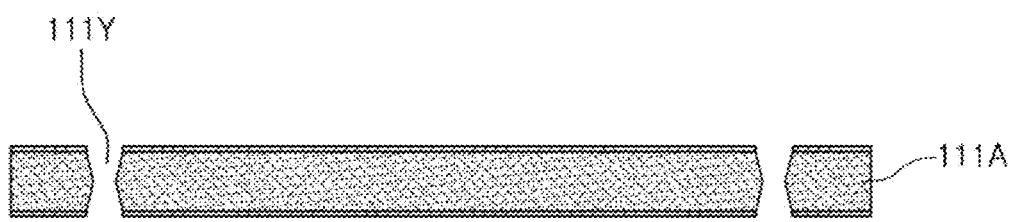
Figure 11C:
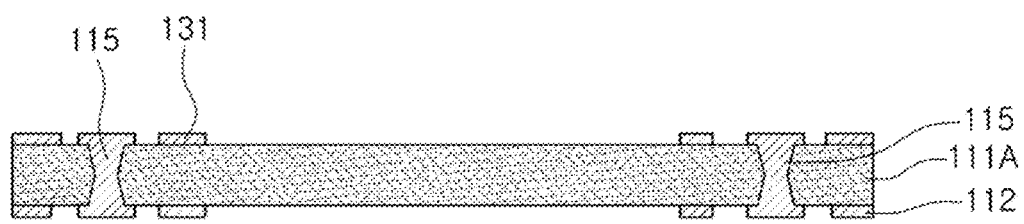
Figure 11D:
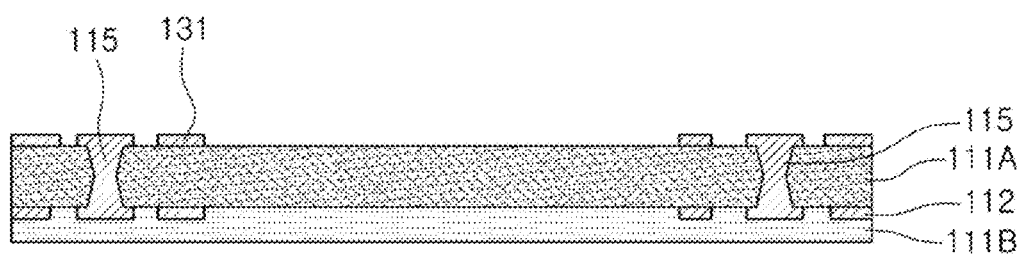
Figure 11E:
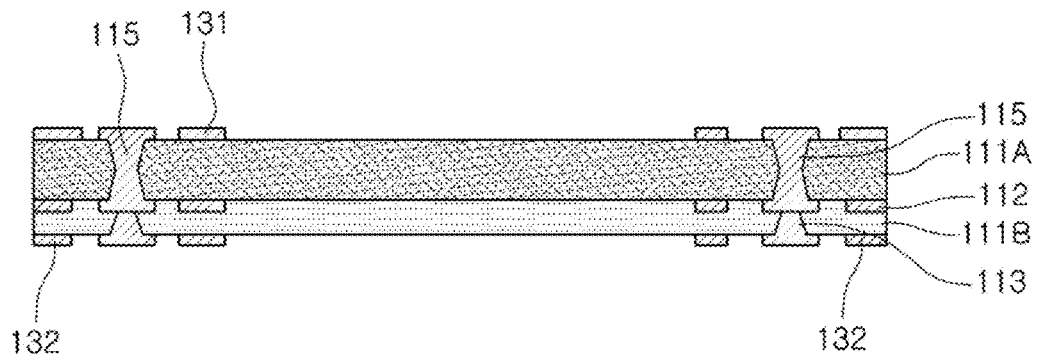
Figure 11F:

Referring to FIG. 11A, the first insulating layer 111A may be prepared. Referring to FIG. 11B, through-holes 111Y penetrating through the upper and lower surfaces of the first insulating layer 111A may be formed. Referring to FIG. 11C, the third and first wiring layers 131 and 112 may be formed on the upper surface and the lower surface of the first insulating layer 111A, respectively. In addition, the through-holes 111Y may be filled with a conductive material to form the internal vias 115. Referring to FIG. 11D, the second insulating layer 111B may be formed on the lower surface of the first insulating layer 111A. Referring to FIG. 11E, the second wiring layer 132 may be formed beneath the second insulating layer 111B, and the vias 113 may be formed in the second insulating layer 111B. Referring to FIG. 11F, the through-hole 110X penetrating through the first insulating layer 111A and the second insulating layer 111B may be formed. As a result, the frame 110 having the through-hole 110X may be formed.

Figure 11G:
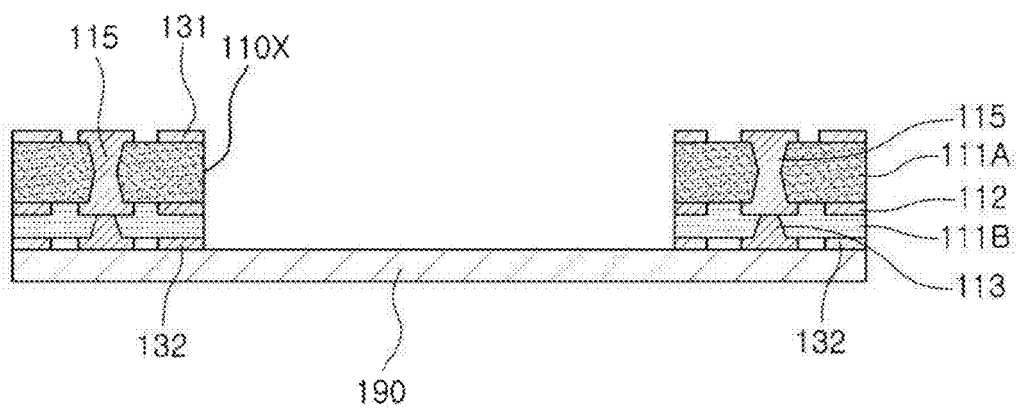
Figure 11H:
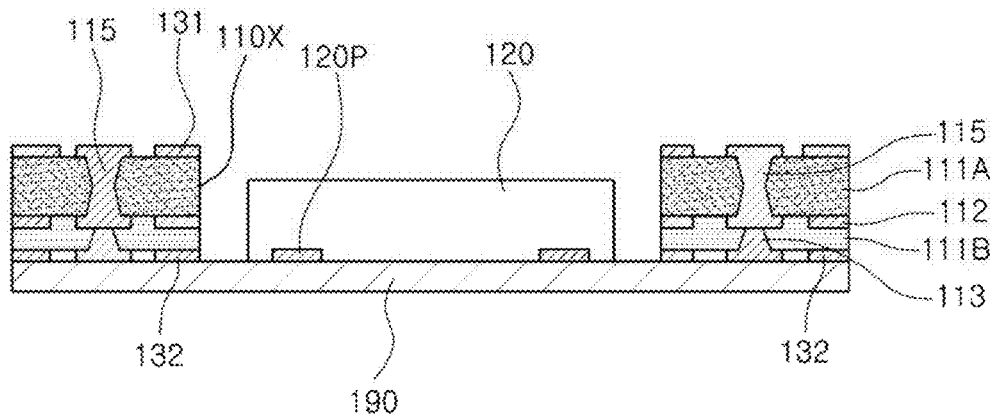
Figure 11I:
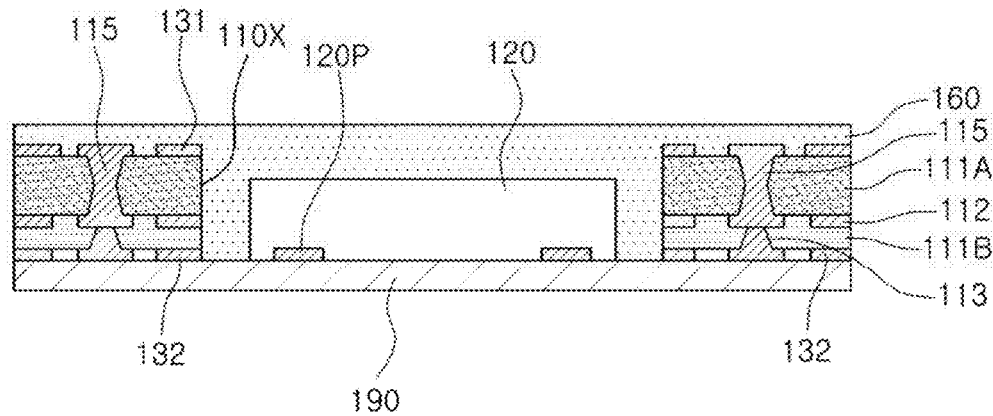
Figure 11J:
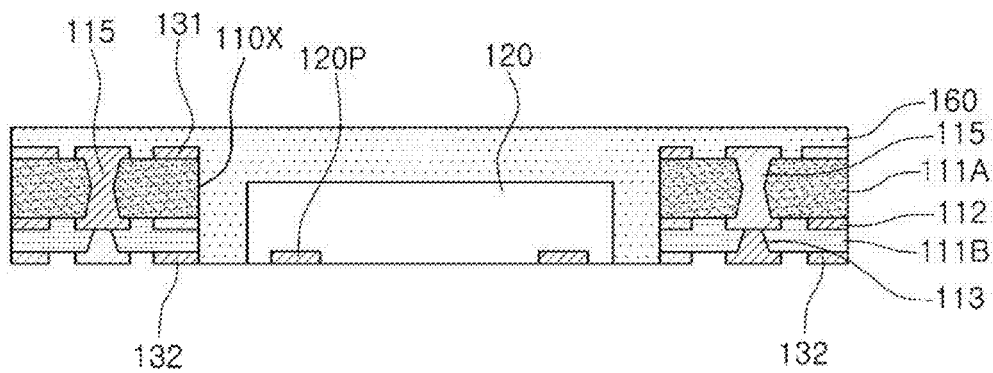
Figure 11K:
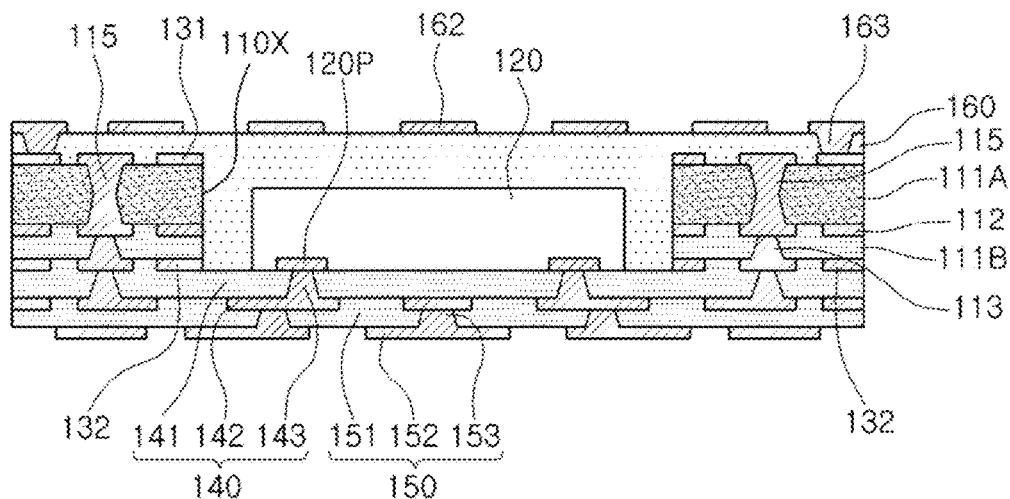
Figure 11L:
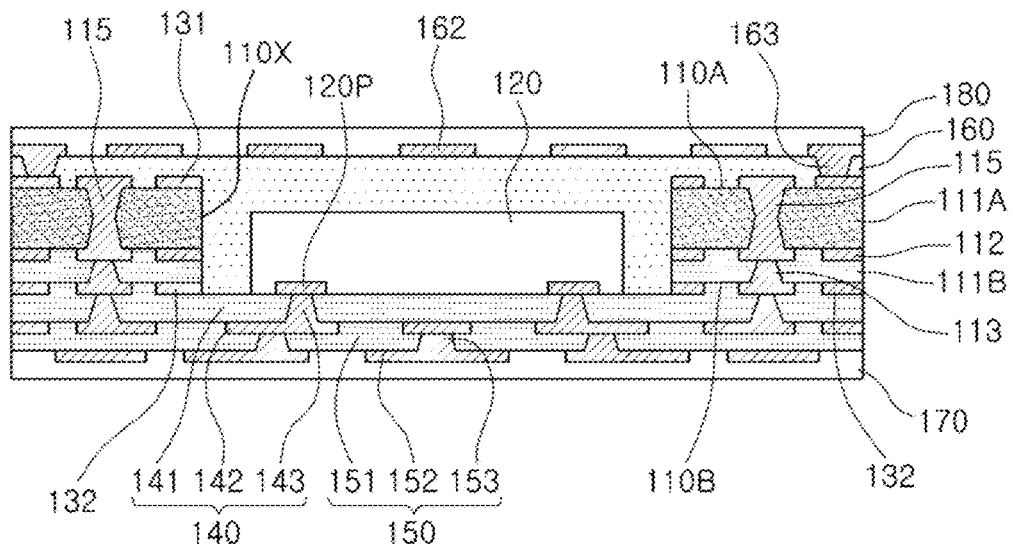
Figure 11M:
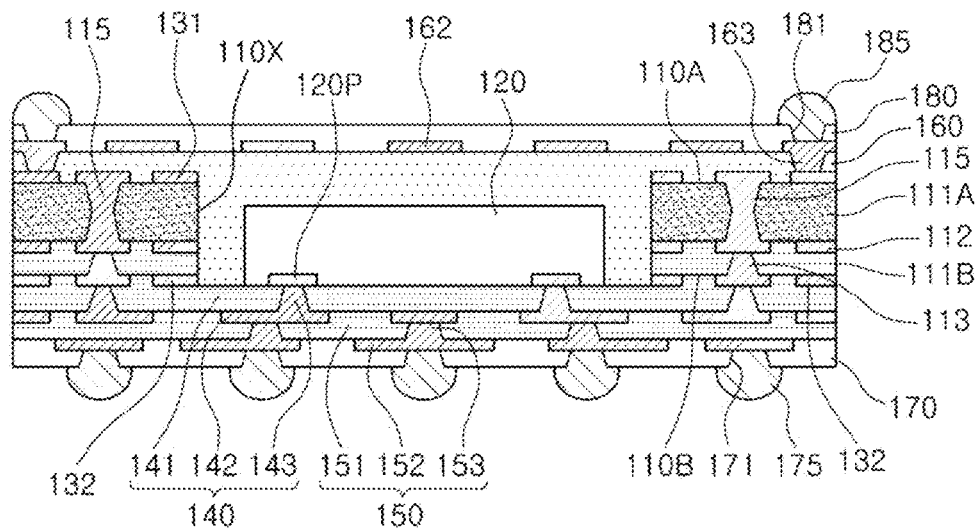

Referring to FIG. 11G, the adhesive film 190 may be attached to the second wiring layer 132. Referring to FIG. 11H, the electronic component 120 may be disposed in the through-hole 110X. Referring to FIG. 11I, the electronic component 120 may be encapsulated using the encapsulant 160. Referring to FIG. 8J, the adhesive film 190 may be peeled off. Referring to FIG. 11K, the redistribution part 140 including the redistribution part insulating layer 141, the redistribution part wiring layer 142, and the redistribution part vias 143 may be formed. Then, the redistribution part 150 including the redistribution part insulating layer 151, the redistribution part wiring layer 152, and the redistribution part vias 153 may be formed. In addition, the outer wiring layer 162 disposed on the encapsulant 160 and the outer vias 163 penetrating through the encapsulant 160 may be formed. Via holes for forming the outer vias 163 may also be formed using a mechanical drill and/or a laser drill, or may also be formed by a photolithography method. In a case in which the via holes are formed using the mechanical drill and/or the laser drill, a desmear process may be performed on the via holes using a permanganate method, or the like, to remove resin smear. The outer wiring layer 162 and the outer vias 163 may also be formed by electrolytic copper plating, electroless copper plating, or the like, using a dry film pattern. In more detail, the outer wiring layer 162 and the outer vias 163 may be formed using a method such as CVD, PVD, sputtering, a subtractive process, an additive process, an SAP, an MSAP, or the like. Referring to FIG. 11L, the passivation layer 170 connected to the redistribution parts 140 and 150 and the cover layer 180 connected to the encapsulant 160 may be formed. The cover layer 180 may also be formed by a method of laminating a precursor of the cover layer 180 and then hardening the precursor, a method of applying a material for forming the cover layer 180 and then hardening the material, or the like. As the method of laminating the precursor, for example, a method of performing a hot press process of pressing the precursor for a predetermined time at a high temperature, decompressing the precursor, and then cooling the precursor to room temperature, cooling the precursor in a cold press process, and then separating a work tool, or the like, may be used. As the method of applying the material, for example, a screen printing method of applying ink with a squeegee, a spray printing method of applying ink in a mist form, or the like, may be used. The hardening process, which is a post-process, may be a process of drying the material so as to not be completely hardened in order to use a photolithography method, or the like. Referring to FIG. 11M, the third opening parts 181 may be formed in an outer surface of the cover layer 180 so that at least portions of the outer wiring layer 162 are exposed, and the second external connection terminals 185 disposed in the third opening parts 181 may be formed. In addition, the first opening parts 171 of the passivation layer 170 and the first external connection terminals 175 disposed in the first opening parts 171 may be formed. The third opening parts 181 may be formed using a mechanical drill and/or a laser drill. Alternatively, the third opening parts 181 may be formed by a photolithography method. In a case in which the third opening parts 181 are formed using the mechanical drill and/or the laser drill, a desmear process may be performed on the third opening parts 181 using a permanganate method, or the like, to remove resin smear. The second external connection terminals 185 may be formed by a method well-known in the related art depending on a structure or a form of the second external connection terminals 185. The second external connection terminals 185 may be fixed by reflow, and portions of the second external connection terminals 185 may be embedded in the cover layer 180 in order to enhance fixing force, and the remaining portions of the second external connection terminals 185 may be externally exposed, whereby reliability may be improved. In some cases, only the second external connection terminals 185 disposed in the third opening parts 181 of the cover layer 180 may be formed, and only the first opening parts 171 may be formed in the passivation layer 170 and the first external connection terminals 175 disposed in the first opening parts 171 may be formed, if necessary, by a separate process by a client purchasing the electronic component package 100C.

Figure 12:
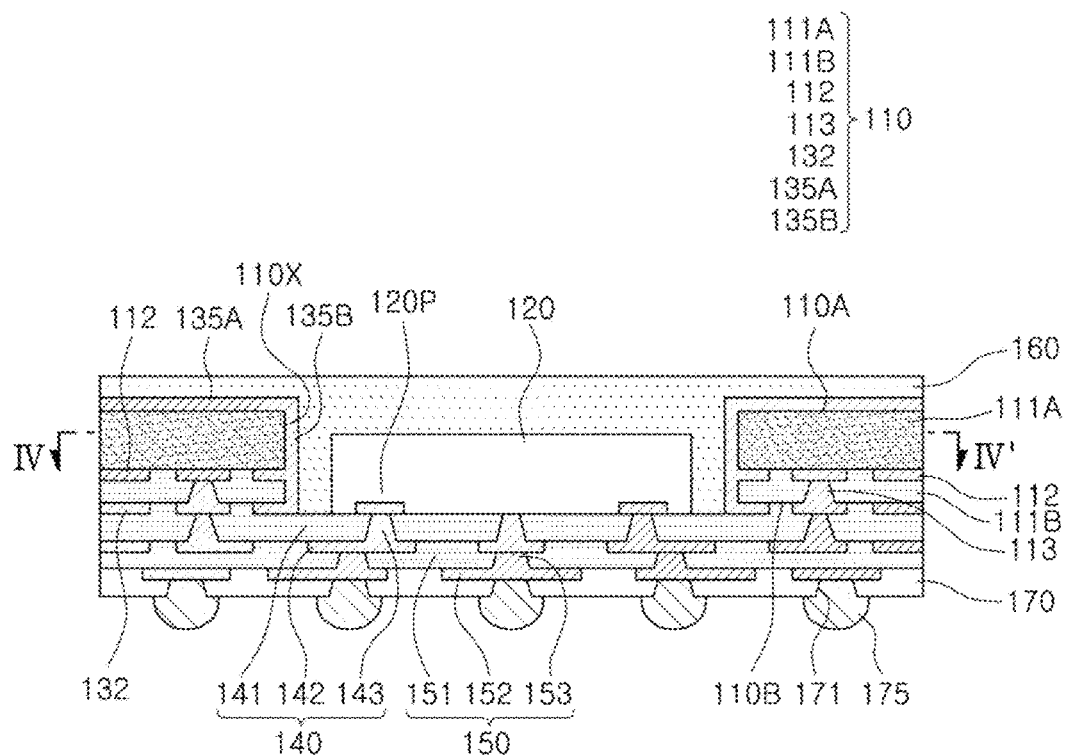
FIG. 12 is a cross-sectional view schematically illustrating another example of an electronic component package.

FIG. 12 is a cross-sectional view schematically illustrating another example of an electronic component package.

Figure 13:
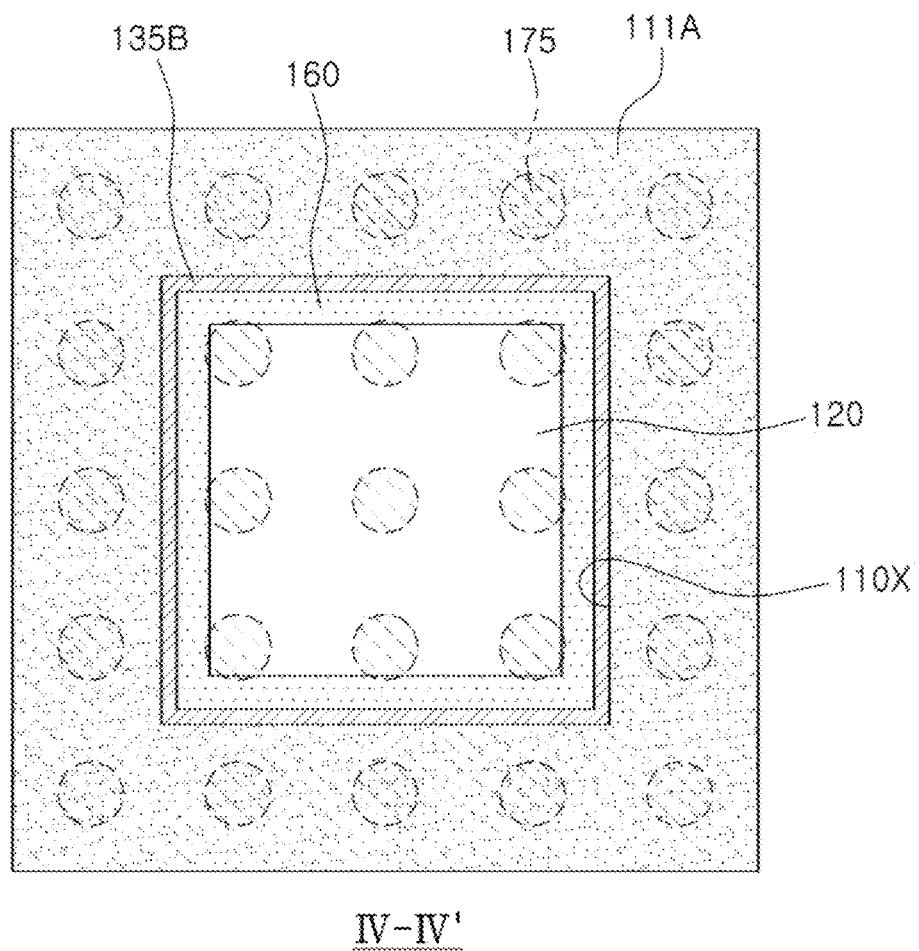
FIG. 13 is a schematic plan view of the electronic component package taken along line IV-IV' of FIG. 12.

FIG. 13 is a schematic plan view of the electronic component package taken along line IV-IV' of FIG. 12.

Referring to FIGS. 12 and 13, an electronic component package 100D according to another example may include a frame 110 having a through-hole 110X, an electronic component 120 disposed in the through-hole 110X of the frame 110, redistribution parts 140 and 150 disposed below the frame 110 and the electronic component 120, and an encapsulant 160 encapsulating the electronic component 120. The frame 110 may include a first insulating layer 111A, a second insulating layer 111B, a first wiring layer 112 disposed between the first and second insulating layers 111A and 111B, vias 113 penetrating through the second insulating layer 111B, a first metal layer 135A disposed on an upper surface 110A of the first insulating layer 111A, a second wiring layer 132 disposed on a lower surface 110B of the second insulating layer 111B, and a second metal layer 135B disposed on an inner surface of the through-hole 110X.

The through-hole 110X may sequentially penetrate through the first metal layer 135A, the first insulating layer 111A, the first wiring layer 112, the second insulating layer 111B, and the second wiring layer 132. At least one of the first wiring layer 112 and the second insulating layer 111B may be at a level between upper and lower surfaces of the electronic component 120. The upper surface of the electronic component 120 as shown in FIG. 12 is at a level below the upper surface 110A of the frame 110 with respect to the redistribution parts 140 and 150; the present disclosure, however, is not limited thereto. The upper surface of the electronic component 120 may be at the same level as or above the upper surface 110A of the frame 110 but below an upper surface of the first metal layer 135A, or at the same level as or above the upper surface of the first metal layer 135A, with respect to the redistribution parts 140 and 150, as long as the first metal layer 135A and the electronic component 120 are both covered by the encapsulant 160.

Hereinafter, respective components included in the electronic component package 100D according to another example will be described in more detail, a description of contents overlapping the contents described above will be omitted, and contents different from the contents described above will be mainly described.

The purpose of the second metal layer 135B disposed on the inner surface of the through-hole 110X may be to improve heat radiation characteristics and/or block electromagnetic waves. A material of the second metal layer 135B is not particularly limited as long as it is a metal having high thermal conductivity, such as copper (Cu), aluminum (Al), silver (Ag), tin (Sn), gold (Au), nickel (Ni), lead (Pb), or alloys thereof. The first metal layer 135A may be connected to the second metal layer 135B. In this case, heat emitted from the electronic component 120 may be conducted to the first metal layer 135A through the second metal layer 135B to thereby be dispersed to an upper portion of the electronic component package 100D. The second metal layer 135B may be connected to a redistribution pattern serving as a ground in the second wiring layer 132. In addition, the second metal layer 135B may also be connected to a redistribution pattern serving as a ground (GND) pattern in the first wiring layer 112. The heat emitted from the electronic component 120 may be conducted to the ground (GND) patterns in the wiring layers 112 and 132 through the second metal layer 135B to thereby be dispersed to a lower portion of the electronic component package 100D. The ground (GND) pattern may also serve to block electromagnetic waves. Alternatively, heat may be dispersed by convection or radiation.

FIGS. 14A through 14L are schematic views illustrating examples of processes of manufacturing the electronic component package 100D.

A description of contents overlapping the contents described above in a description for examples of processes of manufacturing the electronic component package 100D will be omitted, and contents different from the contents described above will be mainly described.

Figure 14E:
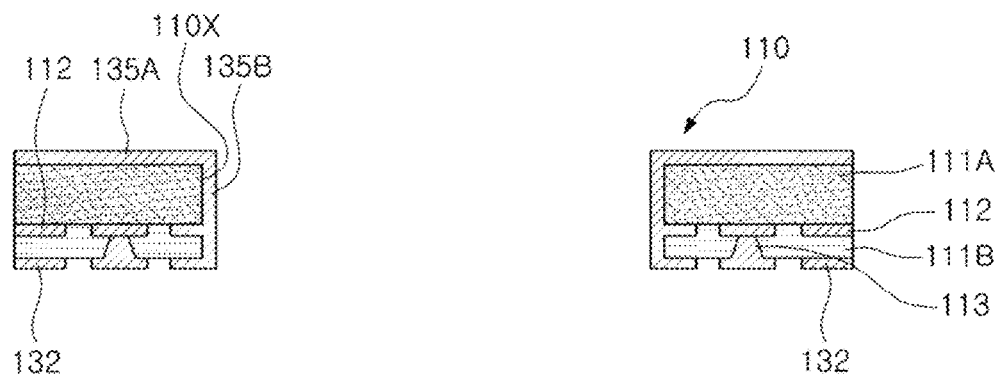

Referring to FIG. 14A, the first insulating layer 111A may be prepared. Referring to FIG. 14B, the first metal layer 135A and the first wiring layer 112 may be formed on the upper surface and the lower surface of the first insulating layer 111A, respectively. Referring to FIG. 14C, the second insulating layer 111B may be formed on the lower surface of the first insulating layer 111A. Referring to FIG. 14D, the through-hole 110X penetrating through the first insulating layer 111A and the second insulating layer 111B may be formed. In addition, via holes 113Y penetrating through the second insulating layer 111B may be formed. Referring to FIG. 14E, the second wiring layer 132 may be formed beneath the second insulating layer 111B, and the vias 113 may be formed in the second insulating layer 111B. In addition, the second metal layer 135B may be formed on the inner surface of the through-hole 110X. For example, the second metal layer 135B may be formed by electrolytic copper plating, electroless copper plating, or the like, using a dry film pattern. In more detail, the second metal layer 135B may be formed using a method such as CVD, PVD, sputtering, a subtractive process, an additive process, an SAP, an MSAP, or the like, but is not limited thereto. As a result, the frame 110 having the through-hole 110X may be formed.

Unlike as illustrated in the drawings, the first wiring layer 112 may be first formed on only the lower surface of the first insulating layer 111A by a tenting method, or the like, the second insulating layer 111B may be formed on the lower surface of the first insulating layer 111A, and the via holes 113Y and the through-hole 110X may be formed. Then, the second metal layer 135B may be formed on an inner wall of the through-hole 110X while forming the vias 113 by filling the via holes 113Y with a conductive material. At the same time, the first metal layer 135A and the second wiring layer 132 may be formed on the upper surface of the first insulating layer 111A and the lower surface of the second insulating layer 111B, respectively.

Figure 14F:
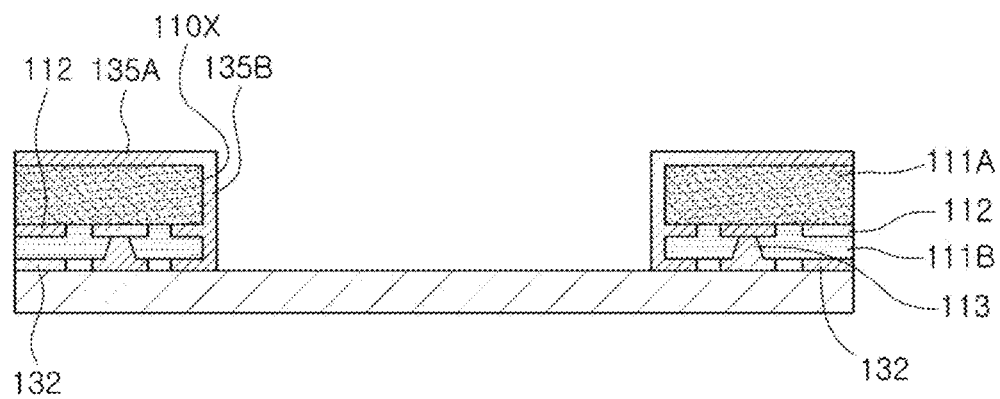
Figure 14G:
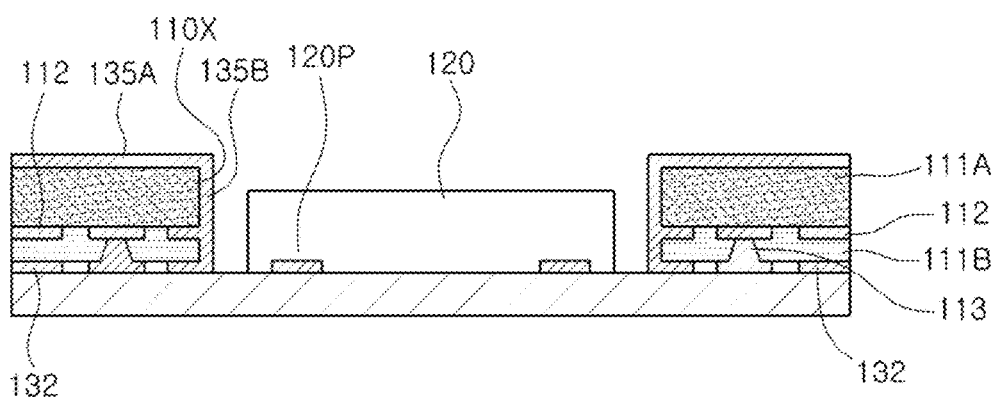
Figure 14H:
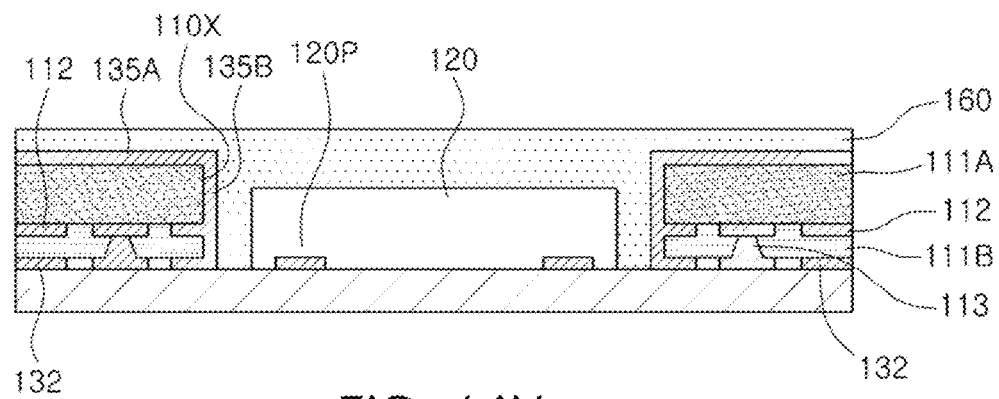
Figure 14I:
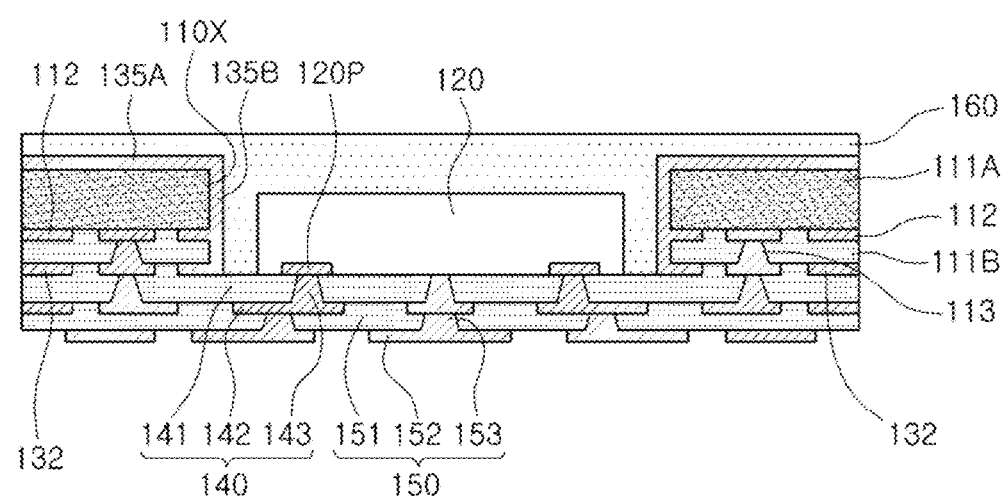
Figure 14J:
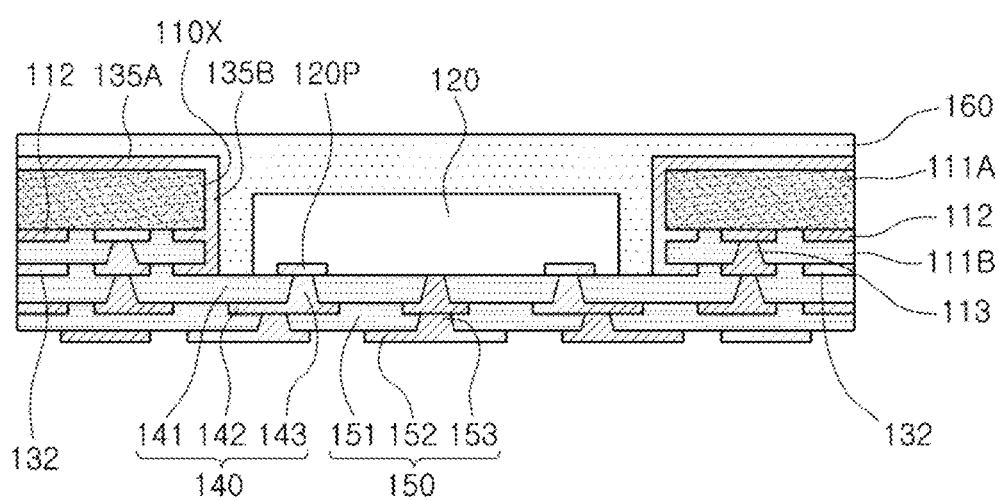
Figure 14K:
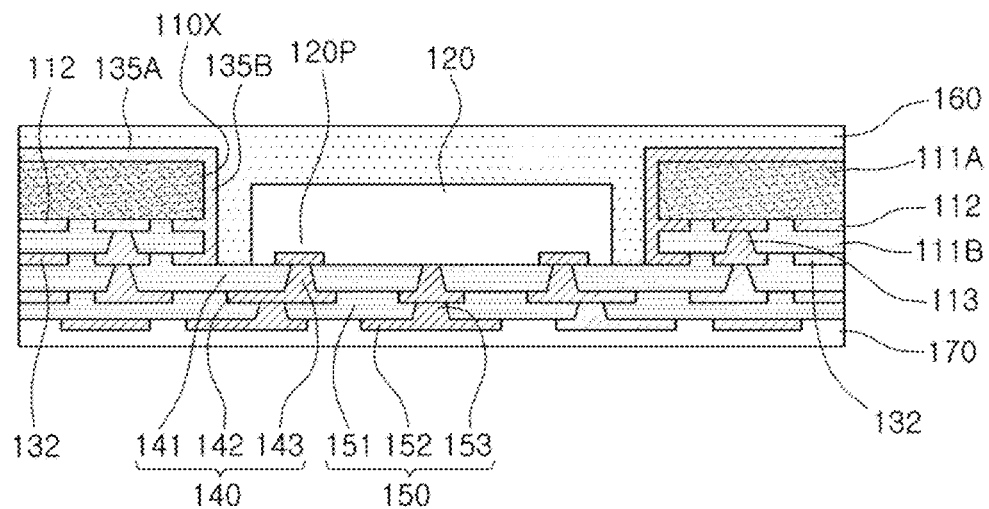
Figure 14L:
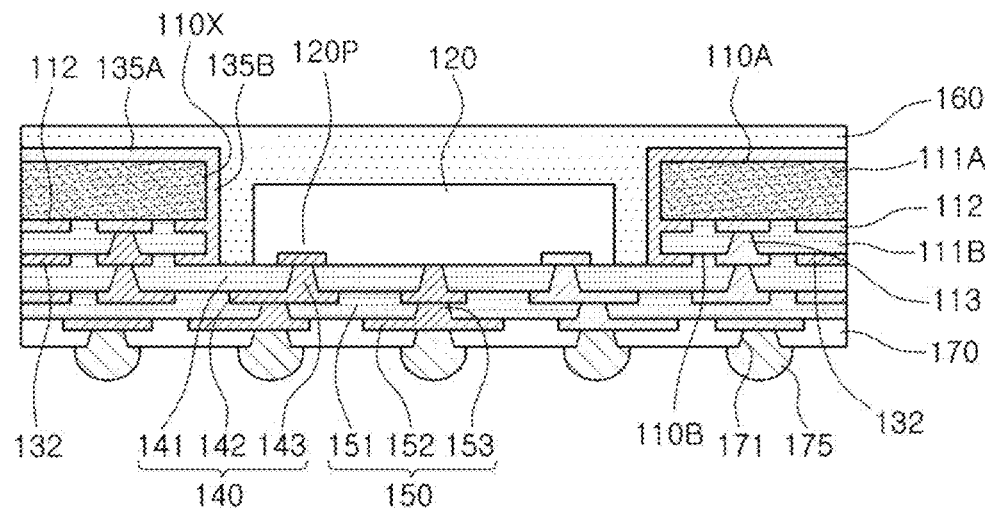

Referring to FIG. 14F, an adhesive film 190 may be attached to the second wiring layer 132. Referring to FIG. 14G, the electronic component 120 may be disposed in the through-hole 110X. Referring to FIG. 14H, the electronic component 120 may be encapsulated using the encapsulant 160. Referring to FIG. 14I, the adhesive film 190 may be peeled off. Referring to FIG. 14J, the redistribution part 140 including the redistribution part insulating layer 141, the redistribution part wiring layer 142, and the redistribution part vias 143 may be formed. Then, the redistribution part 150 including the redistribution part insulating layer 151, the redistribution part wiring layer 152, and the redistribution part vias 153 may be formed. Referring to FIG. 14K, the passivation layer 170 connected to the redistribution parts 140 and 150 may be formed. Referring to FIG. 14L, the first opening parts 171 may be formed in the passivation layer 170. Then, the first external connection terminals 175 disposed in the first opening parts 171 may be formed. In some cases, only the first opening parts 171 may be formed, and the first external connection terminals 175 may be formed, if necessary, by a separate process by a client purchasing the electronic component package 100D.

Figure 15:
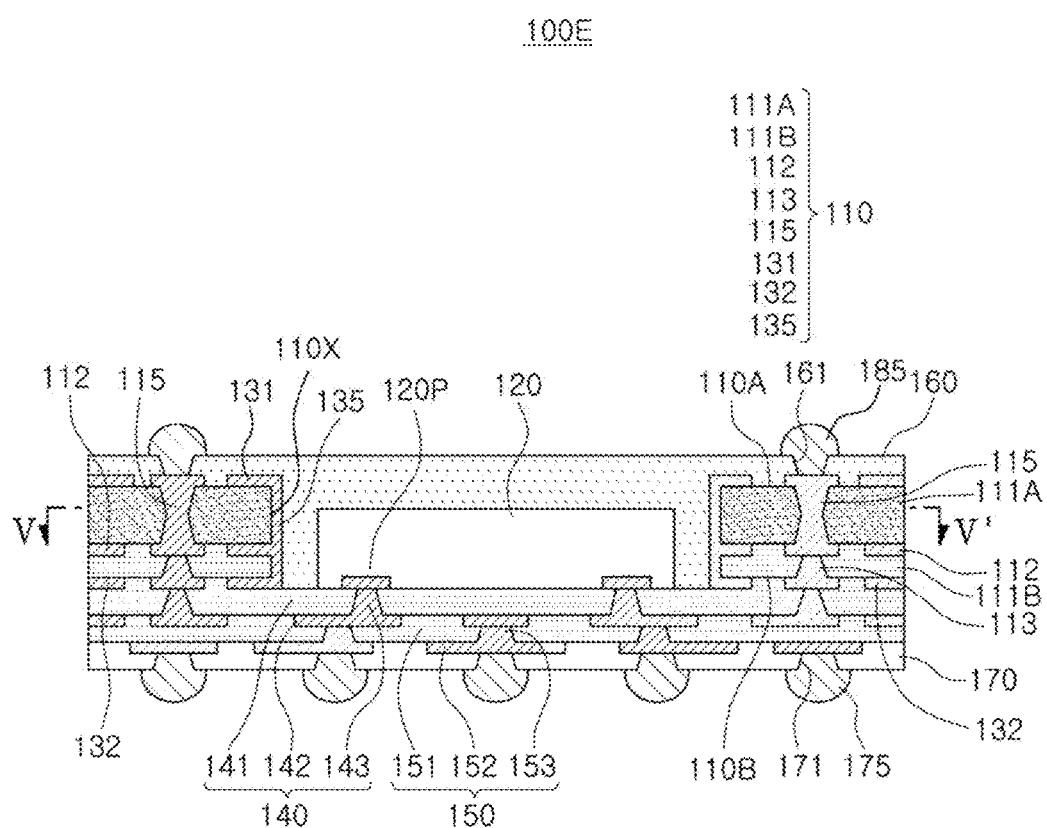
FIG. 15 is a cross-sectional view schematically illustrating another example of an electronic component package.

FIG. 15 is a cross-sectional view schematically illustrating another example of an electronic component package.

Figure 16:
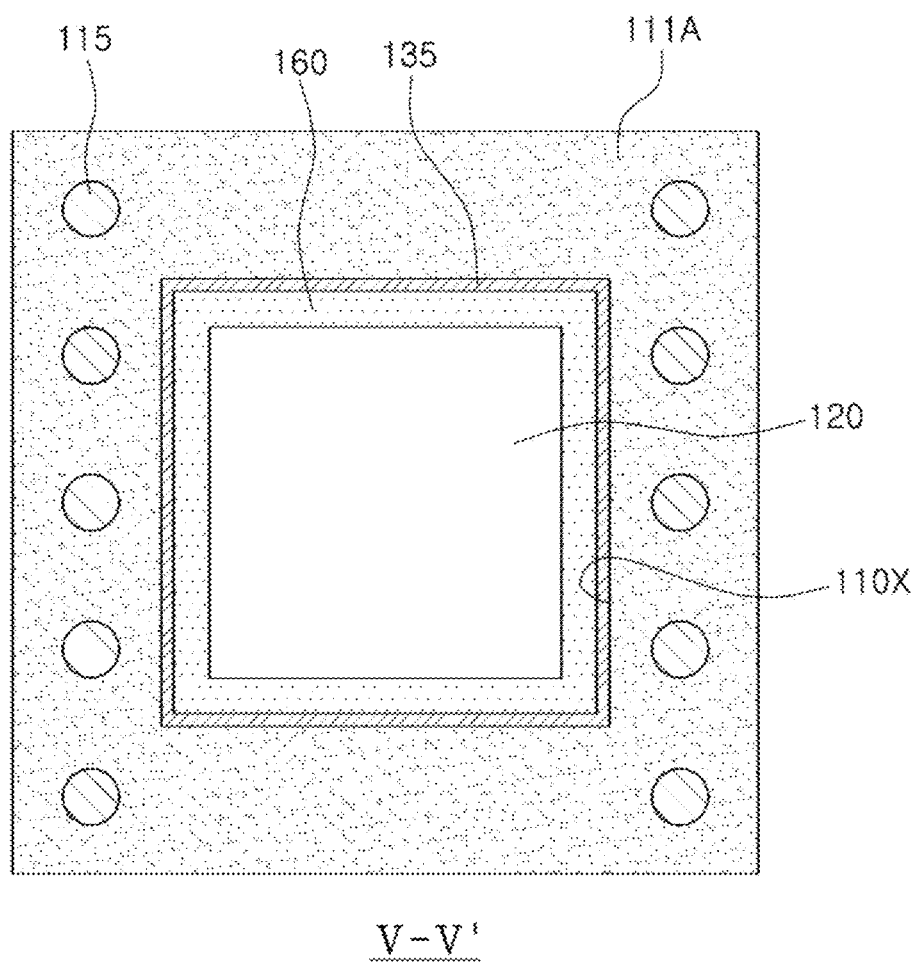
FIG. 16 is a schematic plan view of the electronic component package taken along line V-V' of FIG. 15.

FIG. 16 is a schematic plan view of the electronic component package taken along line V-V' of FIG. 15.

Referring to FIGS. 15 and 16, an electronic component package 100E according to another example may include a frame 110 having a through-hole 110X, an electronic component 120 disposed in the through-hole 110X of the frame 110, redistribution parts 140 and 150 disposed below the frame 110 and the electronic component 120, and an encapsulant 160 encapsulating the electronic component 120. The frame 110 may include a first insulating layer 111A, a second insulating layer 111B, a first wiring layer 112 disposed between the first and second insulating layers 111A and 111B, internal vias 115 penetrating through the first insulating layer 111A, vias 113 penetrating through the second insulating layer 111B, a third wiring layer 131 disposed on an upper surface 110A of the first insulating layer 111A, a second wiring layer 132 disposed on a lower surface 110B of the second insulating layer 111B, and a metal layer 135 disposed on an inner surface of the through-hole 110X.

The through-hole 110X may sequentially penetrate through the third wiring layer 131, the first insulating layer 111A, the first wiring layer 112, the second insulating layer 111B, and the second wiring layer 132. At least one of the first wiring layer 112 and the second insulating layer 111B may be at a level between upper and lower surfaces of the electronic component 120. The upper surface of the electronic component 120 as shown in FIG. 15 is at a level below the upper surface 110A of the frame 110 with respect to the redistribution parts 140 and 150; the present disclosure, however, is not limited thereto. The upper surface of the electronic component 120 may be at the same level as or above the upper surface 110A of the frame 110 but below an upper surface of the third wiring layer 131, or at the same level as or above the upper surface of the third wiring layer 131, with respect to the redistribution parts 140 and 150, as long as the third wiring layer 131 and the electronic component 120 are both covered by the encapsulant 160.

Hereinafter, respective components included in the electronic component package 100E according to another example will be described in more detail, a description of contents overlapping the contents described above will be omitted, and contents different from the contents described above will be mainly described.

The metal layer 135B disposed on the inner surface of the through-hole 110X may be connected to a redistribution pattern serving as a ground (GND) pattern in the third wiring layer 131. In this case, heat emitted from the electronic component 120 may be conducted to the ground (GND) pattern in the third wiring layer 131 through the metal layer 135 to thereby be dispersed to an upper portion of the electronic component package 100E. The metal layer 135 may be connected to a redistribution pattern serving as a ground (GND) pattern in the second wiring layer 132. The metal layer 135 may also be connected to a redistribution pattern serving as a ground (GND) pattern in the first wiring layer 112. In this case, the heat emitted from the electronic component 120 may be conducted to the ground (GND) patterns in the wiring layers 112 and 132 through the metal layer 135 to thereby be dispersed to a lower portion of the electronic component package 100E. The ground (GND) pattern may also serve to block electromagnetic waves. Alternatively, heat may be dispersed by convection or radiation.

FIGS. 17A through 17M are schematic views illustrating examples of processes of manufacturing the electronic component package 100E.

A description of contents overlapping the contents described above in a description for examples of processes of manufacturing the electronic component package 100E will be omitted, and contents different from the contents described above will be mainly described.

Figure 17A:
FIGS. 17A through 17M are schematic views illustrating examples of processes of manufacturing the electronic component package of FIG. 15.
Figure 17B:
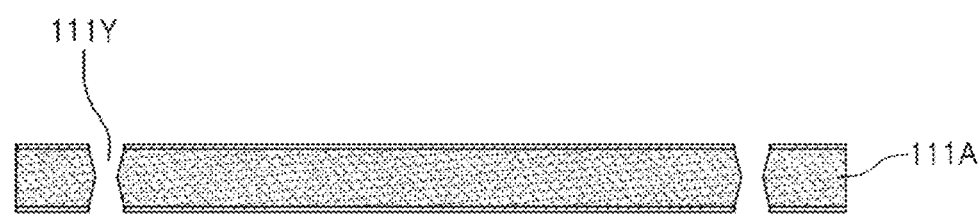
Figure 17C:
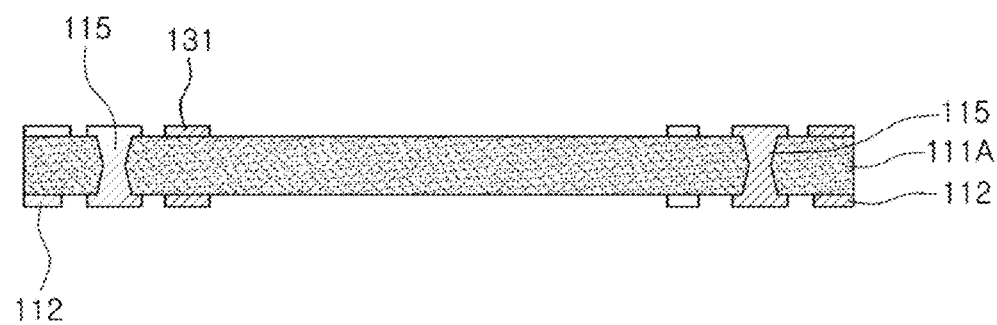
Figure 17D:
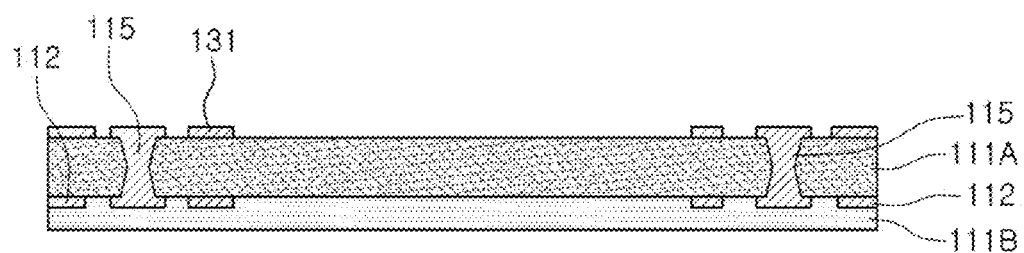
Figure 17E:
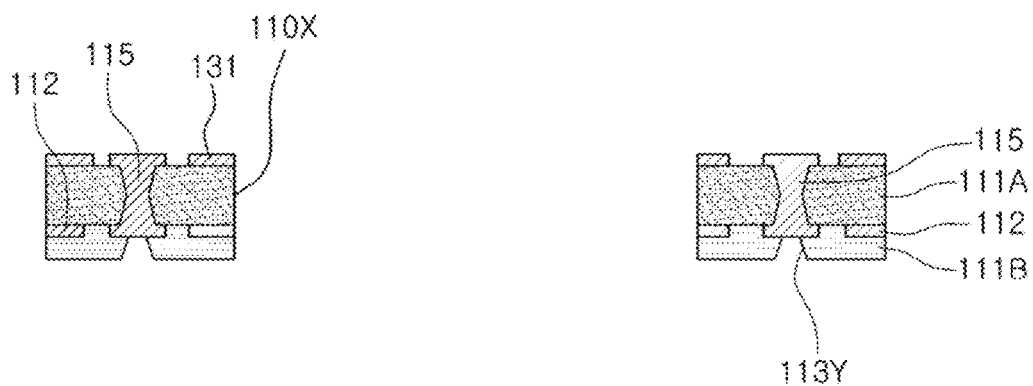
Figure 17F:
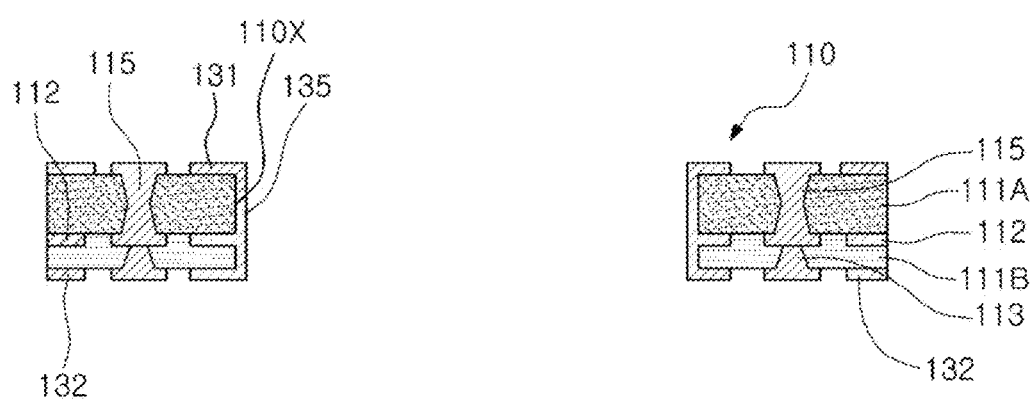

Referring to FIG. 17A, the first insulating layer 111A may be prepared. Referring to FIG. 17B, through-holes 111Y penetrating through the upper and lower surfaces of the first insulating layer 111A may be formed. Referring to FIG. 17C, the third and first wiring layers 131 and 112 may be formed on the upper surface and the lower surface of the first insulating layer 111A, respectively. In addition, the through-holes 111Y may be filled with a conductive material to form the internal vias 115. Referring to FIG. 17D, the second insulating layer 111B may be formed on the lower surface of the first insulating layer 111A. Referring to FIG. 17E, the through-hole 110X penetrating through the first insulating layer 111A and the second insulating layer 111B may be formed. In addition, via holes 113Y penetrating through the second insulating layer 111B may be formed. Referring to FIG. 17F, the second wiring layer 132 may be formed beneath the second insulating layer 111B, and the vias 113 may be formed in the second insulating layer 111B. In addition, the metal layer 135 may be formed on the inner surface of the through-hole 110X. As a result, the frame 110 having the through-hole 110X may be formed.

Unlike as illustrated in the drawings, the first wiring layer 112 may be first formed on only the lower surface of the first insulating layer 111A by a tenting method, or the like, the second insulating layer 111B may be formed on the lower surface of the first insulating layer 111A, and the via holes 113Y, the through-holes 111Y, and the through-hole 110X may be formed. Then, the metal layer 135 may be formed on an inner wall of the through-hole 110X while forming the vias 113 and the internal vias 115 by filling the via holes 113Y and the through-holes 111Y with a conductive material. At the same time, the third and second wiring layers 131 and 132 may be formed on the upper surface of the first insulating layer 111A and the lower surface of the second insulating layer 111B, respectively.

Figure 17G:
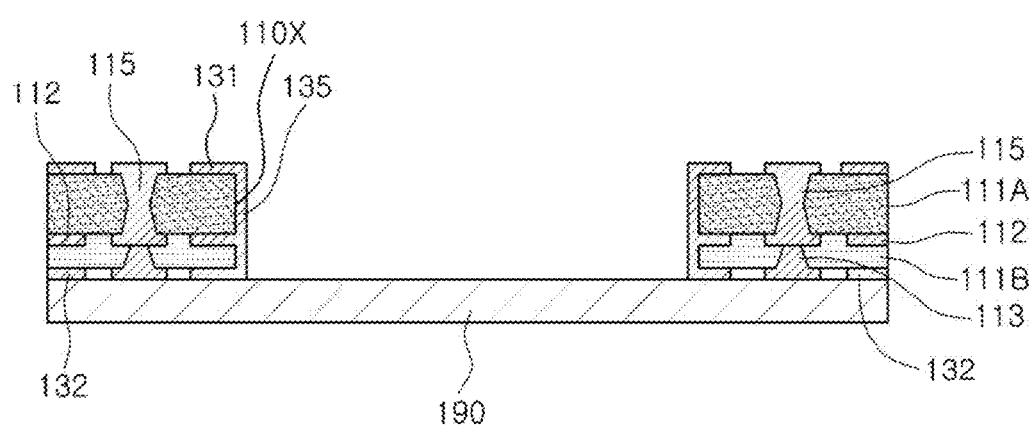
Figure 17H:
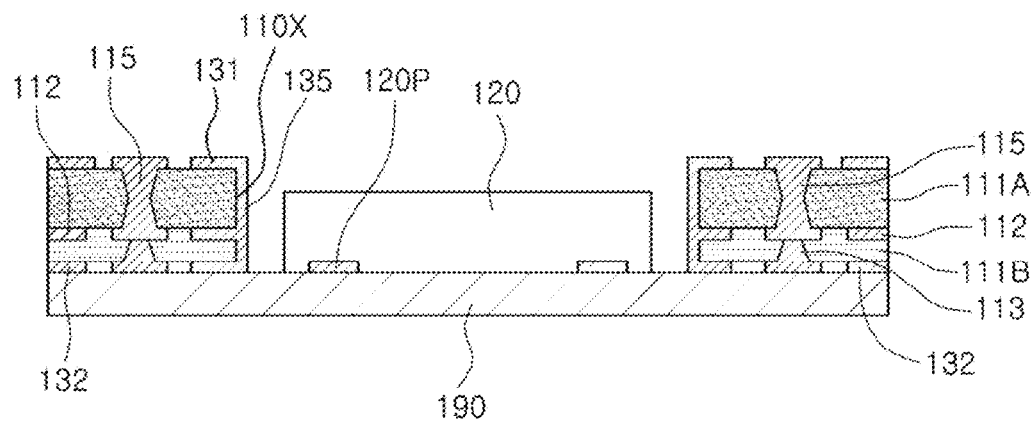
Figure 17I:
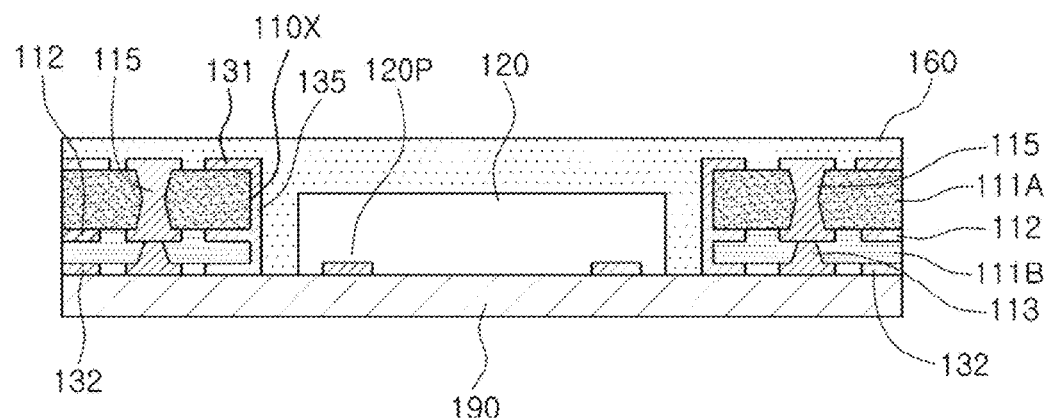
Figure 17J:
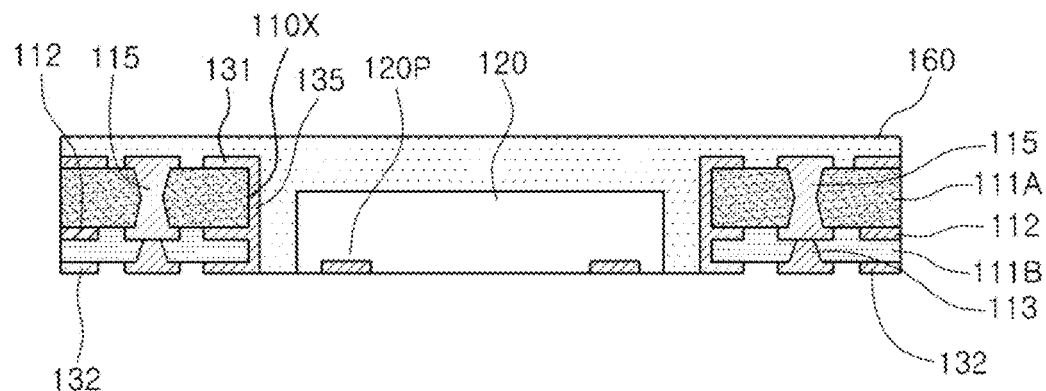
Figure 17K:
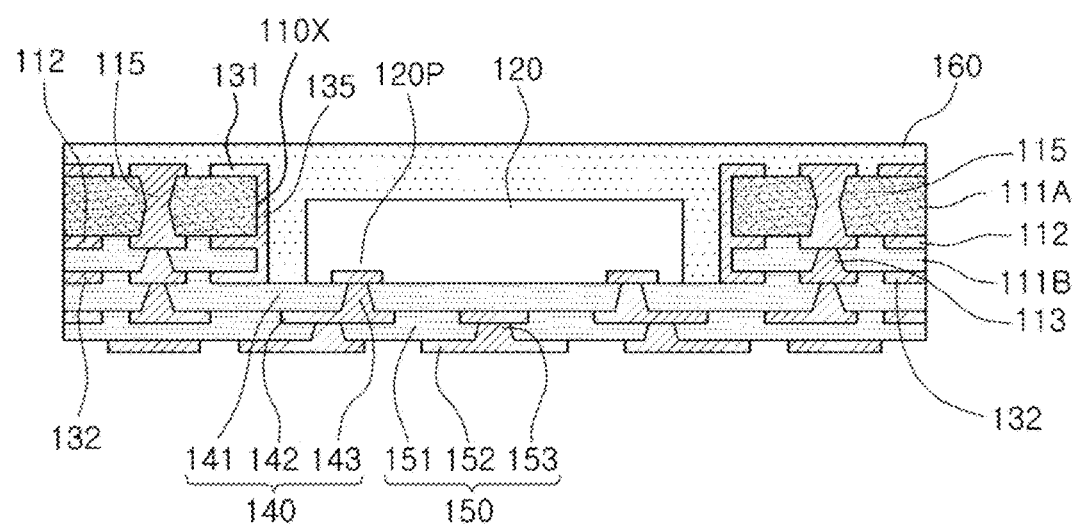
Figure 17L:
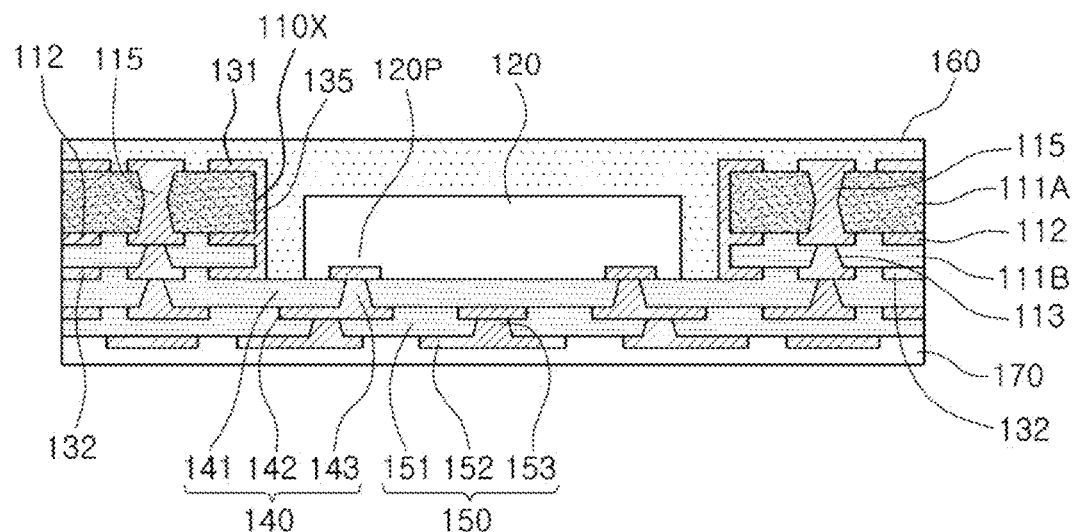
Figure 17M:
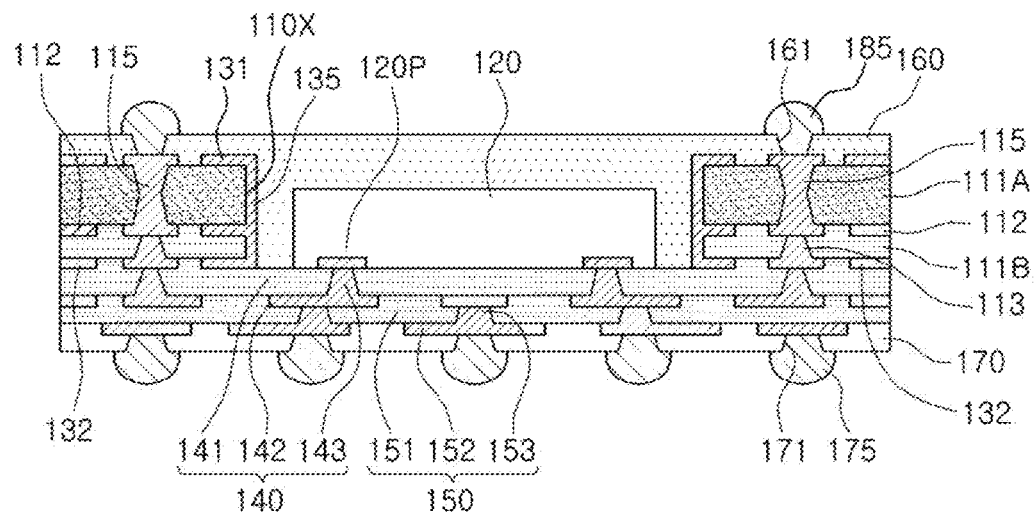

Referring to FIG. 17G, the adhesive film 190 may be attached to the second wiring layer 132. Referring to FIG. 17H, the electronic component 120 may be disposed in the through-hole 110X. Referring to FIG. 17I, the electronic component 120 may be encapsulated using the encapsulant 160. Referring to FIG. 17J, the adhesive film 190 may be peeled off. Referring to FIG. 17K, the redistribution part 140 including the redistribution part insulating layer 141, the redistribution part wiring layer 142, and the redistribution part vias 143 may be formed. Then, the redistribution part 150 including the redistribution part insulating layer 151, the redistribution part wiring layer 152, and the redistribution part vias 153 may be formed. Referring to FIG. 17L, the passivation layer 170 connected to the redistribution parts 140 and 150 may be formed. Referring to FIG. 17M, the first opening parts 171 may be formed in the passivation layer 170, and the first external connection terminals 175 disposed in the first opening parts 171 may be formed. In addition, the second opening parts 161 may be formed in an outer surface of the encapsulant 160 so that at least portions of the third wiring layer 131 are exposed, and the second external connection terminals 185 disposed in the second opening parts 161 may be formed. In some cases, only the second external connection terminals 185 disposed in the second opening parts 161 of the encapsulant 160 may be formed, and only the first opening parts 171 may be formed in the passivation layer 170 and the first external connection terminals 175 disposed in the first opening parts 171 may be formed, if necessary, by a separate process by a client purchasing the electronic component package 100E.

Figure 18:
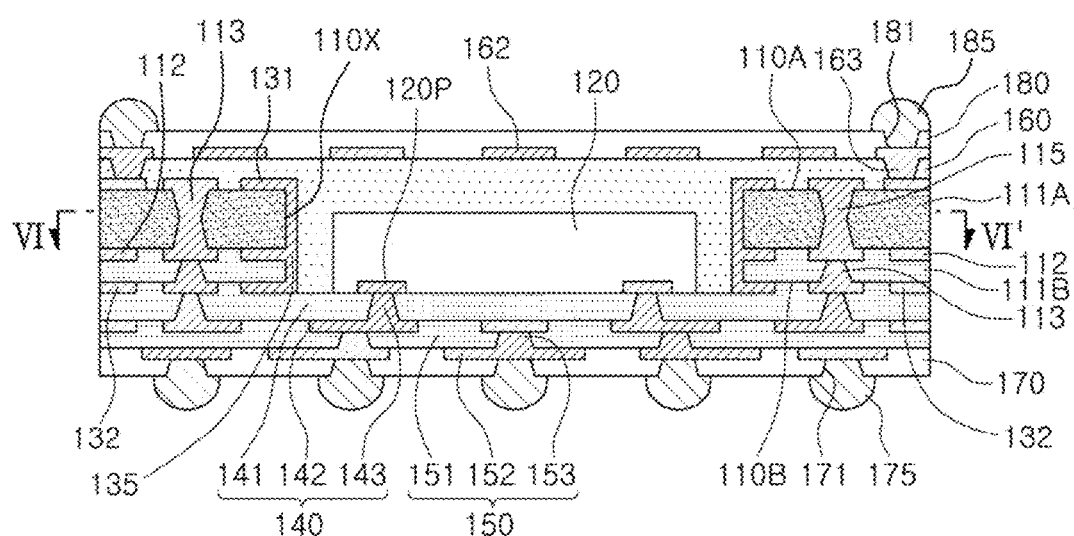
FIG. 18 is a cross-sectional view schematically illustrating another example of an electronic component package.

FIG. 18 is a cross-sectional view schematically illustrating another example of an electronic component package.

Figure 19:
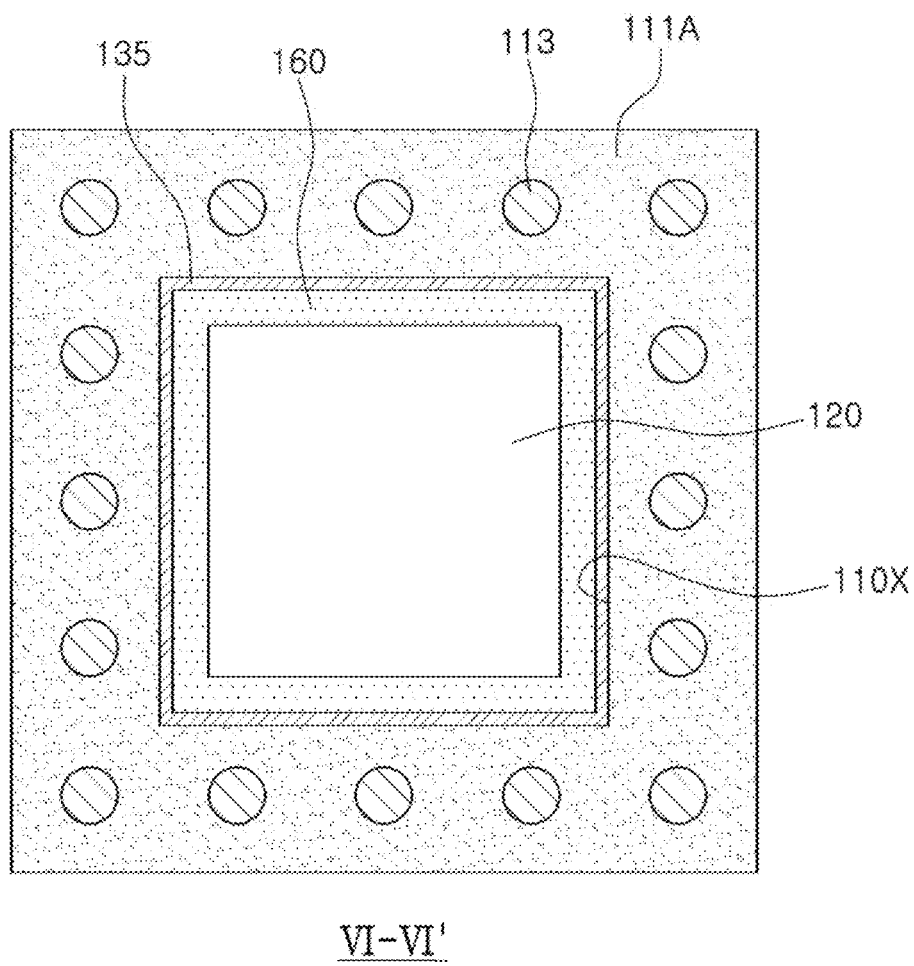
FIG. 19 is a schematic plan view of the electronic component package taken along line VI-VI' of FIG. 18.

FIG. 19 is a schematic plan view of the electronic component package taken along line VI-VI' of FIG. 18.

Referring to FIGS. 18 and 19, an electronic component package 100F according to another example may include a frame 110 having a through-hole 110X, an electronic component 120 disposed in the through-hole 110X of the frame 110, redistribution parts 140 and 150 disposed below the frame 110 and the electronic component 120, an encapsulant 160 encapsulating the electronic component 120, an outer wiring layer 162 disposed on the encapsulant 160, and outer vias 163 penetrating through the encapsulant 160. The frame 110 may include a first insulating layer 111A, a second insulating layer 111B, a first wiring layer 112 disposed between the first and second insulating layers 111A and 111B, internal vias 115 penetrating through the first insulating layer 111A, vias 113 penetrating through the second insulating layer 111B, a third wiring layer 131 disposed on an upper surface 110A of the first insulating layer 111A, a second wiring layer 132 disposed on a lower surface 110B of the second insulating layer 111B, and a metal layer 135 disposed on an inner surface of the through-hole 110X.

The through-hole 110X may sequentially penetrate through the third wiring layer 131, the first insulating layer 111A, the first wiring layer 112, the second insulating layer 111B, and the second wiring layer 132. At least one of the first wiring layer 112 and the second insulating layer 111B may be at a level between upper and lower surfaces of the electronic component 120. The upper surface of the electronic component 120 as shown in FIG. 18 is at a level below the upper surface 110A of the frame 110 with respect to the redistribution parts 140 and 150; the present disclosure, however, is not limited thereto. The upper surface of the electronic component 120 may be at the same level as or above the upper surface 110A of the frame 110 but below an upper surface of the third wiring layer 131, or at the same level as or above the upper surface of the third wiring layer 131, with respect to the redistribution parts 140 and 150, as long as the third wiring layer 131 and the electronic component 120 are both covered by the encapsulant 160.

Hereinafter, respective components included in the electronic component package 100F according to another example will be described in more detail, a description of contents overlapping the contents described above will be omitted, and contents different from the contents described above will be mainly described.

A portion of the outer wiring layer 162 disposed on the encapsulant 160 may be a redistribution pattern serving as a ground (GND) pattern. Here, the metal layer 135 may also be connected to the outer wiring layer 162 disposed on the encapsulant 160 through the redistribution pattern serving as the ground (GND) pattern in the third wiring layer 131. Here, the outer wiring layer 162 disposed on the encapsulant 160 may be disposed in a plate form above the electronic component 120 encapsulated by the encapsulant 160. In this case, since most of an upper portion, a lower portion, and side portions of the electronic component 120 are covered with metal, heat radiation characteristics and an electromagnetic wave blocking effect may be excellent. Alternatively, heat may be dispersed by convection or radiation.

FIGS. 20A through 20M are schematic views illustrating examples of processes of manufacturing the electronic component package 100F.

A description of contents overlapping the contents described above in a description for examples of processes of manufacturing the electronic component package 100F will be omitted, and contents different from the contents described above will be mainly described.

Figure 20A:
FIGS. 20A through 20M are schematic views illustrating examples of processes of manufacturing the electronic component package of FIG. 18.
Figure 20B:
Figure 20C:
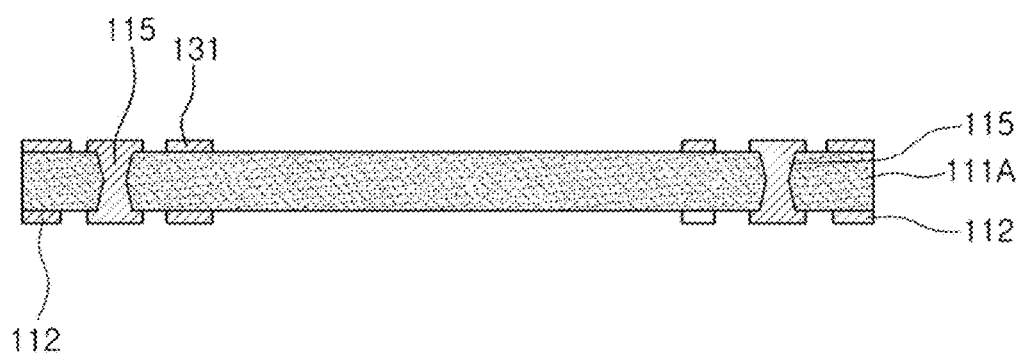
Figure 20D:
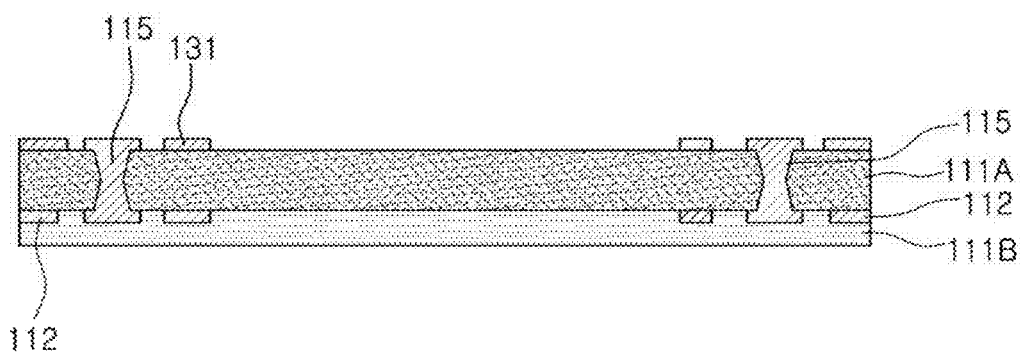
Figure 20E:
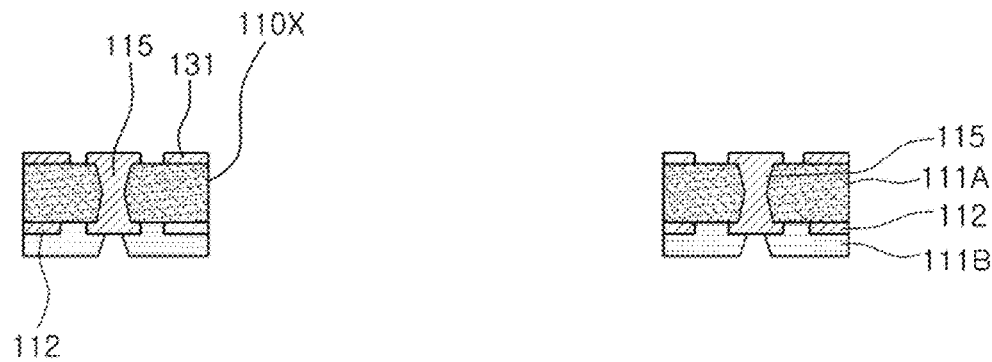
Figure 20F:
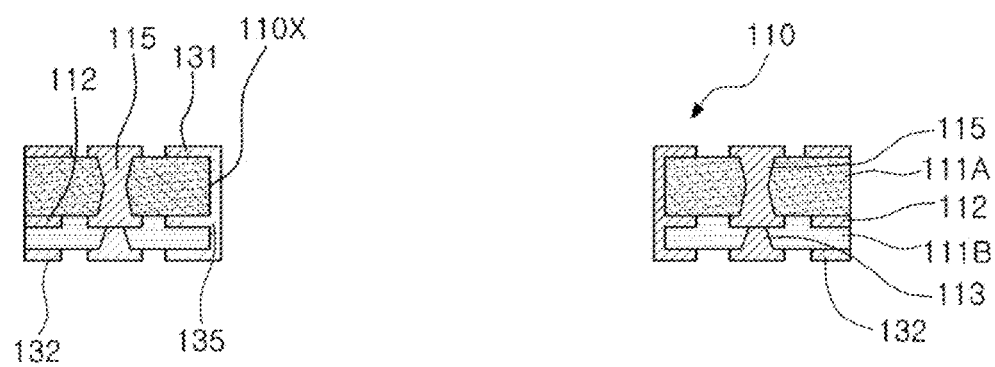

Referring to FIG. 20A, the first insulating layer 111A may be prepared. Referring to FIG. 20B, through-holes 111Y penetrating through the upper and lower surfaces of the first insulating layer 111A may be formed. Referring to FIG. 20C, the third and first wiring layers 131 and 112 may be formed on the upper surface and the lower surface of the first insulating layer 111A, respectively. In addition, the through-holes 111Y may be filled with a conductive material to form the internal vias 115. Referring to FIG. 20D, the second insulating layer 111B may be formed on the lower surface of the first insulating layer 111A. Referring to FIG. 20E, the through-hole 110X penetrating through the first insulating layer 111A and the second insulating layer 111B may be formed. In addition, via holes 113Y penetrating through the second insulating layer 111B may be formed. Referring to FIG. 20F, the second wiring layer 132 may be formed beneath the second insulating layer 111B, and the vias 113 may be formed in the second insulating layer 111B. In addition, the metal layer 135 may be formed on the inner surface of the through-hole 110X. As a result, the frame 110 having the through-hole 110X may be formed.

Unlike as illustrated in the drawings, the first wiring layer 112 may be first formed on only the lower surface of the first insulating layer 111A by a tenting method, or the like, the second insulating layer 111B may be formed on the lower surface of the first insulating layer 111A, and the via holes 113Y, the through-holes 111Y, and the through-hole 110X may be formed. Then, the metal layer 135 may be formed on an inner wall of the through-hole 110X while forming the vias 113 and the internal vias 115 by filling the via holes 113Y and the through-holes 111Y with a conductive material. At the same time, the third and second wiring layers 131 and 132 may be formed on the upper surface of the first insulating layer 111A and the lower surface of the second insulating layer 111B, respectively.

Figure 20G:
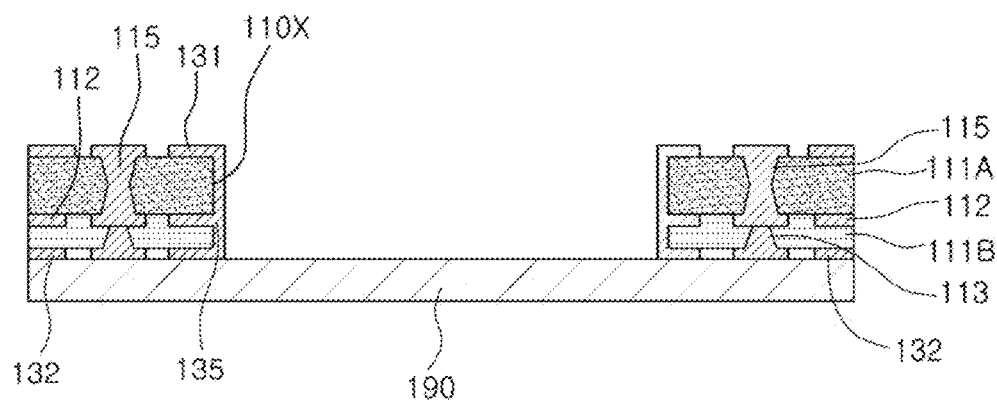
Figure 20H:
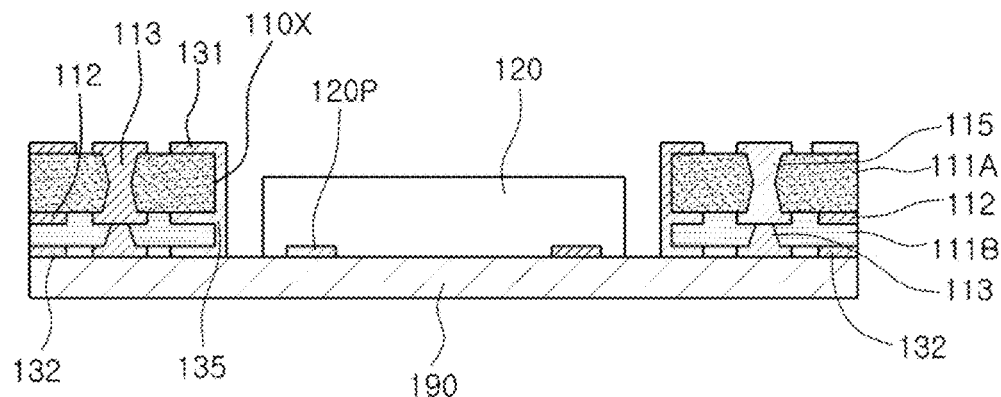
Figure 20I:
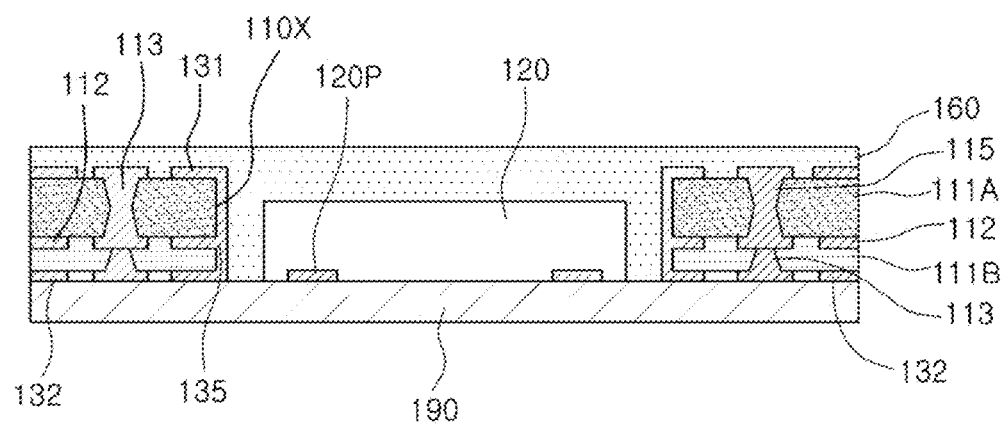
Figure 20J:
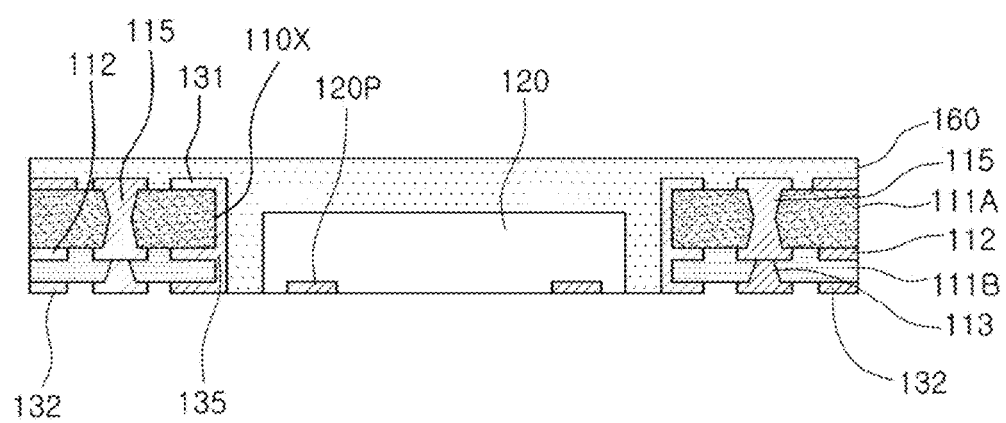
Figure 20K:
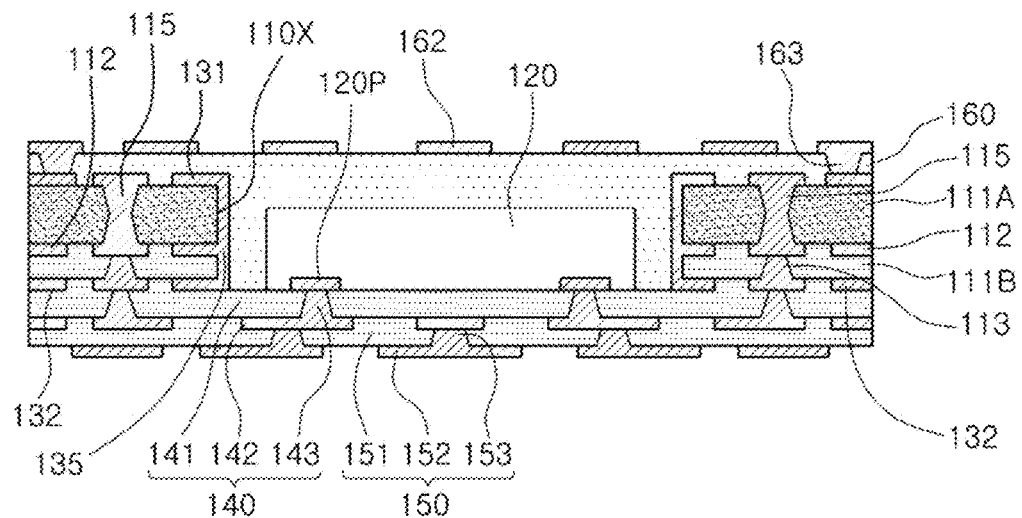
Figure 20L:
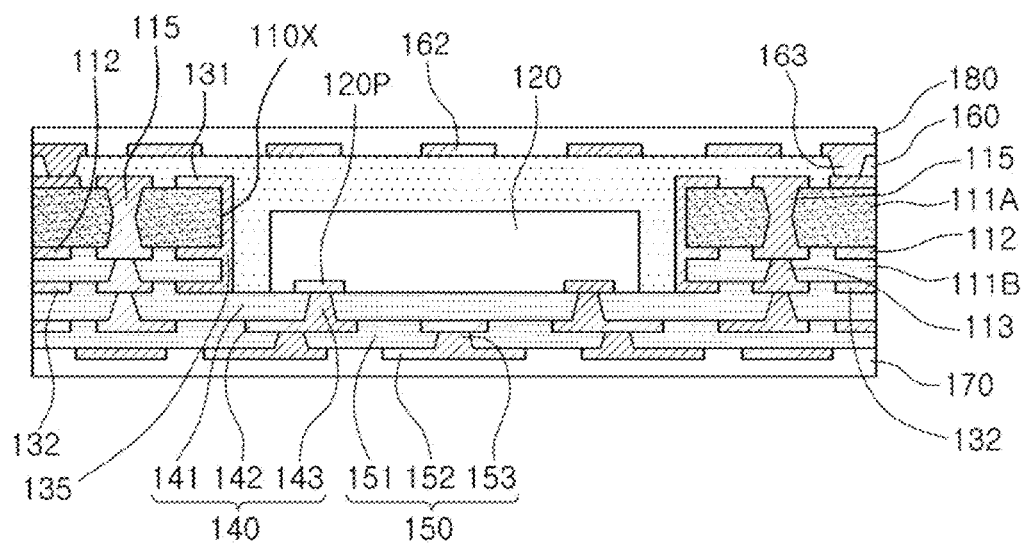
Figure 20M:
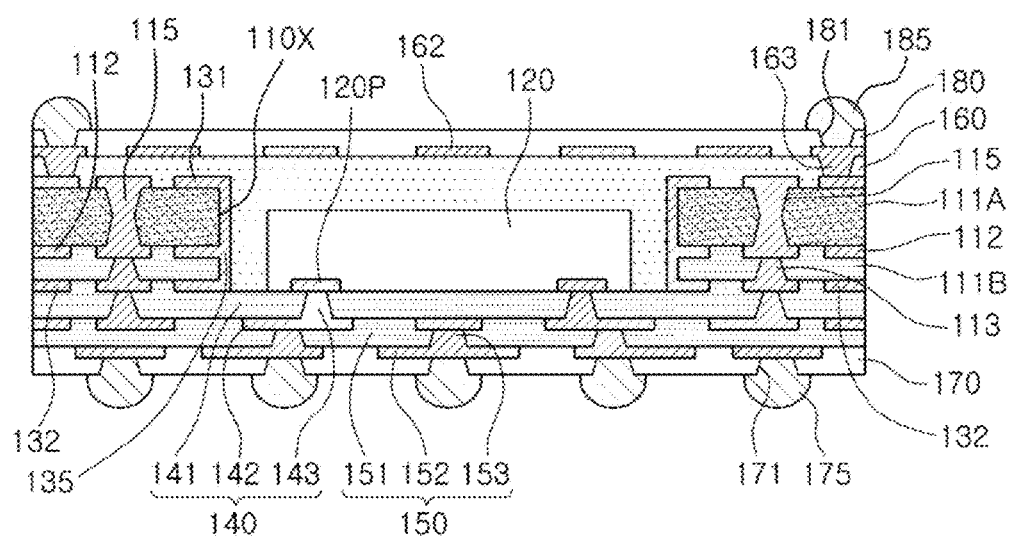

Referring to FIG. 20G, the adhesive film 190 may be attached to the second wiring layer 132. Referring to FIG. 20H, the electronic component 120 may be disposed in the through-hole 110X. Referring to FIG. 20I, the electronic component 120 may be encapsulated using the encapsulant 160. Referring to FIG. 20J, the adhesive film 190 may be peeled off. Referring to FIG. 20K, the redistribution part 140 including the redistribution part insulating layer 141, the redistribution part wiring layer 142, and the redistribution part vias 143 may be formed. Then, the redistribution part 150 including the redistribution part insulating layer 151, the redistribution part wiring layer 152, and the redistribution part vias 153 may be formed. Referring to FIG. 20L, the passivation layer 170 connected to the redistribution parts 140 and 150 and the cover layer 180 connected to the encapsulant 160 may be formed. Referring to FIG. 20M, the third opening parts 181 may be formed in an outer surface of the cover layer 180 so that at least portions of the outer wiring layer 162 are exposed, and the second external connection terminals 185 disposed in the third opening parts 181 may be formed. In addition, the first opening parts 171 of the passivation layer 170 and the first external connection terminals 175 disposed in the first opening parts 171 may be formed. In some cases, only the second external connection terminals 185 disposed in the third opening parts 181 of the cover layer 180 may be formed, and only the first opening parts 171 may be formed in the passivation layer 170 and the first external connection terminals 175 disposed in the first opening parts 171 may be formed, if necessary, by a separate process by a client purchasing the electronic component package 100F.

Figure 21:
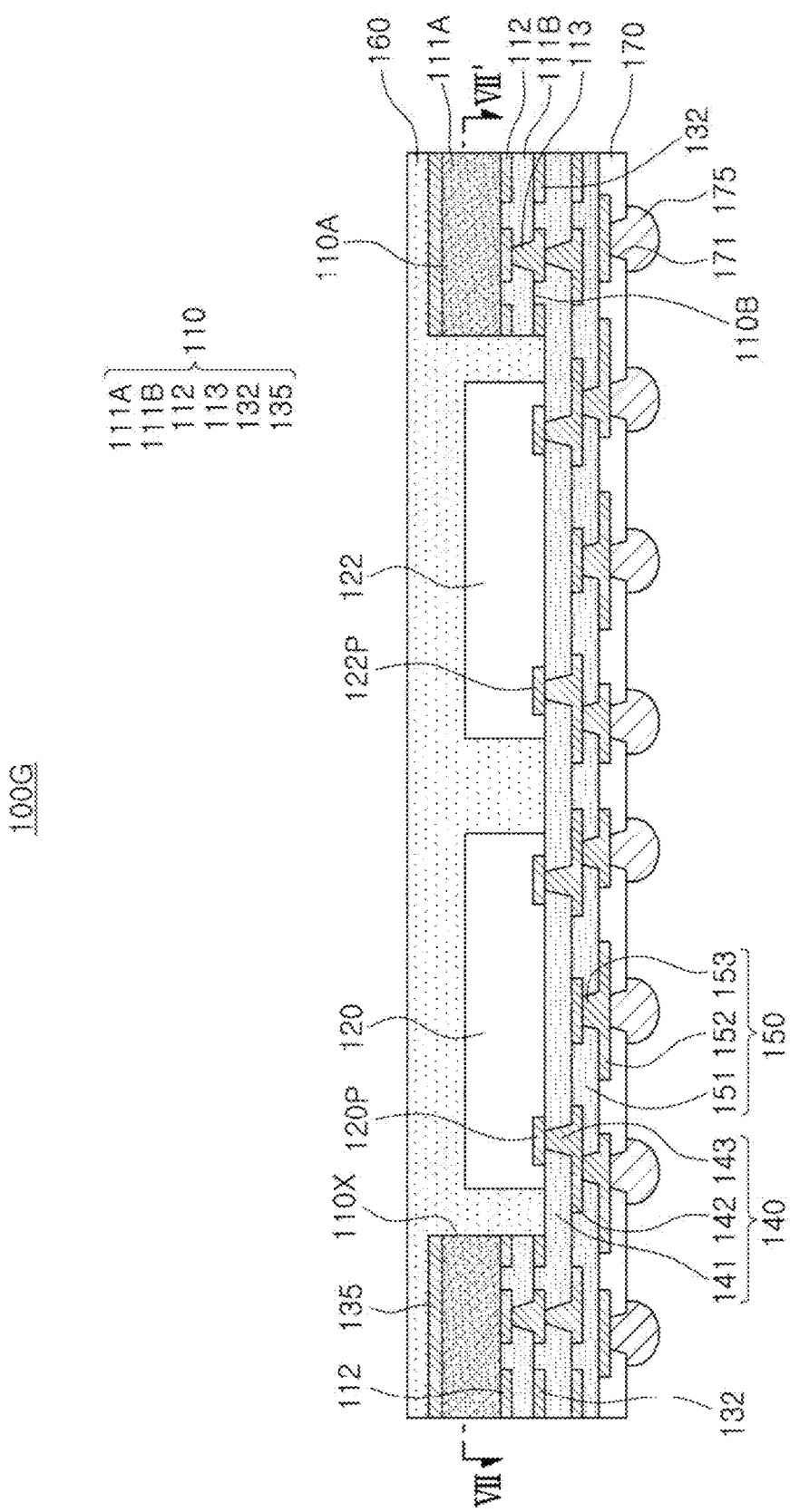
FIG. 21 is a cross-sectional view schematically illustrating another example of an electronic component package.

FIG. 21 is a cross-sectional view schematically illustrating another example of an electronic component package.

Figure 22:
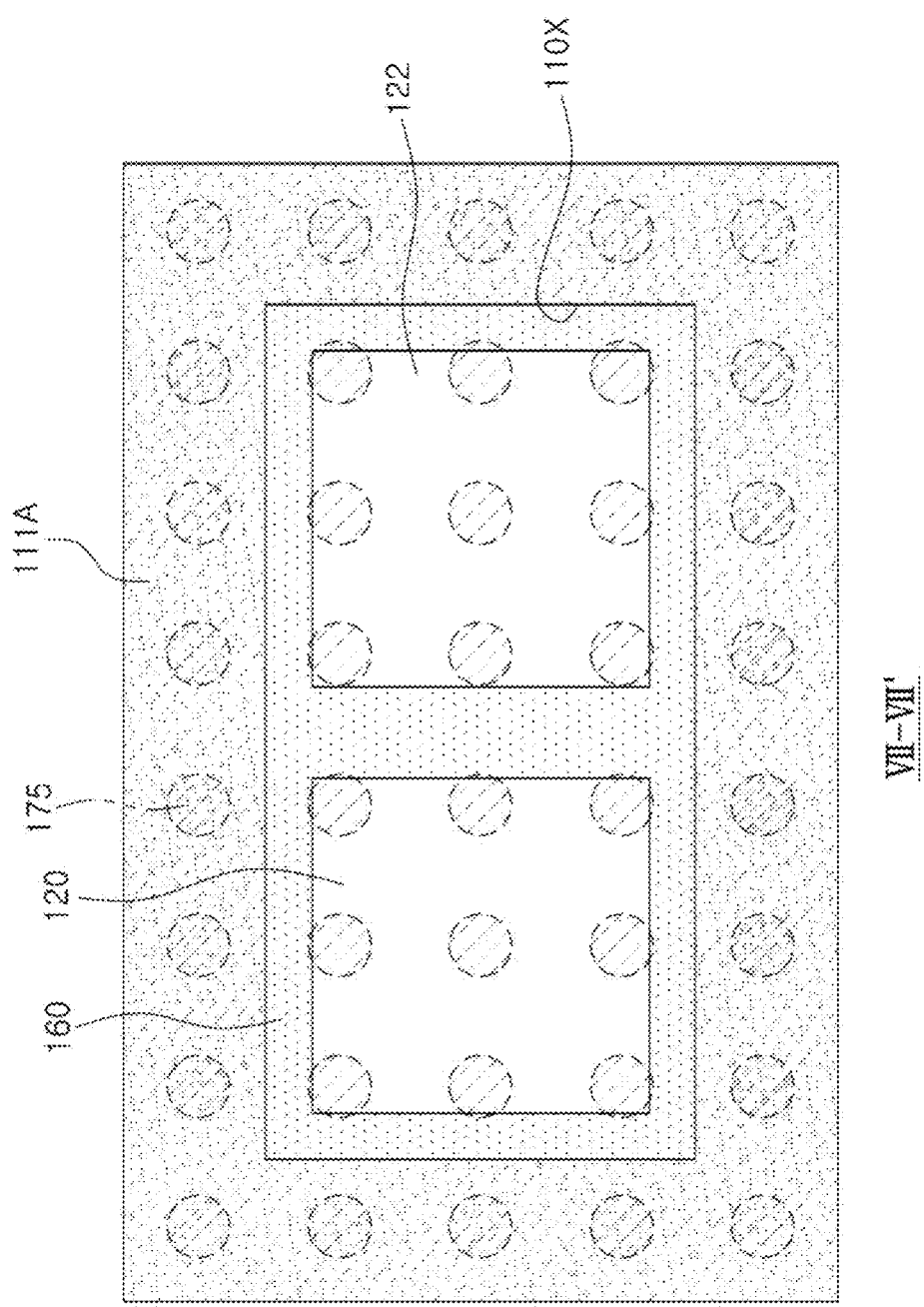
FIG. 22 is a schematic plan view of the electronic component package taken along line VII-VII' of FIG. 21.

FIG. 22 is a schematic plan view of the electronic component package taken along line VII-VII' of FIG. 21.

Referring to FIGS. 21 and 22, an electronic component package 100G according to another example may include a frame 110 having a through-hole 110X, a plurality of electronic components 120 and 122 disposed in the through-hole 110X of the frame 110, redistribution parts 140 and 150 disposed below the frame 110 and the plurality of electronic components 120 and 122, and an encapsulant 160 encapsulating the plurality of electronic components 120 and 122. The frame 110 may include a first insulating layer 111A, a second insulating layer 111B, a first wiring layer 112 disposed between the first and second insulating layers 111A and 111B, a metal layer 135 disposed on an upper surface of the first insulating layer 111A, a second wiring layer 132 disposed on a lower surface of the second insulating layer 111B, and vias 113 penetrating through the second insulating layer 111B.

The through-hole 110X may sequentially penetrate through the metal layer 135, the first insulating layer 111A, the first wiring layer 112, the second insulating layer 111B, and the second wiring layer 132. At least one of the first wiring layer 112 and the second insulating layer 111B may be at a level between upper and lower surfaces of one of the plurality of electronic components 120 and 122. The upper surfaces of the plurality of electronic components 120 and 122 as shown in FIG. 21 are at a level below the upper surface 110A of the frame 110 with respect to the redistribution parts 140 and 150; the present disclosure, however, is not limited thereto. The upper surfaces of the plurality of electronic components 120 and 122 may be at the same level as or above the upper surface 110A of the frame 110 but below an upper surface of the metal layer 135, or at the same level as or above the upper surface of the metal layer 135, with respect to the redistribution parts 140 and 150, as long as the meta layer 135 and the plurality of electronic components 120 and 122 are all covered by the encapsulant 160. The upper surfaces of the plurality of electronic components 120 and 122 may be at different levels when thicknesses of the plurality of electronic components 120 and 122 are different.

Hereinafter, respective components included in the electronic component package 100G according to another example will be described in more detail, a description of contents overlapping the contents described above will be omitted, and contents different from the contents described above will be mainly described.

The plurality of electronic components 120 and 122 may be the same as or different from each other. The plurality of electronic components 120 and 122 may have, respectively, electrode pads 120P and 122P electrically connected to the frame 110, the redistribution parts 140 and 150, and the like. The electrode pads 120P and 122P may be redistributed by the frame 110, the redistribution parts 140 and 150, and the like, respectively. The number, an interval, a disposition form, and the like, of electronic components 120 and 122 are not particularly limited, and may be sufficiently modified depending on design particulars by those skilled in the art.

For example, the number of electronic components 120 and 122 may be two as illustrated in FIGS. 21 and 22. However, the number of electronic components 120 and 122 is not limited thereto, and may be two or more, such as three, four, or the like. A metal layer 135 may be further disposed on an inner surface of the through-hole 110X, if necessary.

Since a method of manufacturing the electronic component package 100G according to another example is the same as the methods of manufacturing the electronic component packages 100A and 100D except that the plurality of electronic components 120 and 122 are disposed, a description thereof will be omitted.

Figure 23:
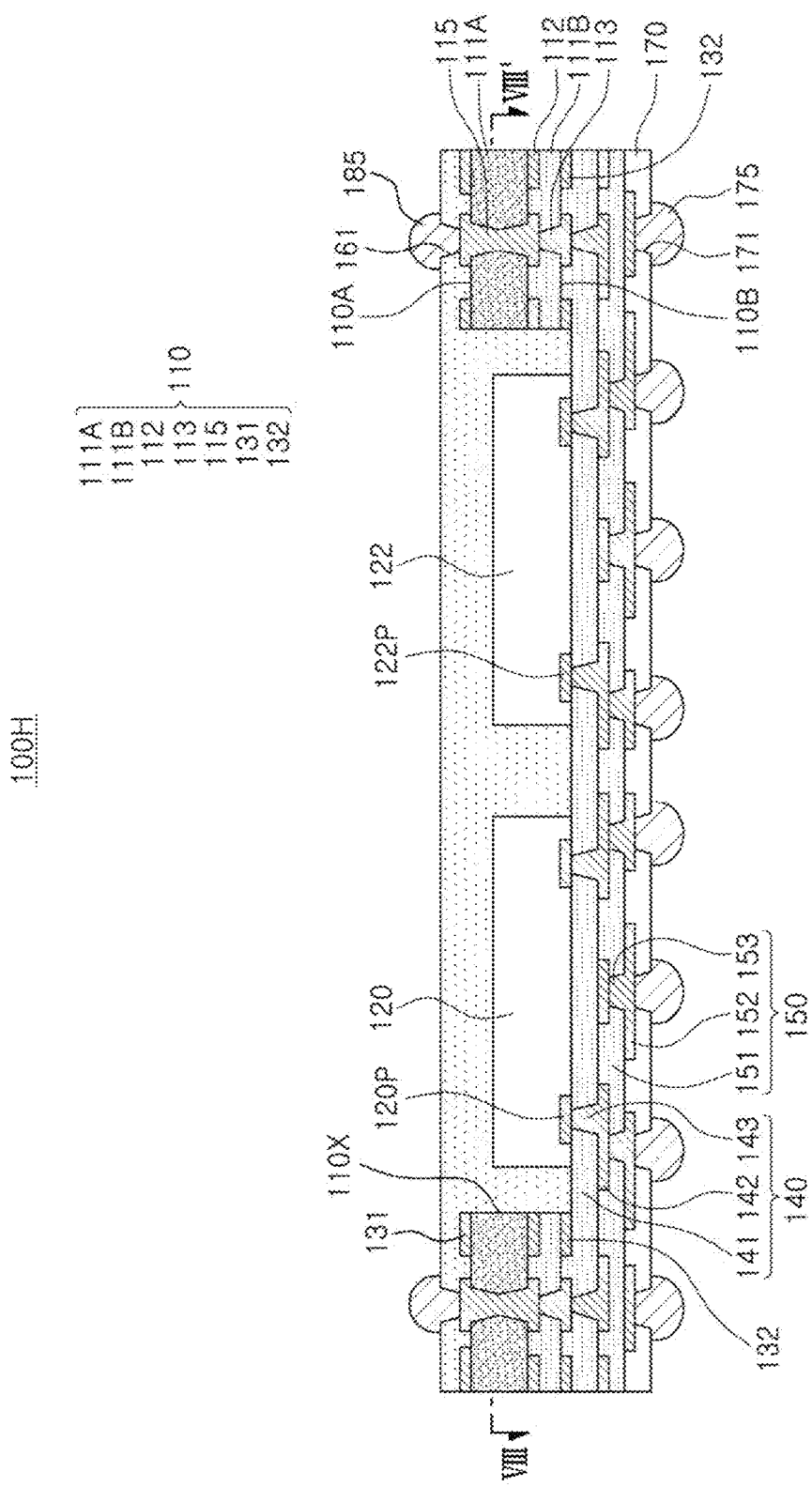
FIG. 23 is a cross-sectional view schematically illustrating another example of an electronic component package.

FIG. 23 is a cross-sectional view schematically illustrating another example of an electronic component package.

Figure 24:
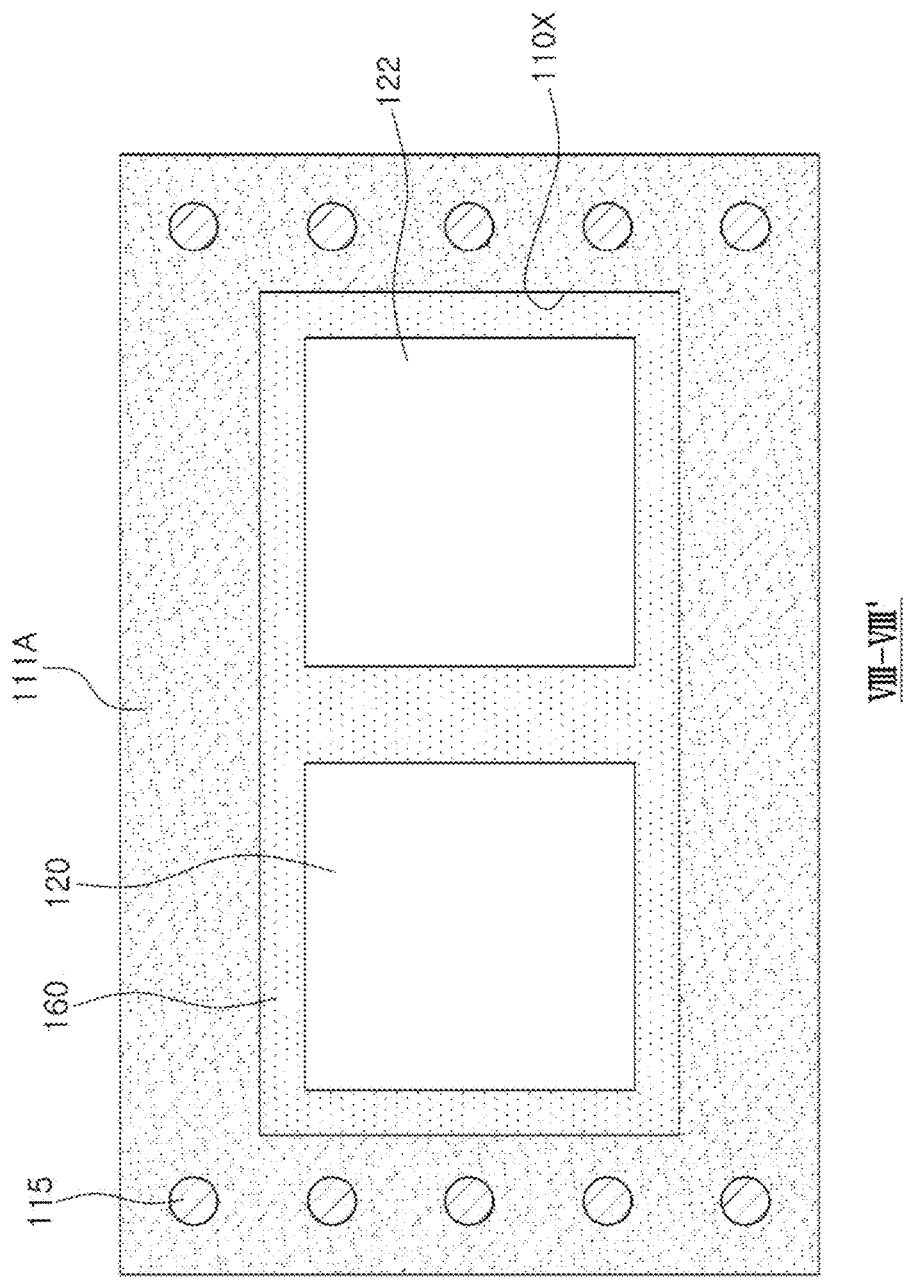
FIG. 24 is a schematic plan view of the electronic component package taken along line VIII-VIII' of FIG. 23.

FIG. 24 is a schematic plan view of the electronic component package taken along line VIII-VIII' of FIG. 23.

Referring to FIGS. 23 and 24, an electronic component package 100H according to another example may include a frame 110 having a through-hole 110X, a plurality of electronic components 120 and 122 disposed in the through-hole 110X of the frame 110, redistribution parts 140 and 150 disposed below the frame 110 and the plurality of electronic components 120 and 122, and an encapsulant 160 encapsulating the plurality of electronic components 120 and 122. The frame 110 may include a first insulating layer 111A, a second insulating layer 111B, a first wiring layer 112 disposed between the first and second insulating layers 111A and 111B, internal vias 115 penetrating through the first insulating layer 111A, vias 113 penetrating through the second insulating layer 111B, a third wiring layer 131 disposed on an upper surface 110A of the first insulating layer 111A, and a second wiring layer 132 disposed on a lower surface 110B of the second insulating layer 111B.

The through-hole 110X may sequentially penetrate through the third wiring layer 131, the first insulating layer 111A, the first wiring layer 112, the second insulating layer 111B, and the second wiring layer 132. At least one of the first wiring layer 112 and the second insulating layer 111B may be at a level between upper and lower surfaces of one of the plurality of electronic components 120 and 122. The upper surfaces of the plurality of electronic components 120 and 122 as shown in FIG. 23 are at a level below the upper surface 110A of the frame 110 with respect to the redistribution parts 140 and 150; the present disclosure, however, is not limited thereto. The upper surfaces of the plurality of electronic components 120 and 122 may be at the same level as or above the upper surface 110A of the frame 110 but below an upper surface of the third wiring layer 131, or at the same level as or above the upper surface of the third wiring layer 131, with respect to the redistribution parts 140 and 150, as long as the third wiring layer 131 and the plurality of electronic components 120 and 122 are all covered by the encapsulant 160. The upper surfaces of the plurality of electronic components 120 and 122 may be at different levels when thicknesses of the plurality of electronic components 120 and 122 are different.

Hereinafter, respective components included in the electronic component package 100H according to another example will be described in more detail, a description of contents overlapping the contents described above will be omitted, and contents different from the contents described above will be mainly described.

Also, in a case in which the plurality of electronic components 120 and 122 are disposed, the third and second wiring layers 131 and 132 disposed on the upper surface 110A and the lower surface 110B of the frame 110, respectively, and the internal vias 115 penetrating through the first insulating layer 111A may be applied. Likewise, the encapsulant 160 may have second opening parts 161 exposing at least portions of the third wiring layer 131 disposed on the upper surface 110A of the frame 110, and the electronic component package 100H may include second external connection terminals 185 externally exposed through an outer surface of the encapsulant 160. A metal layer 135 may be further disposed on an inner surface of the through-hole 110X, if necessary.

Since a method of manufacturing the electronic component package 100H according to another example is the same as the methods of manufacturing the electronic component packages 100B and 100E except that the plurality of electronic components 120 and 122 are disposed, a description thereof will be omitted.

Figure 25:
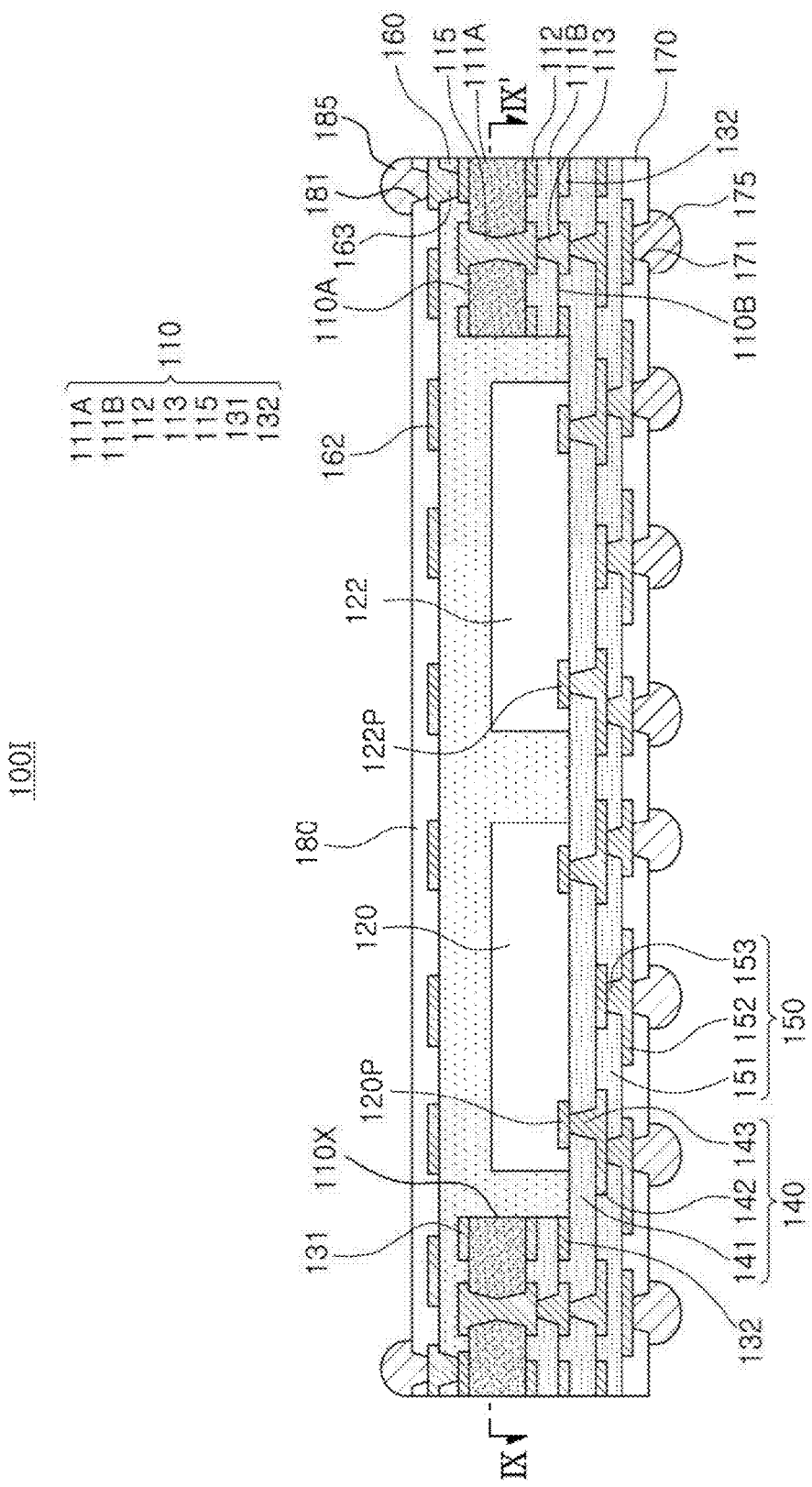
FIG. 25 is a cross-sectional view schematically illustrating another example of an electronic component package.

FIG. 25 is a cross-sectional view schematically illustrating another example of an electronic component package.

Figure 26:
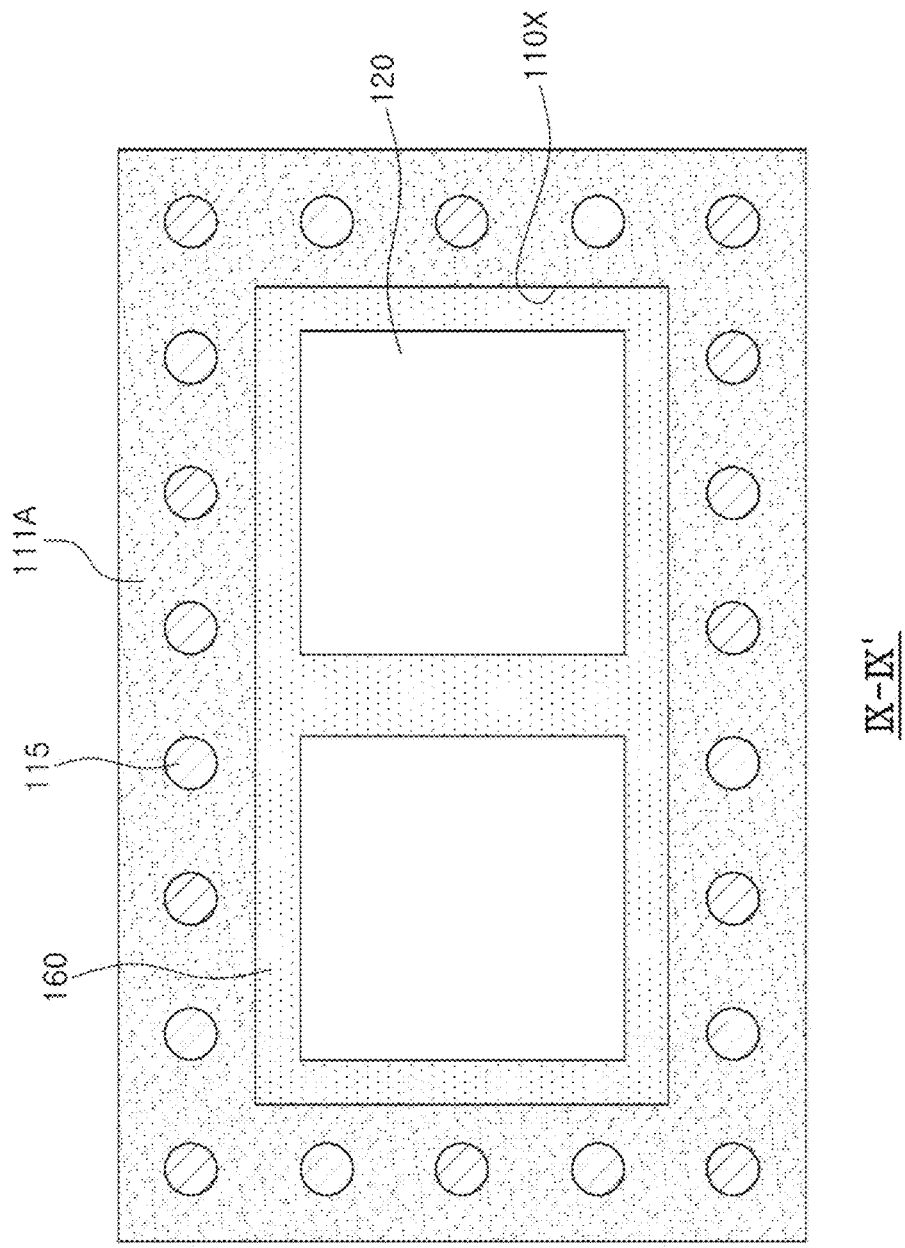
FIG. 26 is a schematic plan view of the electronic component package taken along line IX-IX' of FIG. 25.

FIG. 26 is a schematic plan view of the electronic component package taken along line IX-IX' of FIG. 25.

Referring to FIGS. 25 and 26, an electronic component package 100I according to another example may include a frame 110 having a through-hole 110X, a plurality of electronic components 120 and 122 disposed in the through-hole 110X of the frame 110, redistribution parts 140 and 150 disposed below the frame 110 and the plurality of electronic components 120 and 122, an encapsulant 160 encapsulating the plurality of electronic components 120 and 122, an outer wiring layer 162 disposed on the encapsulant 160, and outer vias 163 penetrating through the encapsulant 160. The frame 110 may include a first insulating layer 111A, a second insulating layer 111B, a first wiring layer 112 disposed between the first and second insulating layers 111A and 111B, internal vias 115 penetrating through the first insulating layer 111A, vias 113 penetrating through the second insulating layer 111B, a third wiring layer 131 disposed on an upper surface 110A of the first insulating layer 111A, and a second wiring layer 132 disposed on a lower surface 110B of the second insulating layer 111B.

The through-hole 110X may sequentially penetrate through the third wiring layer 131, the first insulating layer 111A, the first wiring layer 112, the second insulating layer 111B, and the second wiring layer 132. At least one of the first wiring layer 112 and the second insulating layer 111B may be at a level between upper and lower surfaces of one of the plurality of electronic components 120 and 122. The upper surfaces of the plurality of electronic components 120 and 122 as shown in FIG. 25 are at a level below the upper surface 110A of the frame 110 with respect to the redistribution parts 140 and 150; the present disclosure, however, is not limited thereto. The upper surfaces of the plurality of electronic components 120 and 122 may be at the same level as or above the upper surface 110A of the frame 110 but below an upper surface of the third wiring layer 131, or at the same level as or above the upper surface of the third wiring layer 131, with respect to the redistribution parts 140 and 150, as long as the third wiring layer 131 and the plurality of electronic components 120 and 122 are all covered by the encapsulant 160. The upper surfaces of the plurality of electronic components 120 and 122 may be at different levels when thicknesses of the plurality of electronic components 120 and 122 are different.

Hereinafter, respective components included in the electronic component package 100I according to another example will be described in more detail, a description of contents overlapping the contents described above will be omitted, and contents different from the contents described above will be mainly described.

Also, in a case in which the plurality of electronic components 120 and 122 are disposed, the outer wiring layers 162 disposed on the encapsulant 160 and the outer vias 163 penetrating through the encapsulant 160 may be applied. Likewise, the electronic component package 100I may further include a cover layer 180 connected to the encapsulant 160. The cover layer 180 may have third opening parts 181 exposing at least portions of the outer wiring layer 162 disposed on the encapsulant 160. In addition, the electronic component package 100I may further include second external connection terminals 185 externally exposed through an upper surface of the cover layer 180. A metal layer 135 may be further disposed on an inner surface of the through-hole 110X, if necessary.

Since a method of manufacturing the electronic component package 100I according to another example is the same as the methods of manufacturing the electronic component packages 100C and 100F except that the plurality of electronic components 120 and 122 are disposed, a description thereof will be omitted.

Figure 27:
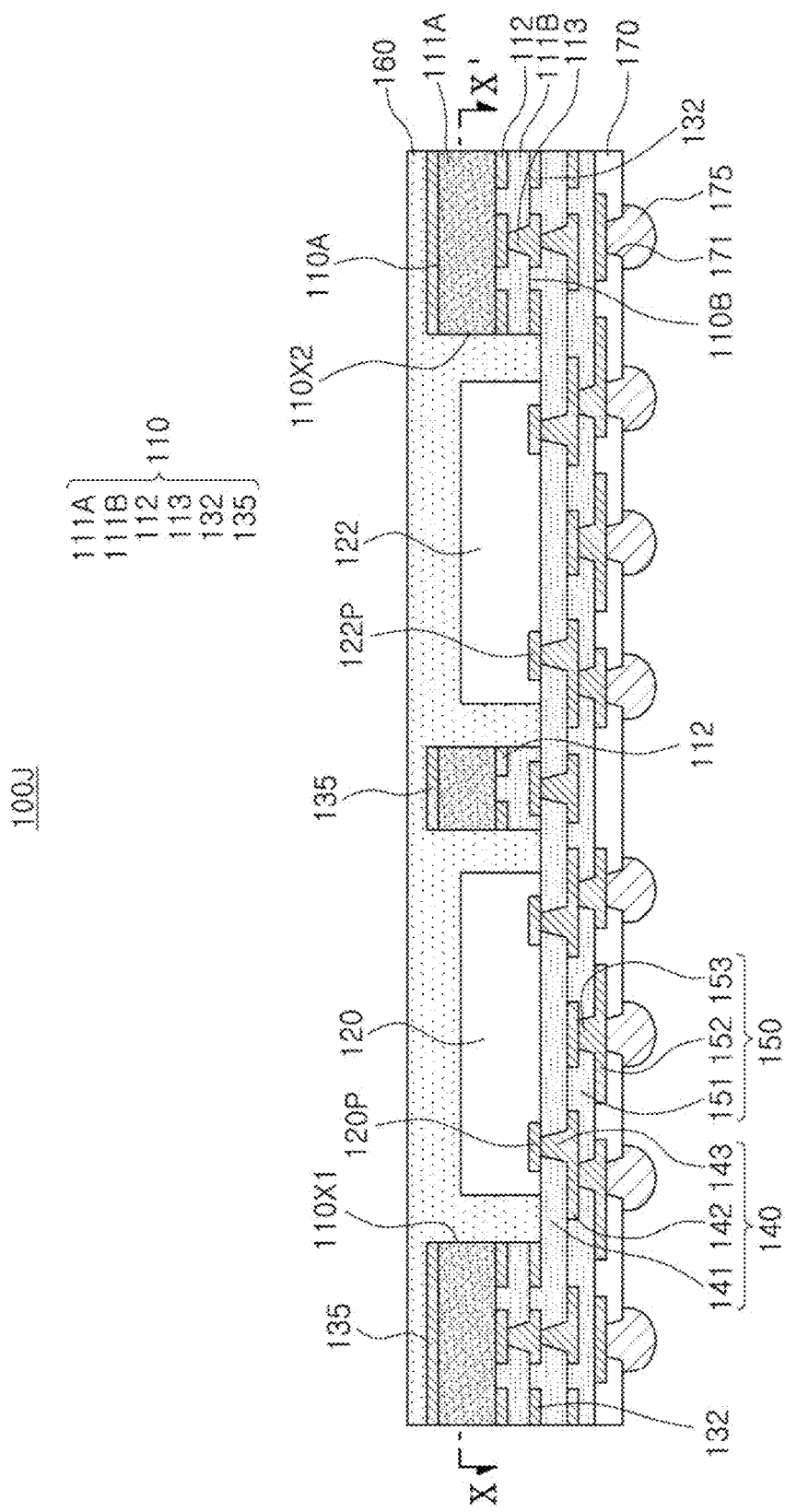
FIG. 27 is a cross-sectional view schematically illustrating another example of an electronic component package.

FIG. 27 is a cross-sectional view schematically illustrating another example of an electronic component package.

Figure 28:
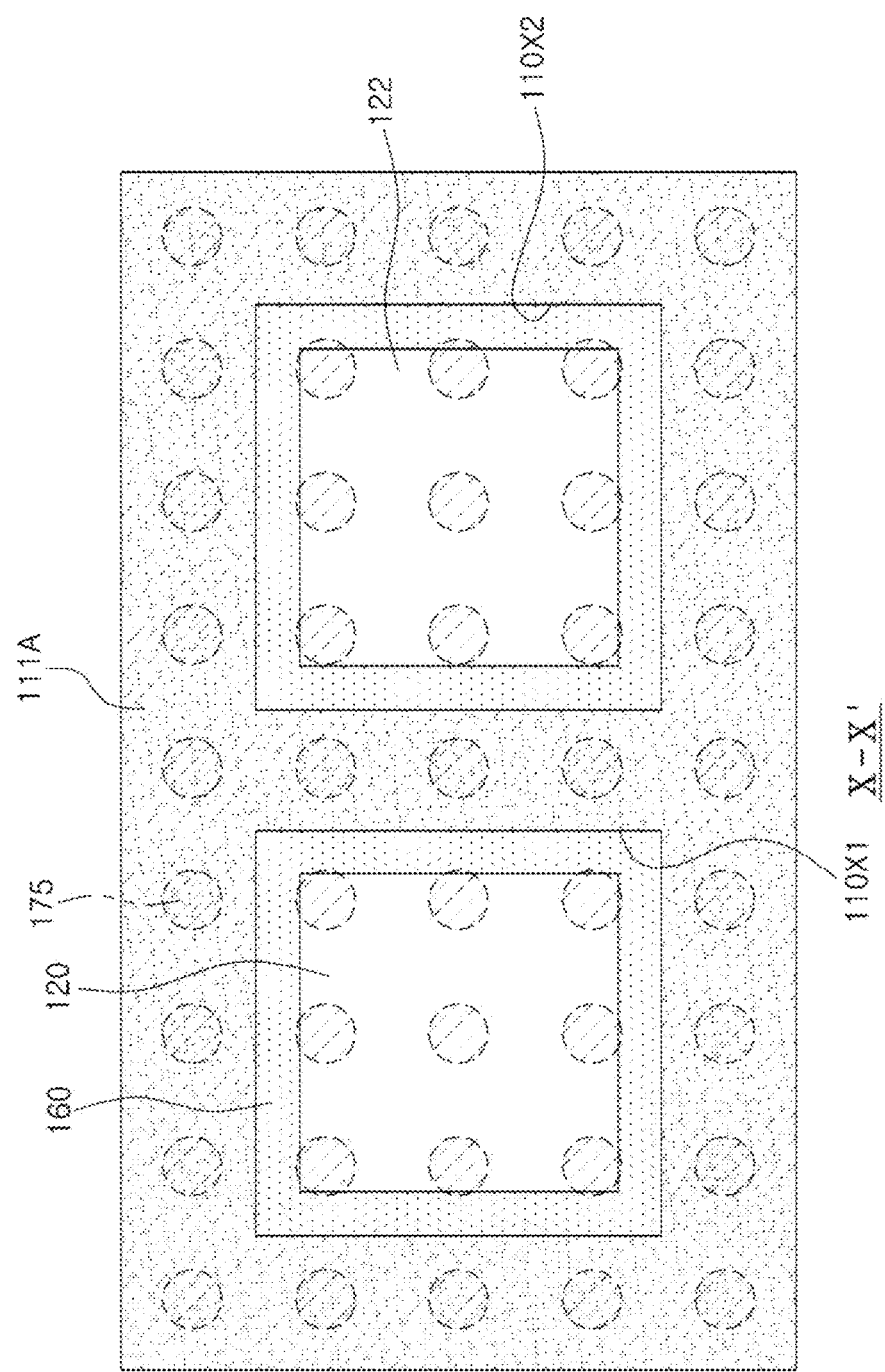
FIG. 28 is a schematic plan view of the electronic component package taken along line X-X' of FIG. 27.

FIG. 28 is a schematic plan view of the electronic component package taken along line X-X' of FIG. 27.

Referring to FIGS. 27 and 28, an electronic component package 100J according to another example may include a frame 110 having a plurality of through-holes 110X1 and 110X2; a plurality of electronic components 120 and 122 each disposed in the plurality of through-holes 110X1 and 110X2 of the frame 110; redistribution parts 140 and 150 disposed below the frame 110 and the plurality of electronic components 120 and 122; and an encapsulant 160 encapsulating the plurality of electronic components 120 and 122. The frame 110 may include a first insulating layer 111A, a second insulating layer 111B, a first wiring layer 112 disposed between the first and second insulating layers 111A and 111B, a metal layer 135 disposed on an upper surface of the first insulating layer 111A, a second wiring layer 132 disposed on a lower surface of the second insulating layer 111B, and vias 113 penetrating through the second insulating layer 111B.

Each of the plurality of through-holes 110X1 and 110X2 may sequentially penetrate through the metal layer 135, the first insulating layer 111A, the first wiring layer 112, the second insulating layer 111B, and the second wiring layer 132. At least one of the first wiring layer 112 and the second insulating layer 111B may be at a level between upper and lower surfaces of one of the plurality of electronic components 120 and 122. The upper surfaces of the plurality of electronic components 120 and 122 as shown in FIG. 27 are at a level below the upper surface 110A of the frame 110 with respect to the redistribution parts 140 and 150; the present disclosure, however, is not limited thereto. The upper surfaces of the plurality of electronic components 120 and 122 may be at the same level as or above the upper surface 110A of the frame 110 but below an upper surface of the metal layer 135, or at the same level as or above the upper surface of the metal layer 135, with respect to the redistribution parts 140 and 150, as long as the metal layer 135 and the plurality of electronic components 120 and 122 are all covered by the encapsulant 160. The upper surfaces of the plurality of electronic components 120 and 122 may be at different levels when thicknesses of the plurality of electronic components 120 and 122 are different.

Hereinafter, respective components included in the electronic component package 100J according to another example will be described in more detail, a description of contents overlapping the contents described above will be omitted, and contents different from the contents described above will be mainly described.

Areas, shapes, or the like, of the plurality of through-holes 110X1 and 110X2 may be the same as or different from each other, and the electronic components 120 and 122 each disposed in the through-holes 110X1 and 110X2 may also be the same as or different from each other. The numbers, intervals, disposition forms, and the like, of through-holes 110X1 and 110X2 and electronic components 120 and 122 each disposed in the through-holes 110X1 and 110X2 are not particularly limited, and may be sufficiently modified depending on design particulars by those skilled in the art. For example, the number of through-holes 110X1 and 110X2 may be two as illustrated in FIGS. 27 and 28. However, the number of through-holes 110X1 and 110X2 is not limited thereto, and may be two or more, such as three, four, or the like. In addition, the number of electronic components 120 and 122 each disposed in the through-holes 110X1 and 110X2 may be one as illustrated in FIGS. 27 and 28. However, the number of electronic components 120 and 122 each disposed in the through-holes 110X1 and 110X2 is not limited thereto, and may be one or more, such as two, three, or the like. A metal layer 135 may be further disposed on inner surfaces of the plurality of through-holes 110X1 and 110X2, if necessary.

Since a method of manufacturing the electronic component package 100J according to another example is the same as the methods of manufacturing the electronic component packages 100A and 100D except that the plurality of through-holes 110X1 and 110X2 are formed and the plurality of electronic components 120 and 122 are disposed in the plurality of through-holes 110X1 and 110X2, respectively, a description thereof will be omitted.

Figure 29:
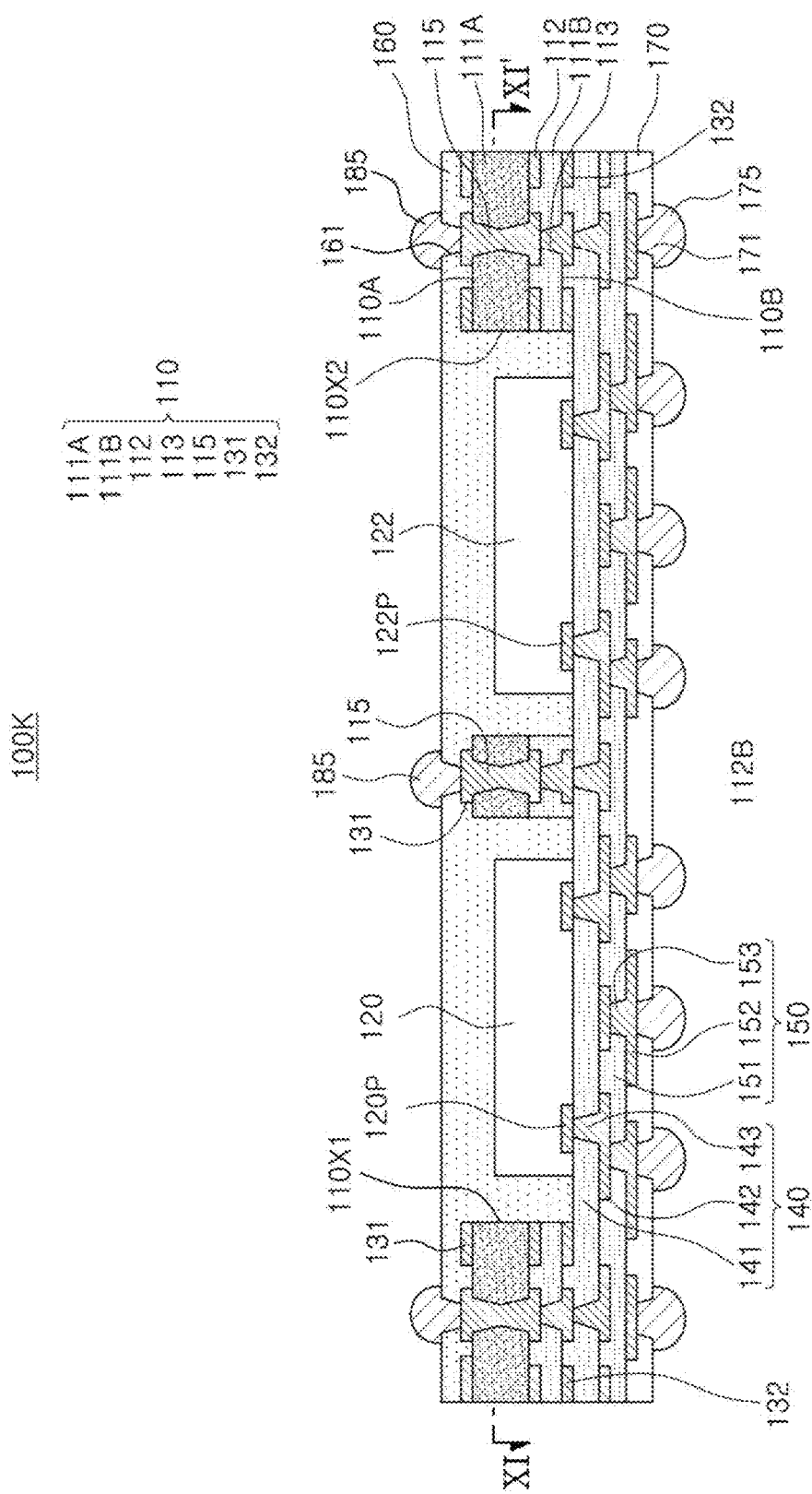
FIG. 29 is a cross-sectional view schematically illustrating another example of an electronic component package.

FIG. 29 is a cross-sectional view schematically illustrating another example of an electronic component package.

Figure 30:
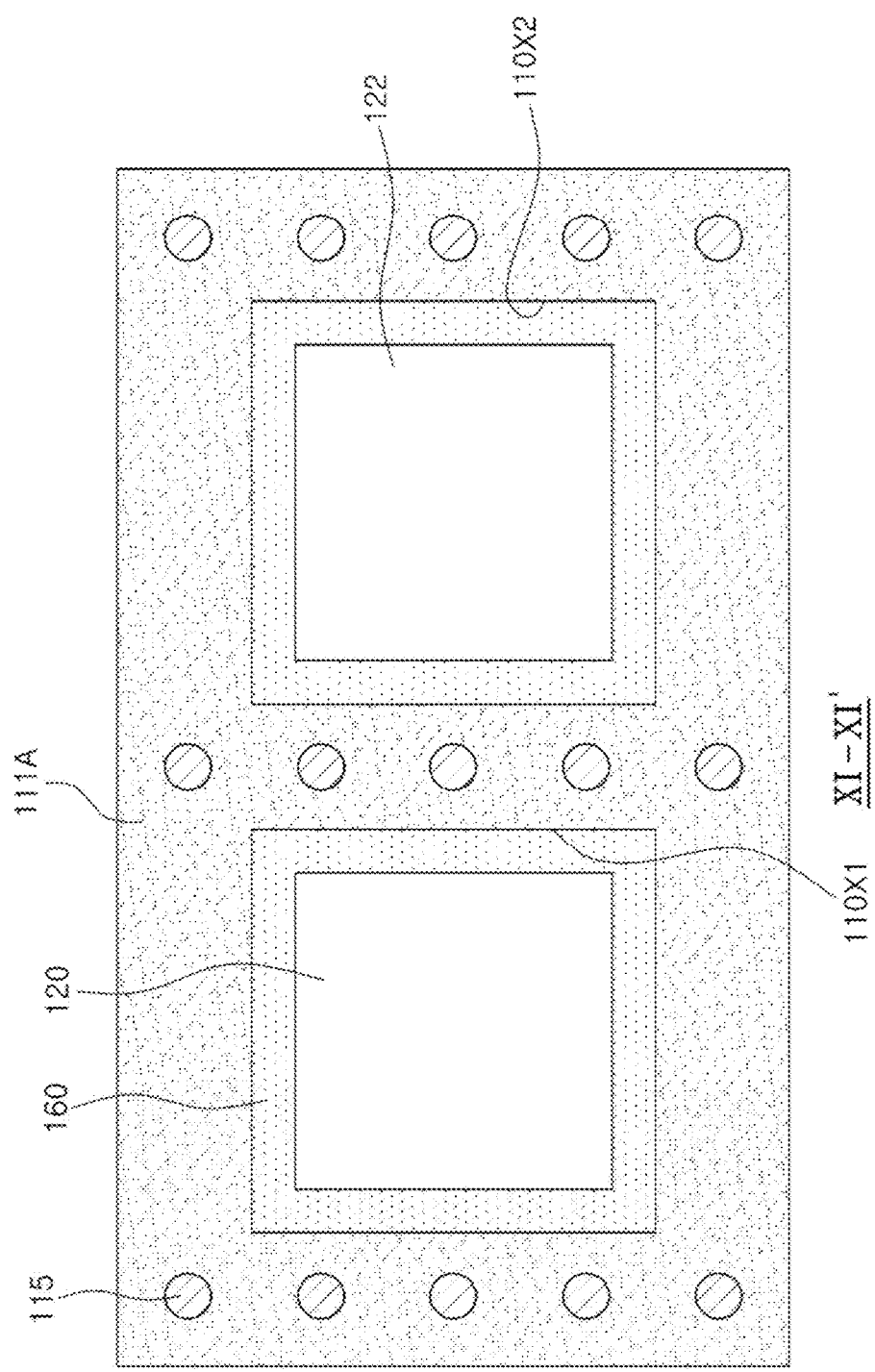
FIG. 30 is a schematic plan view of the electronic component package taken along line XI-XI' of FIG. 29.

FIG. 30 is a schematic plan view of the electronic component package taken along line XI-XI' of FIG. 29.

Referring to FIGS. 29 and 30, an electronic component package 100K according to another example may include a frame 110 having a plurality of through-holes 110X1 and 110X2, a plurality of electronic components 120 and 122 each disposed in the plurality of through-holes 110X1 and 110X2 of the frame 110, redistribution parts 140 and 150 disposed below the frame 110 and the plurality of electronic components 120 and 122, and an encapsulant 160 encapsulating the plurality of electronic components 120 and 122. The frame 110 may include a first insulating layer 111A, a second insulating layer 111B, a first wiring layer 112 disposed between the first and second insulating layers 111A and 111B, internal vias 115 penetrating through the first insulating layer 111A, vias 113 penetrating through the second insulating layer 111B, a third wiring layer 131 disposed on an upper surface 110A of the first insulating layer 111A, and a second wiring layer 132 disposed on a lower surface 110B of the second insulating layer 111B.

Each of the plurality of through-holes 110X1 and 110X2 may sequentially penetrate through the third wiring layer 131, the first insulating layer 111A, the first wiring layer 112, the second insulating layer 111B, and the second wiring layer 132. At least one of the first wiring layer 112 and the second insulating layer 111B may be at a level between upper and lower surfaces of one of the plurality of electronic components 120 and 122. The upper surfaces of the plurality of electronic components 120 and 122 as shown in FIG. 29 are at a level below the upper surface 110A of the frame 110 with respect to the redistribution parts 140 and 150; the present disclosure, however, is not limited thereto. The upper surfaces of the plurality of electronic components 120 and 122 may be at the same level as or above the upper surface 110A of the frame 110 but below an upper surface of the third wiring layer 131, or at the same level as or above the upper surface of the third wiring layer 131, with respect to the redistribution parts 140 and 150, as long as the third wiring layer 131 and the plurality of electronic components 120 and 122 are all covered by the encapsulant 160. The upper surfaces of the plurality of electronic components 120 and 122 may be at different levels when thicknesses of the plurality of electronic components 120 and 122 are different.

Hereinafter, respective components included in the electronic component package 100K according to another example will be described in more detail, a description of contents overlapping the contents described above will be omitted, and contents different from the contents described above will be mainly described.

Also, in a case in which the plurality of through-holes 110X1 and 110X2 are formed and the electronic components 120 and 122 are disposed in the plurality of through-holes 110X1 and 110X2, respectively, the third and second wiring layers 131 and 132 disposed on the upper surface 110A and the lower surface 110B of the frame 110, respectively, and the internal vias 115 penetrating through the first insulating layer 111A may be applied. The third and second wiring layers 131 and 132 and the internal via 115 may also be formed in a central portion of the first insulating layer 111A of the frame 110 dividing the plurality of through-holes 110X1 and 110X2. Likewise, the encapsulant 160 may have second opening parts 161 exposing at least portions of the third wiring layer 131 disposed on the upper surface 110A of the frame 110, and the electronic component package 100K may include second external connection terminals 185 externally exposed through an outer surface of the encapsulant 160. The second opening part 161 and the second external connection terminal 185 may also be formed in the central portion of the first insulating layer 111A of the frame 110 dividing the plurality of through-holes 110X1 and 110X2. A metal layer 135 may be further disposed on inner surfaces of the plurality of through-holes 110X1 and 110X2, if necessary.

Since a method of manufacturing the electronic component package 100K according to another example is the same as the methods of manufacturing the electronic component packages 100B and 100E except that the plurality of through-holes 110X1 and 110X2 are formed and the plurality of electronic components 120 and 122 are disposed in the plurality of through-holes 110X1 and 110X2, respectively, a description thereof will be omitted.

Figure 31:
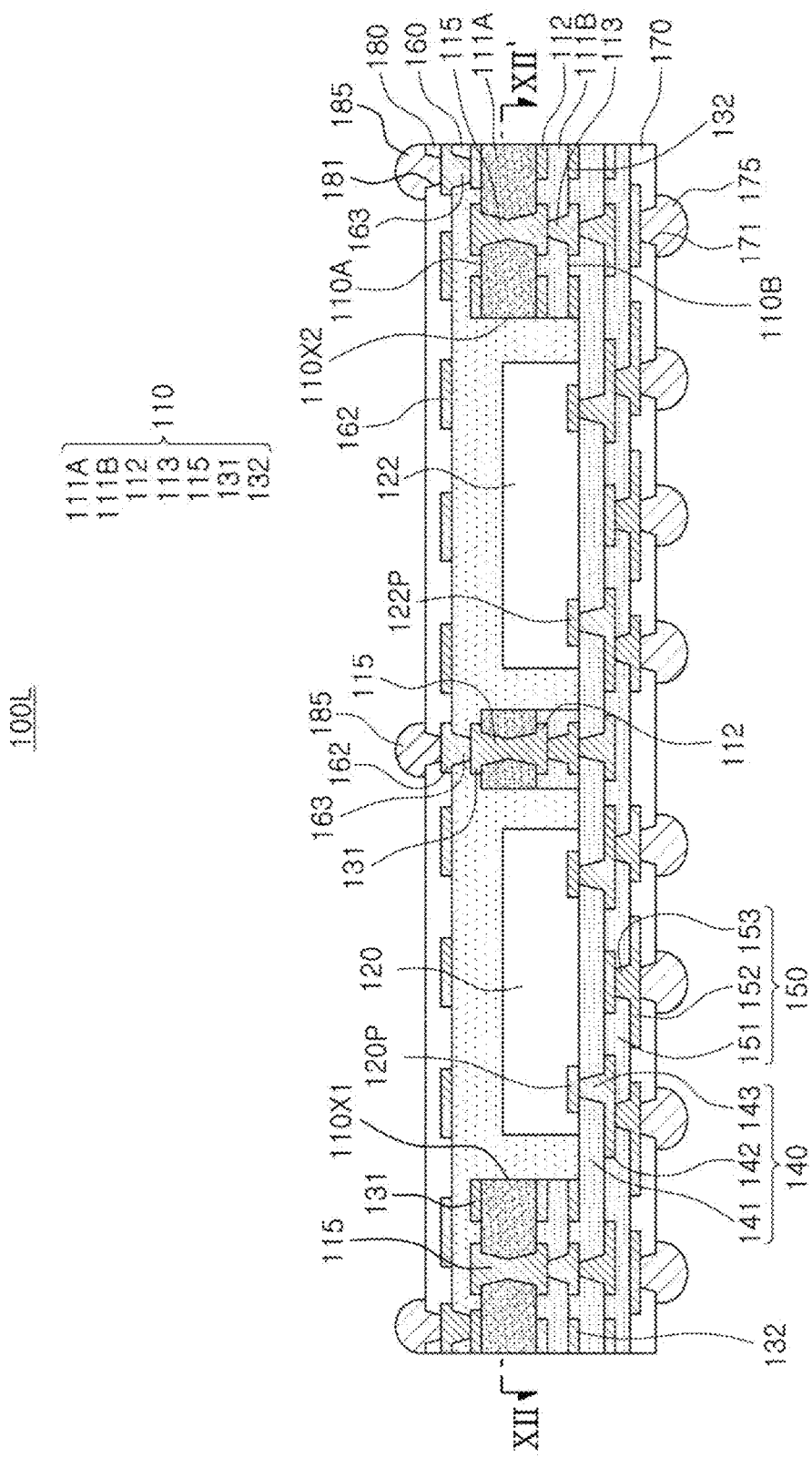
FIG. 31 is a cross-sectional view schematically illustrating another example of an electronic component package.

FIG. 31 is a cross-sectional view schematically illustrating another example of an electronic component package.

Figure 32:
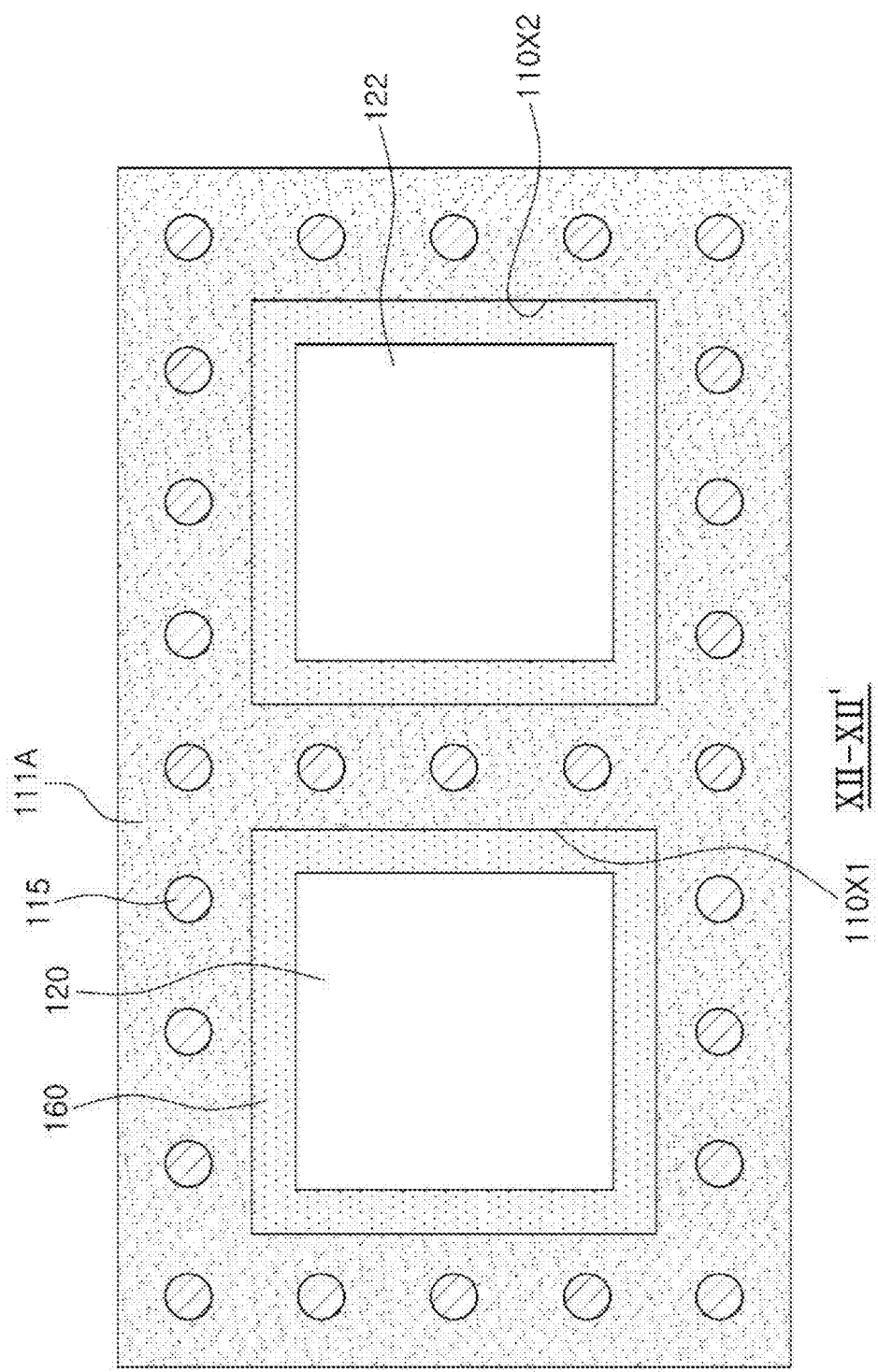
FIG. 32 is a schematic plan view of the electronic component package taken along line XII-XII' of FIG. 31.

FIG. 32 is a schematic plan view of the electronic component package taken along line XII-XII' of FIG. 31.

Referring to FIGS. 31 and 32, an electronic component package 100L according to another example may include a frame 110 having a plurality of through-holes 110X1 and 110X2, a plurality of electronic components 120 and 122 each disposed in the plurality of through-holes 110X1 and 110X2 of the frame 110, redistribution parts 140 and 150 disposed below the frame 110 and the plurality of electronic components 120 and 122, an encapsulant 160 encapsulating the plurality of electronic components 120 and 122, an outer wiring layer 162 disposed on the encapsulant 160, and outer vias 163 penetrating through the encapsulant 160. The frame 110 may include a first insulating layer 111A, a second insulating layer 111B, a first wiring layer 112 disposed between the first and second insulating layers 111A and 111B, internal vias 115 penetrating through the first insulating layer 111A, vias 113 penetrating through the second insulating layer 111B, a third wiring layer 131 disposed on an upper surface 110A of the first insulating layer 111A, and a second wiring layer 132 disposed on a lower surface 110B of the second insulating layer 111B.

Each of the plurality of through-hole 110X1 and 110X2 may sequentially penetrate through the third wiring layer 131, the first insulating layer 111A, the first wiring layer 112, the second insulating layer 111B, and the second wiring layer 132. At least one of the first wiring layer 112 and the second insulating layer 111B may be at a level between upper and lower surfaces of one of the plurality of electronic components 120 and 122. The upper surfaces of the plurality of electronic components 120 and 122 as shown in FIG. 31 are at a level below the upper surface 110A of the frame 110 with respect to the redistribution parts 140 and 150; the present disclosure, however, is not limited thereto. The upper surfaces of the plurality of electronic components 120 and 122 may be at the same level as or above the upper surface 110A of the frame 110 but below an upper surface of the third wiring layer 131, or at the same level as or above the upper surface of the third wiring layer 131, with respect to the redistribution parts 140 and 150, as long as the third wiring layer 131 and the plurality of electronic components 120 and 122 are all covered by the encapsulant 160. The upper surfaces of the plurality of electronic components 120 and 122 may be at different levels when thicknesses of the plurality of electronic components 120 and 122 are different.

Hereinafter, respective components included in the electronic component package 100L according to another example will be described in more detail, a description of contents overlapping the contents described above will be omitted, and contents different from the contents described above will be mainly described.

Also, in a case in which the plurality of through-holes 110X1 and 110X2 are formed and the plurality of electronic components 120 and 122 are disposed in the plurality of through-holes 110X1 and 110X2, respectively, the outer wiring layer 162 disposed on the encapsulant 160 and the outer vias 163 penetrating through the encapsulant 160 may be applied. The outer wiring layer 162 and the outer vias 163 may also be formed in a central portion of the first insulating layer 111A of the frame 110 dividing the plurality of through-holes 110X1 and 110X2. Likewise, the electronic component package 100L may further include a cover layer 180 connected to the encapsulant 160. The cover layer 180 may have third opening parts 181 exposing at least portions of the outer wiring layer 162 disposed on the encapsulant 160. In addition, the electronic component package 100L may further include second external connection terminals 185 externally exposed through an upper surface of the cover layer 180. The third opening part 181 and the second external connection terminal 185 may also be formed in the central portion of the first insulating layer 111A of the frame 110 dividing the plurality of through-holes 110X1 and 110X2. A metal layer 135 may be further disposed on inner surfaces of the plurality of through-holes 110X1 and 110X2, if necessary.

Since a method of manufacturing the electronic component package 100L according to another example is the same as the methods of manufacturing the electronic component packages 100C and 100F except that the plurality of through-holes 110X1 and 110X2 are formed and the plurality of electronic components 120 and 122 are disposed in the plurality of through-holes 110X1 and 110X2, respectively, a description thereof will be omitted.

Figure 33:
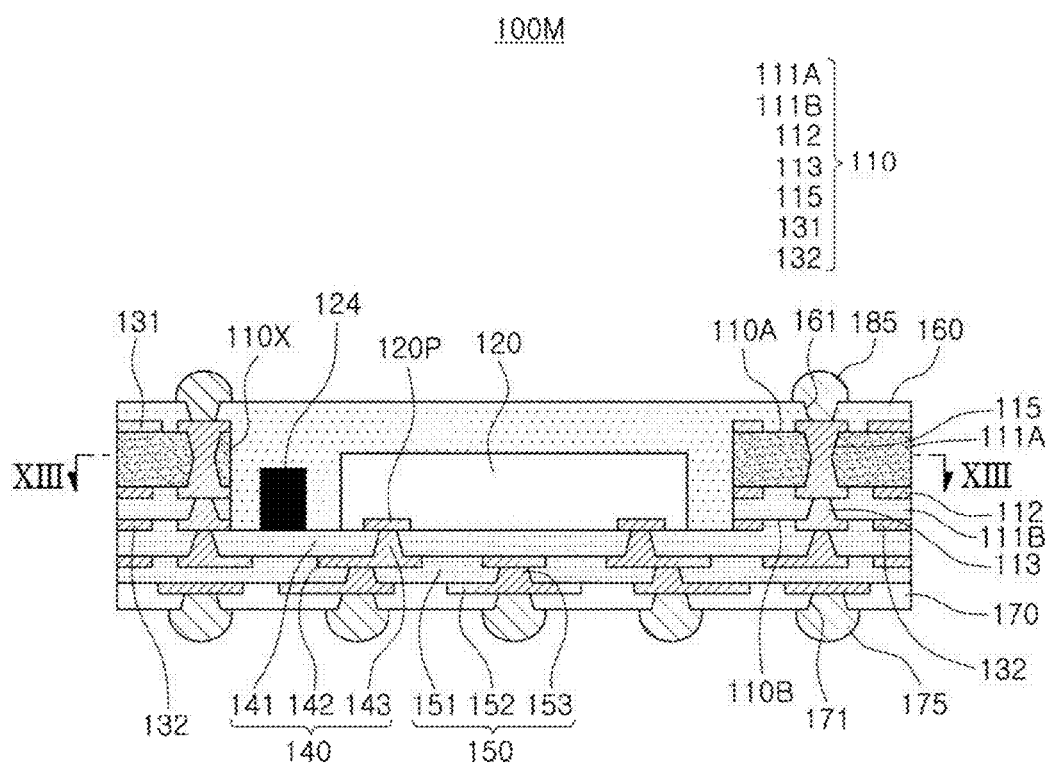
FIG. 33 is a cross-sectional view schematically illustrating another example of an electronic component package.

FIG. 33 is a cross-sectional view schematically illustrating another example of an electronic component package.

Figure 34:
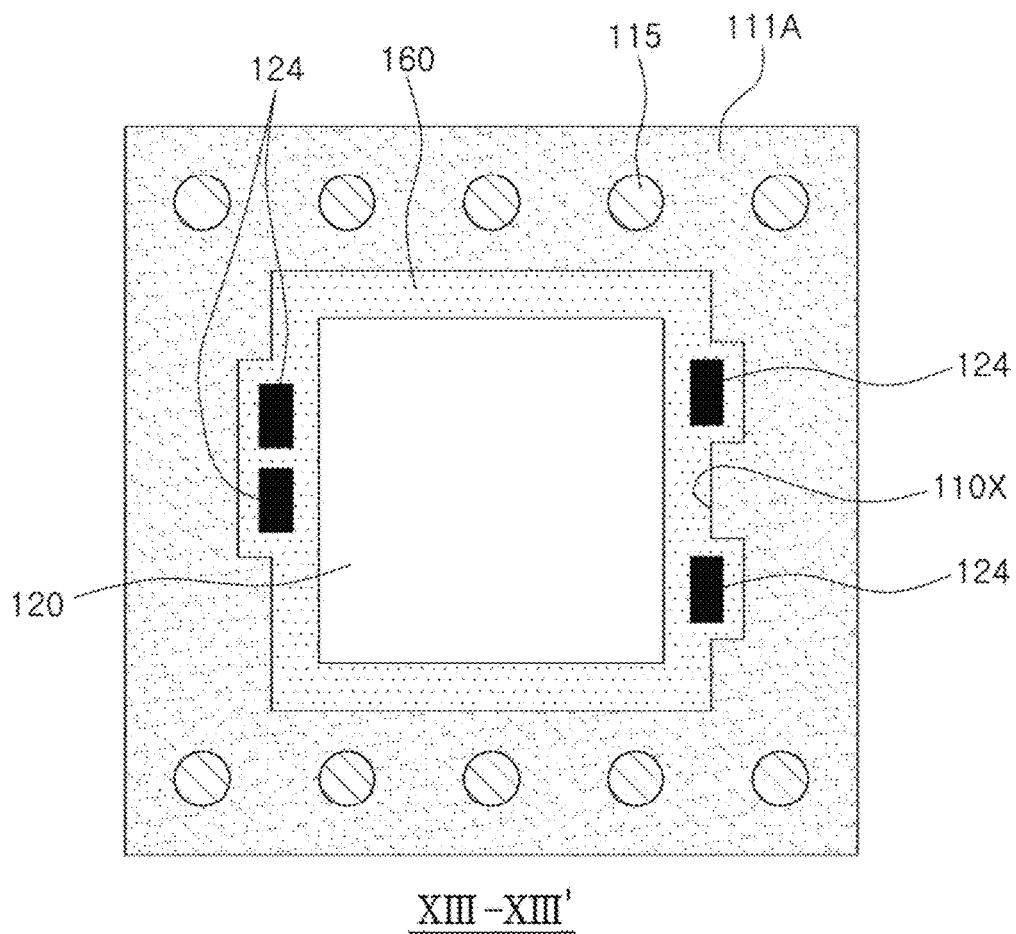
FIG. 34 is a schematic plan view of the electronic component package taken along line XIII-XIII' of FIG. 33.

FIG. 34 is a schematic plan view of the electronic component package taken along line XIII-XIII' of FIG. 33.

Referring to FIGS. 33 and 34, an electronic component package 100M according to another example may include a frame 110 having a through-hole 110X, a plurality of electronic components 120 and 124 disposed in the through-hole 110X of the frame 110, redistribution parts 140 and 150 disposed below the frame 110 and the plurality of electronic components 120 and 124, and an encapsulant 160 encapsulating the plurality of electronic components 120 and 124. At least one of the plurality of electronic components 120 and 124 may be an integrated circuit 120, and the other thereof may be a passive component 124. The frame 110 may include a first insulating layer 111A, a second insulating layer 111B, a first wiring layer 112 disposed between the first and second insulating layers 111A and 111B, internal vias 115 penetrating through the first insulating layer 111A, vias 113 penetrating through the second insulating layer 111B, a third wiring layer 131 disposed on an upper surface 110A of the first insulating layer 111A, and a second wiring layer 132 disposed on a lower surface 110B of the second insulating layer 111B.

The through-hole 110X may sequentially penetrate through the third wiring layer 131, the first insulating layer 111A, the first wiring layer 112, the second insulating layer 111B, and the second wiring layer 132. At least one of the first wiring layer 112 and the second insulating layer 111B may be at a level between upper and lower surfaces of one of the plurality of electronic components 120 and 124. The upper surfaces of the plurality of electronic components 120 and 124 as shown in FIG. 33 are at a level below the upper surface 110A of the frame 110 with respect to the redistribution parts 140 and 150; the present disclosure, however, is not limited thereto. The upper surfaces of the plurality of electronic components 120 and 124 may be at the same level as or above the upper surface 110A of the frame 110 but below an upper surface of the third wiring layer 131, or at the same level as or above the upper surface of the third wiring layer 131, with respect to the redistribution parts 140 and 150, as long as the third wiring layer 131 and the plurality of electronic components 120 and 124 are all covered by the encapsulant 160. The upper surfaces of the plurality of electronic components 120 and 124 may be at different levels when thicknesses of the plurality of electronic components 120 and 124 are different.

Hereinafter, respective components included in the electronic component package 100M according to another example will be described in more detail, a description of contents overlapping the contents described above will be omitted, and contents different from the contents described above will be mainly described.

The integrated circuit 120 indicates a chip in which hundreds to millions or more of elements are integrated, and may be, for example, an application processor chip such as a central processor (for example, a CPU), a graphics processor (for example, a GPU), a digital signal processor, a cryptographic processor, a micro processor, a micro controller, or the like, but is not limited thereto. The passive component 124 may be, for example, an inductor, a condenser, a resistor, or the like, but is not limited thereto. The integrated circuit 120 may be electrically connected to the frame 110, the redistribution parts 140 and 150, and the like, through electrode pads 120P. The passive component 124 may be electrically connected to the frame 110, the redistribution parts 140 and 150, and the like, through electrode pads (not illustrated), such as external electrodes.

The numbers, intervals, disposition forms, and the like, of integrated circuits 120 and passive components 124 are not particularly limited, and may be sufficiently modified depending on design particulars by those skilled in the art. For example, the integrated circuit 120 and the passive component 124 may be disposed in the vicinity of the center of the through-hole 110X and in the vicinity of an inner wall of the through-hole 110X, but are not limited thereto. In addition, the number of integrated circuits 120 may be one and the number of passive components 124 may be plural. However, the numbers of integrated circuits 120 and passive components 124 are not limited thereto. For example, the number of integrated circuits 120 may be plural and the number of passive components 124 may be one, the numbers of both of integrated circuits 120 and passive components 124 may be one, or the numbers of both the integrated circuits 120 and passive components 124 may be plural. A metal layer 135, a passivation layer 170, a cover layer 180, opening parts 161, 171, and 181, external connection terminals 175 and 185, an outer wiring layer 162, outer vias 163, and the like, may be applied, if necessary.

Since a method of manufacturing the electronic component package 100M according to another example is the same as the methods of manufacturing the electronic component packages 100A to 100F except that the integrated circuit 120 and the passive component 124 are disposed together with each other, a description thereof will be omitted.

Figure 35:
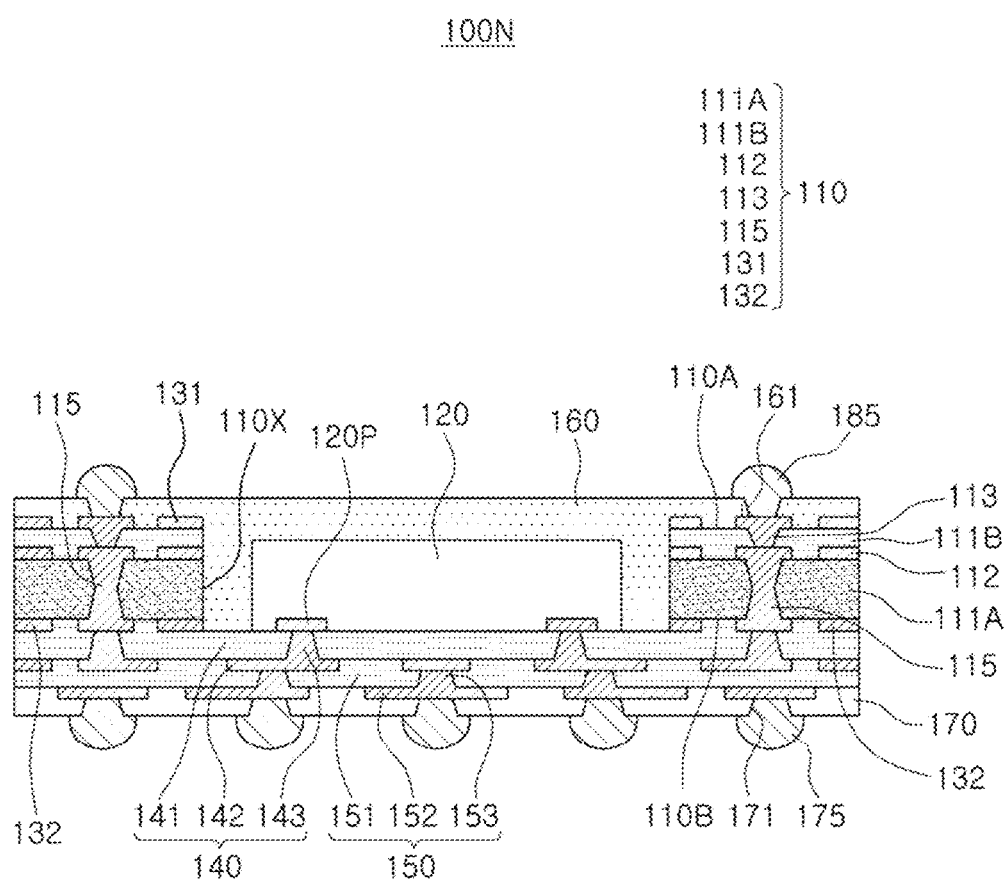
FIG. 35 is a cross-sectional view schematically illustrating another example of an electronic component package.

FIG. 35 is a cross-sectional view schematically illustrating another example of an electronic component package.

Referring to FIG. 35, an electronic component package 100N according to another example may include a frame 110 having a through-hole 110X, an electronic component 120 disposed in the through-hole 110X of the frame 110, redistribution parts 140 and 150 disposed below the frame 110 and the electronic component 120, and an encapsulant 160 encapsulating the electronic component 120. The frame 110 may include a first insulating layer 111A, a second insulating layer 111B, a first wiring layer 112 disposed between the first and second insulating layers 111A and 111B, internal vias 115 penetrating through the first insulating layer 111A, and vias 113 penetrating through the second insulating layer 111B. The second insulating layer 111B may be disposed above the first insulating layer 111A. The frame 110 may include a third wiring layer 131 disposed on an upper surface 110A of the second insulating layer 111B, and a second wiring layer 132 disposed on a lower surface 110B of the frame 110.

The through-hole 110X may sequentially penetrate through the third wiring layer 131, the second insulating layer 111B, the first wiring layer 112, the first insulating layer 111A, and the second wiring layer 132. At least one of the first wiring layer 112 and the first insulating layer 111A may be at a level between upper and lower surfaces of the electronic component 120. The upper surface of the electronic component 120 as shown in FIG. 35 is at a level below the upper surface 110A of the frame 110 with respect to the redistribution parts 140 and 150; the present disclosure, however, is not limited thereto. The upper surface of the electronic component 120 may be at the same level as or above the upper surface 110A of the frame 110 but below an upper surface of the third wiring layer 131, or at the same level as or above the upper surface of the third wiring layer 131, with respect to the redistribution parts 140 and 150, as long as the third wiring layer 131 and the electronic component 120 are both covered by the encapsulant 160.

Hereinafter, respective components included in the electronic component package 100N according to another example will be described in more detail, a description of contents overlapping the contents described above will be omitted, and contents different from the contents described above will be mainly described.

The electronic component package 100N according to another example is similar to the electronic component packages 100A to 100M described above except that the second insulating layer 111B is disposed above the first insulating layer 111A. For example, a metal layer 135, a passivation layer 170, a cover layer 180, opening parts 161, 171, and 181, external connection terminals 175 and 185, an outer wiring layer 162, outer vias 163, and the like, may also be applied, if necessary.

Since a method of manufacturing the electronic component package 100N according to another example is the same as the methods of manufacturing the electronic component packages 100A to 100F except that the second insulating layer 111B is disposed above the first insulating layer 111A, a description thereof will be omitted.

Figure 36:
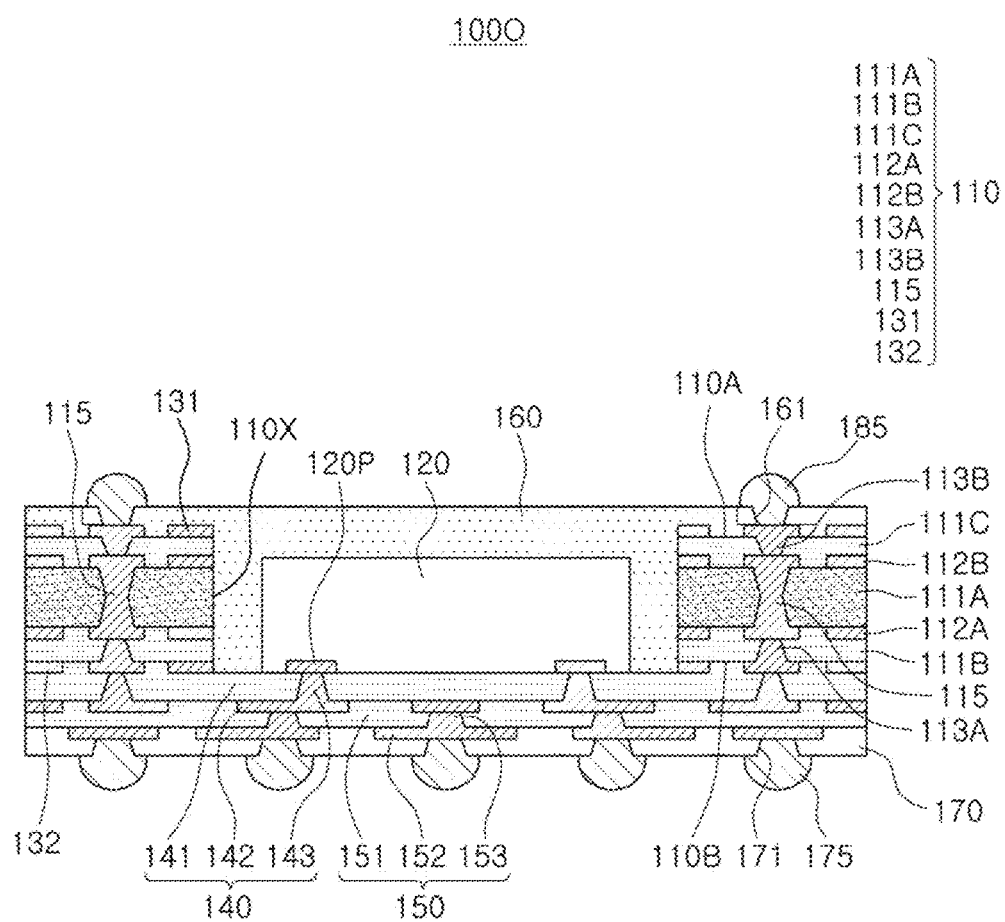
FIG. 36 is a cross-sectional view schematically illustrating another example of an electronic component package.

FIG. 36 is a cross-sectional view schematically illustrating another example of an electronic component package.

Referring to FIG. 36, an electronic component package 100O according to another example may include a frame 110 having a through-hole 110X, an electronic component 120 disposed in the through-hole 110X of the frame 110, redistribution parts 140 and 150 disposed below the frame 110 and the electronic component 120, and an encapsulant 160 encapsulating the electronic component 120. The frame 110 may include a first insulating layer 111A, a second insulating layer 111B, a third insulating layer 111C, a plurality of first wiring layers 112A and 112B each disposed between the first and second insulating layers 111A and 111B and between the first and third insulating layers 111A and 111C, internal vias 115 penetrating through the first insulating layer 111A, first vias 113A penetrating through the second insulating layer 111B, and second vias 113B penetrating through the third insulating layer 111C. The frame 110 may include a third wiring layer 131 disposed on an upper surface 110A of the third insulating layer 111C, and a second wiring layer 132 disposed on a lower surface 110B of the second insulating layer 111B.

The through-hole 110X may sequentially penetrate through the third wiring layer 131, the third insulating layer 111C, the first wiring layer 112B, the first insulating layer 111A, the first wiring layer 112A, the second insulating layer 111B, and the second wiring layer 132. At least one of the first wiring layer 112 and the second insulating layer 111B may be at a level between upper and lower surfaces of the electronic component 120. The upper surface of the electronic component 120 as shown in FIG. 36 is at a level below the upper surface 110A of the frame 110 with respect to the redistribution parts 140 and 150; the present disclosure, however, is not limited thereto. The upper surface of the electronic component 120 may be at the same level as or above the upper surface 110A of the frame 110 but below an upper surface of the third wiring layer 131, or at the same level as or above the upper surface of the third wiring layer 131, with respect to the redistribution parts 140 and 150, as long as the third wiring layer 131 and the electronic component 120 are both covered by the encapsulant 160.

Hereinafter, respective components included in the electronic component package 100O according to another example will be described in more detail, a description of contents overlapping the contents described above will be omitted, and contents different from the contents described above will be mainly described.

The first insulating layer 111A, the second insulating layer 111B, and the third insulating layer 111C may be stacked from the bottom toward the top in a sequence of the second insulating layer 111B, the first insulating layer 111A, and the third insulating layer 111C. The second insulating layer 111B and the third insulating layer 111C may be formed of the same material, and may have thicknesses corresponding to each other. The meaning that the second insulating layer 111B and the third insulating layer 111C have the thicknesses corresponding to each other is that thicknesses of the second insulating layer 111B and the third insulating layer 111C are substantially the same as each other. That is, this is a concept including a case in which a thickness difference that is ignorable in terms of warpage is present between the second insulating layer 111B and the third insulating layer 111C as well as a case in which thicknesses of the second insulating layer 111B and the third insulating layer 111C are completely the same as each other.

The first wiring layers 112A and 112B may perform various functions depending on designs of the corresponding layers. For example, the first wiring layers 111A and 112B may serve as a ground (GND) pattern, a power (PWR) pattern, a signal (S) pattern, and the like, as redistribution patterns. In addition, the first wiring layers 111A and 112B may serve as a via pad, or the like, as a pad pattern. As described above, since the first wiring layers 111A and 112B may perform a redistribution function, the first wiring layers 111A and 112B may share redistribution functions of the redistribution parts 140 and 150. A metal layer 135, a passivation layer 170, a cover layer 180, opening parts 161, 171, and 181, external connection terminals 175 and 185, an outer wiring layer 162, outer vias 163, and the like, may also be applied, if necessary.

Since a method of manufacturing the electronic component package 100O according to another example is the same as the methods of manufacturing the electronic component packages 100A to 100F except that the third insulating layer 111C is formed above the first insulating layer 111A and the first wiring layer 112B, and the like, is formed between the first insulating layer 111A and the third insulating layer 111C, a description thereof will be omitted.

Figure 37:
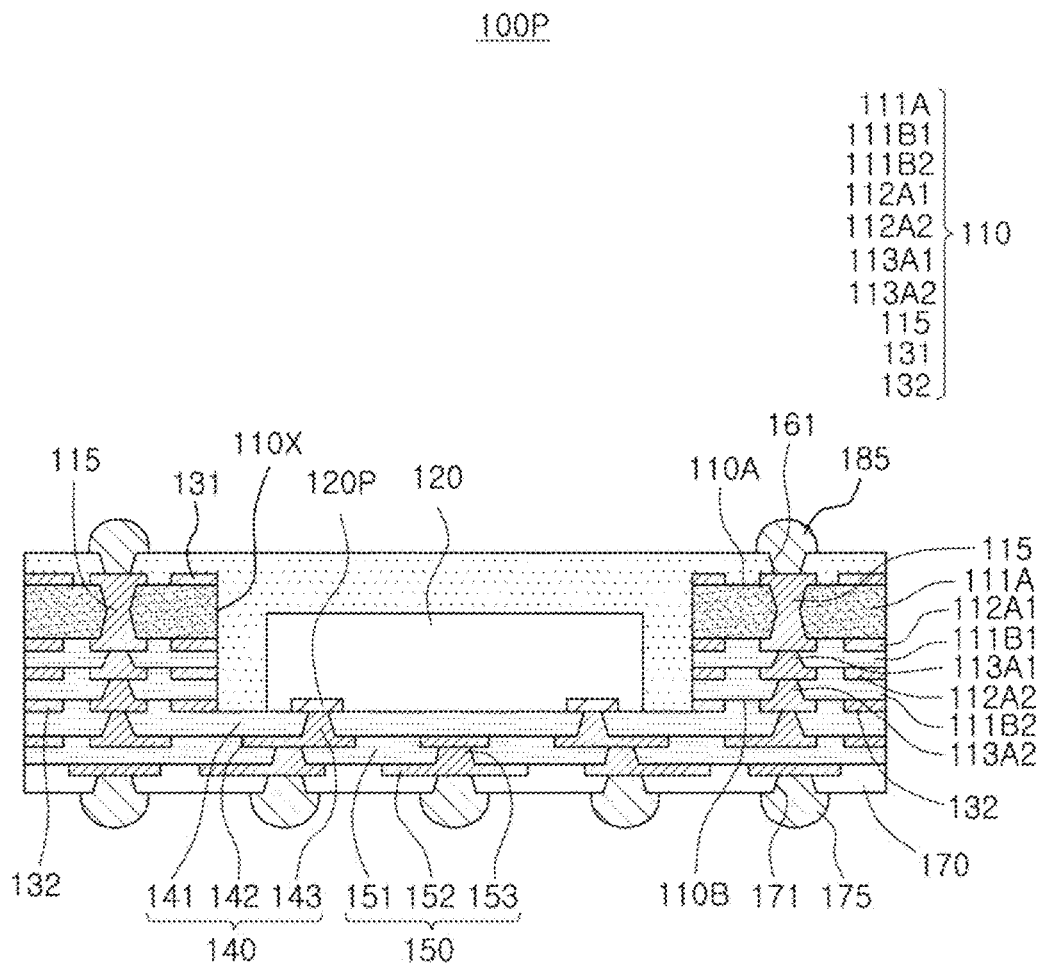
FIG. 37 is a cross-sectional view schematically illustrating another example of an electronic component package.

FIG. 37 is a cross-sectional view schematically illustrating another example of an electronic component package.

Referring to FIG. 37, an electronic component package 100P according to another example may include a frame 110 having a through-hole 110X, an electronic component 120 disposed in the through-hole 110X of the frame 110, redistribution parts 140 and 150 disposed below the frame 110 and the electronic component 120, and an encapsulant 160 encapsulating the electronic component 120. The frame 110 may include a first insulating layer 111A, a plurality of second insulating layers 111B1 and 111B2, a plurality of first wiring layers 112A1 and 112A2 each disposed between the first insulating layer 111A and the second insulating layer 111B2 or between the plurality of second insulating layers 111B1 and 111B2, internal vias 115 penetrating through the first insulating layer 111A, and a plurality of vias 113A1 and 113A2 penetrating through the second insulating layers 111B1 and 111B2, respectively. The frame 110 may include a third wiring layer 131 disposed on an upper surface 110A of the first insulating layer 111A, and a second wiring layer 132 disposed on a lower surface 110B of the second insulating layer 111B2.

The through-hole 110X may sequentially penetrate through the third wiring layer 131, the first insulating layer 111A, the first wiring layer 112A1, the second insulating layer 111B1, the first wiring layer 112A2, the second insulating layer 111B2, and the second wiring layer 132. At least one of the plurality of first wiring layers 112A1 and 112A2 and the plurality of second insulating layers 111B1 and 111B2 may be at a level between upper and lower surfaces of the electronic component 120. The upper surface of the electronic component 120 as shown in FIG. 37 is at a level below the upper surface 110A of the frame 110 with respect to the redistribution parts 140 and 150; the present disclosure, however, is not limited thereto. The upper surface of the electronic component 120 may be at the same level as or above the upper surface 110A of the frame 110 but below an upper surface of the third wiring layer 131, or at the same level as or above the upper surface of the third wiring layer 131, with respect to the redistribution parts 140 and 150, as long as the third wiring layer 131 and the electronic component 120 are both covered by the encapsulant 160.

Hereinafter, respective components included in the electronic component package 100P according to another example will be described in more detail, a description of contents overlapping the contents described above will be omitted, and contents different from the contents described above will be mainly described.

In a case in which the number of second insulating layers 111B1 and 111B2 is plural, the first wiring layer 112A2 may also be disposed between the plurality of second insulating layers 111B1 and 111B2. As a result, the first wiring layers may further substitute for the redistribution functions of the redistribution parts 140 and 150. The number of second insulating layers 111B1 and 111B2 and the number of first wiring layers 112A1 and 112A2 are not particularly limited, and may be plural depending on design particulars. A metal layer 135, a passivation layer 170, a cover layer 180, opening parts 161, 171, and 181, external connection terminals 175 and 185, an outer wiring layer 162, outer vias 163, and the like, may also be applied, if necessary.

Since a method of manufacturing the electronic component package 100P according to another example is the same as the methods of manufacturing the electronic component packages 100A to 100F except that the number of second insulating layers 111B1 and 111B2 is plural, a description thereof will be omitted.

Figure 38:
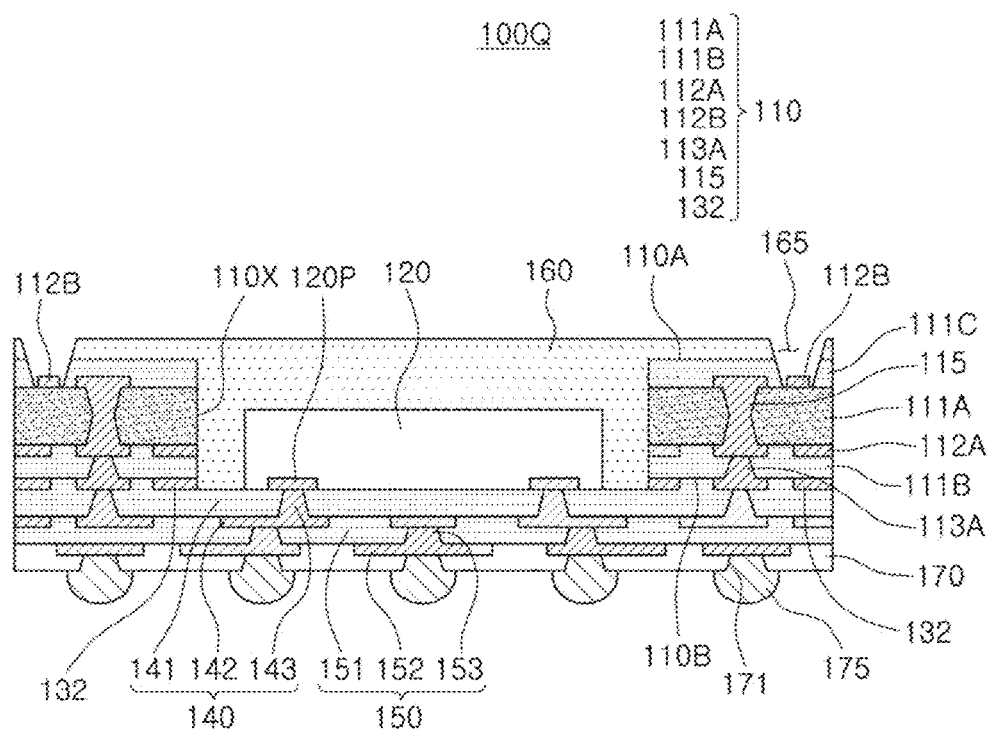
FIG. 38 is a cross-sectional view schematically illustrating another example of an electronic component package.

FIG. 38 is a cross-sectional view schematically illustrating another example of an electronic component package.

Referring to FIG. 38, an electronic component package 100Q according to another example may include a frame 110 having a through-hole 110X, an electronic component 120 disposed in the through-hole 110X of the frame 110, redistribution parts 140 and 150 disposed below the frame 110 and the electronic component 120, and an encapsulant 160 encapsulating the electronic component 120. The frame 110 may include a first insulating layer 111A, a second insulating layer 111B, a third insulating layer 111C, a plurality of first wiring layers 112A and 112B each disposed between the first and second insulating layers 111A and 111B and between the first and third insulating layers 111A and 111C, internal vias 115 penetrating through the first insulating layer 111A, first vias 113A penetrating through the second insulating layer 111B, and a second wiring layer 132 disposed on a lower surface 110B of the second insulating layer 111B. Here, the encapsulant 160 and the third insulating layer 111C may have fourth opening parts 165, and portions of the first wiring layer 112B disposed between the first and third insulating layers 111A and 111C may be externally exposed by the fourth opening parts 165.

The through-hole 110X may sequentially penetrate through the third insulating layer 111C, the first wiring layer 112B, the first insulating layer 111A, the first wiring layer 112A, the second insulating layers 111B, and the second wiring layer 132. At least one of the plurality of first wiring layers 112A and 112B and the second insulating layer 111B may be at a level between upper and lower surfaces of the electronic component 120. The upper surface of the electronic component 120 as shown in FIG. 38 is at a level below the upper surface 110A of the frame 110 with respect to the redistribution parts 140 and 150; the present disclosure, however, is not limited thereto. The upper surface of the electronic component 120 may be at the same level as or above the upper surface 110A of the frame 110, with respect to the redistribution parts 140 and 150, as long as the third insulating layer 111C and the electronic component 120 are both covered by the encapsulant 160.

Hereinafter, respective components included in the electronic component package 100Q according to another example will be described in more detail, a description of contents overlapping the contents described above will be omitted, and contents different from the contents described above will be mainly described.

The first wiring layer 112B may be disposed between the first and third insulating layers 111A and 111C. For example, the first wiring layer 112B may be disposed on an upper surface of the first insulating layer 111A except for some patterns externally exposed through the fourth opening parts 165, and may be embedded in the third insulating layer 111C. That is, the first wiring layer 112B may be disposed in the frame 110. Here, the meaning that the first wiring layer 112B is disposed in the frame 110 is that the first wiring layer 112B is disposed between the upper surface 110A and the lower surface 110B of the frame 110. The first wiring layer 112B may perform various functions depending on a design of the corresponding layer. For example, the first wiring layer 112B may serve as a ground (GND) pattern, a power (PWR) pattern, a signal (S) pattern, and the like, as redistribution patterns. Here, the signal (S) pattern may include various signals except for the ground (GND) pattern, the power (PWR) pattern, and the like, such as data signals, and the like. In addition, the first wiring layer 112B may serve as a via pad, an internal via pad, or the like, as a pad pattern. As described above, since the first wiring layer 112B may perform a redistribution function, the first wiring layer 112B may share redistribution functions of the redistribution parts 140 and 150. A conductive material such as copper (Cu), aluminum (Al), silver (Ag), tin (Sn), gold (Au), nickel (Ni), lead (Pb), or alloys thereof, may be used as a material of the first wiring layer 112B. A thickness of the first wiring layer 112B is also not particularly limited, but may be, for example, about 10 μm to 50 μm. Patterns of the first wiring layer 112B externally exposed through the fourth opening parts 165 may be wiring bonding pads for connection to another electronic component, another electronic component package, or the like, disposed on the electronic component package 100Q. The second insulating layer 111B and the third insulating layer 111C may be formed of the same material, and may have thicknesses corresponding to each other. The meaning that the second insulating layer 111B and the third insulating layer 111C have the thicknesses corresponding to each other is that thicknesses of the second insulating layer 111B and the third insulating layer 111C are substantially the same as each other. That is, this is a concept including a case in which a thickness difference that is ignorable in terms of warpage is present between the second insulating layer 111B and the third insulating layer 111C as well as a case in which thicknesses of the second insulating layer 111B and the third insulating layer 111C are completely the same as each other. A metal layer 135, a passivation layer 170, opening parts 171, external connection terminals 175, and the like, may also be applied, if necessary.

Since a method of manufacturing the electronic component package 100Q according to another example is the same as the methods of manufacturing the electronic component packages 100B and 100E except that the third insulating layer 111C is formed above the first insulating layer 111A and the fourth opening parts 165 are formed, a description thereof will be omitted.

Figure 39:
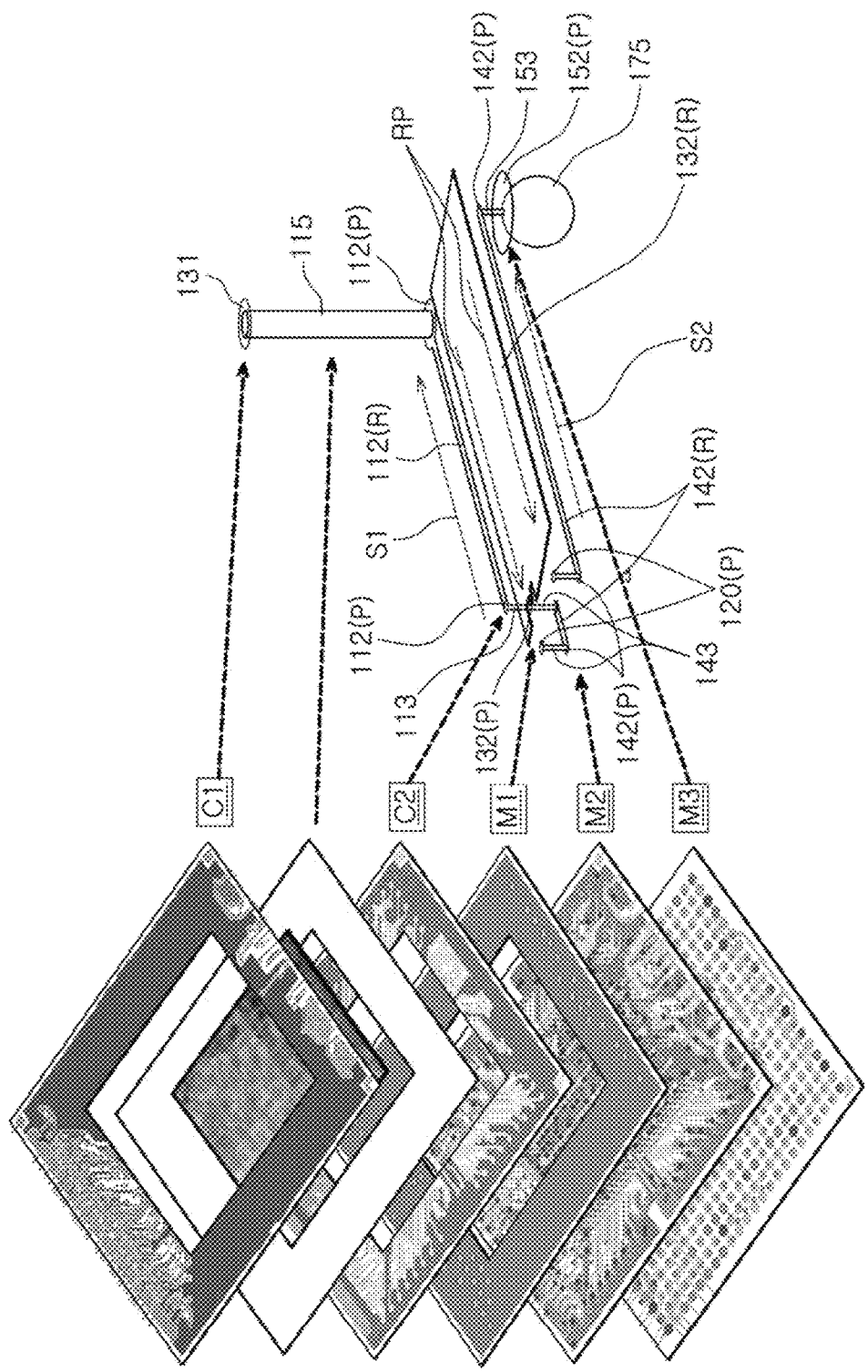
FIG. 39 is a view schematically illustrating an example of a signal transfer of the electronic component package.

FIG. 39 is a view schematically illustrating an example of a signal transfer of the electronic component package.

A case in which the electronic component package 100B described above is used as an electronic component package will be described, a description of contents overlapping the contents described above will be omitted, and contents different from the contents described above will be mainly described.

In an example, most of the second wiring layer 132 (M1) may be formed of a ground (GND) pattern, such as a ground plane. Since most of the second wiring layer 132 (M1) that may be formed before the electronic component 120 is disposed is formed of the ground (GND) pattern, the ground (GND) patterns of the wiring layers 142 and 152 (M2 and M3) may be significantly reduced. Therefore, another required redistribution pattern R and/or pad pattern P may be sufficiently designed using only two layers M2 and M3. As a result, the number of processes of forming the redistribution parts after the electronic component 120 is disposed may be significantly reduced. Here, the meaning that most of the second wiring layer is formed of the ground (GND) pattern is that an area of the ground (GND) pattern is a half or more of a plane area of the second wiring layer.

The ground (GND) pattern forming the second wiring layer 132 (M1) may serve as return paths (RPs) of various signal (S) patterns, and the like, designed in the first wiring layer 112 (C2), the wiring layer 142 (M2), and the like. Since the ground (GND) pattern of the second wiring layer 132 (M1) sufficiently serves as the return paths RP of the various signal (S) patterns formed on the upper and lower layers as described above, after the electronic component package 100B is electrically externally connected, the electronic component package 100B may be smoothly operated.

A distance between the second wiring layer 132 (M1) and the first wiring layer 112 (C2) may be smaller than a distance between the second wiring layer 132 (M1) and the wiring layer 142 (M2). The distances may be decided in relation to a thickness direction of a cross section. As described above, in a case in which the distance between the second wiring layer 132 (M1) and the first wiring layer 112 (C2) is smaller than the distance between the second wiring layer 132 (M1) and the wiring layer 142 (M2), the ground (GND) pattern among redistribution patterns R of the second wiring layer 132 (M1) may more effectively serve as the return path RP.

Figure 40:
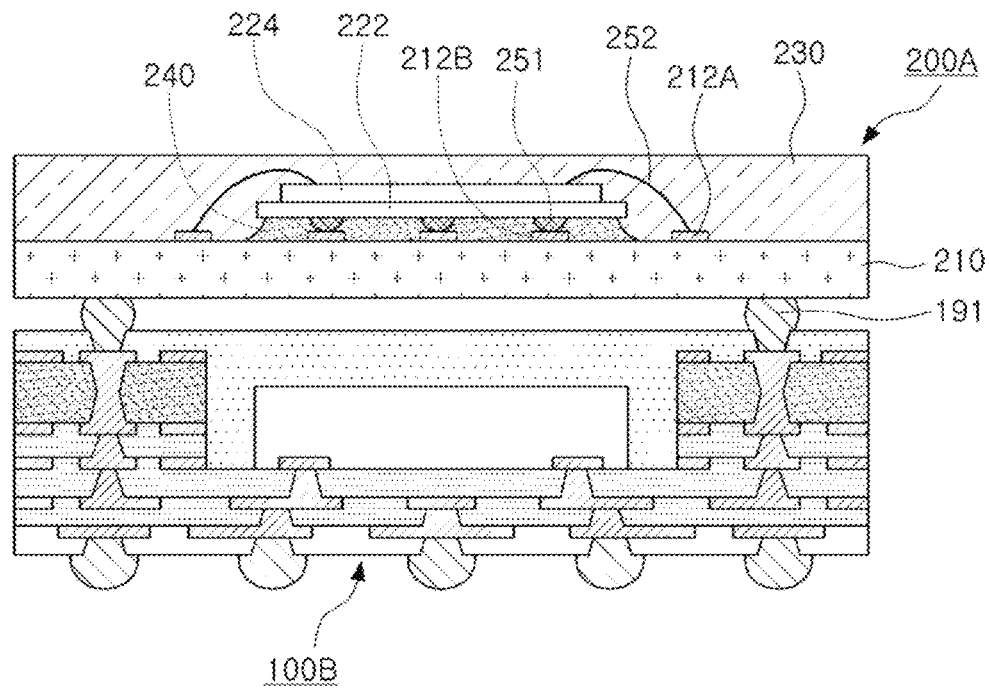
FIG. 40 is a cross-sectional view schematically illustrating another example of an electronic component package.

FIG. 40 is a cross-sectional view schematically illustrating another example of an electronic component package.

Referring to FIG. 40, an electronic component package according to another example may have a form in which a plurality of electronic component packages are stacked. The electronic component packages 100A to 100Q according to the various examples described above may be applied in various forms to the electronic component package according to the present example. For example, the electronic component package according to the present example may have a form in which another electronic component package 200A is disposed on the electronic component package 100B described above.

The electronic component package 100B may include the frame 110 having the through-hole 110X; the electronic component 120 disposed in the through-hole 110X of the frame 110; the redistribution parts 140 and 150 disposed below the frame 110 and the electronic component 120; and the encapsulant 160 encapsulating the electronic component 120, as described above. The frame 110 may include the first insulating layer 111A, the second insulating layer 111B, the first wiring layer 112 disposed between the first and second insulating layers 111A and 111B, the internal vias 115 penetrating through the first insulating layer 111A, the vias 113 penetrating through the second insulating layer 111B, the third wiring layer 131 disposed on the upper surface 110A of the first insulating layer 111A, and the second wiring layer 132 disposed on the lower surface 110B of the second insulating layer 111B. Since the respective components are the same as the components described above, a description thereof will be omitted.

The electronic component package 200A may include a wiring substrate 210, a first electronic component 222 mounted in a flip-chip form on the wiring substrate 210, and a second electronic component 224 stacked on the first electronic component 222. In addition, the electronic component package 200A may include an underfill resin 240 provided in a gap between the first electronic component 222 and the wiring substrate 210, and an encapsulation resin 230 encapsulating the first and second electronic components 222 and 224, and the like.

The first and second electronic components 222 and 224 may be an integrated circuit chip, for example, a memory chip such as a volatile memory (for example, a DRAM), a non-volatile memory (for example, a ROM), a flash memory, or the like. A plane shape of the first electronic component 222 may be larger than that of the second electronic component 224.

Bonding pads 212A and flip-chip pads 212B may be disposed on an upper surface of the wiring substrate 210. The wiring substrate 210 may include a plurality of insulating layers (not illustrated), via patterns (not illustrated) and wiring patterns (not illustrated) formed on the plurality of insulating layers, and the like. The via patterns (not illustrated) and the wiring patterns (not illustrated) of the wiring substrate 210 may be electrically connected to the bonding pads 212A, the flip-chip pads 212B, and the like.

The bonding pads 212A may be electrically connected to electrode pads (not illustrated) formed on an upper surface of the second electronic component 224 through bonding wires 252. Bumps 251 of the first electronic component 222 may be bonded in a flip-chip form to the flip-chip pads 212B. The conductive material as described above may be used as materials of the bonding pads 212A and the flip-chip pads 212B. Metal layer treatment may be performed on surfaces of the bonding pads 212A and the flip-chip pads 212B using Au, Ni/Au, Ni/Pb/Au, or the like.

The encapsulation resin 230, the purpose of which is to protect the first electronic component 222 and the second electronic component 224, may encapsulate the first electronic component 222 and the second electronic component 224. A known insulating material, such an epoxy based insulating resin, or the like, may be used as a material of the encapsulation resin 23.

The purpose of the underfill resin 240 may be to improve connection strength of connection portions between the bumps 251 of the first electronic component 222 and the flip-chip pads 212B. The underfill resin 240 may be provided in the gap between the wiring substrate 210 and the first electronic component 222. The known insulating material, such as an epoxy based insulating resin, or the like, may also be used as a material of the underfill resin 240.

Connection terminals 191 may be used to connect the electronic component package 200A to the electronic component package 100B. The electronic component package 200A and the electronic component package 100B may be stacked and bonded to each other by the connection terminals 191. The connection terminals 191 may be the second external connection terminals 185 formed on the electronic component package 100B. Alternatively, the connection terminals 191 may be external connection terminals (not illustrated) formed beneath the electronic component package 200A. Alternatively, the connection terminals 191 may be terminals formed by integrating the second external connection terminals 185 formed on the electronic component package 100B and the external connection terminals (not illustrated) formed beneath the electronic component package 200A with each other. A conductive material such as copper (Cu), aluminum (Al), silver (Ag), tin (Sn), gold (Au), nickel (Ni), lead (Pb), a solder, etc., may be used as a material of the connection terminal 191. The connection terminal 191 may be a land, a ball, a pin, or the like. The connection terminal 191 may be formed of multiple layers or a single layer. In a case in which the connection terminal 191 is formed of multiple layers, the connection terminal 191 may contain a copper pillar and a solder, and in a case in which the connection terminal 191 is formed of a single layer, the connection terminal 191 may contain a tin-silver solder or copper. However, this is only an example, and the connection terminal 191 is not limited thereto.

Figure 41:
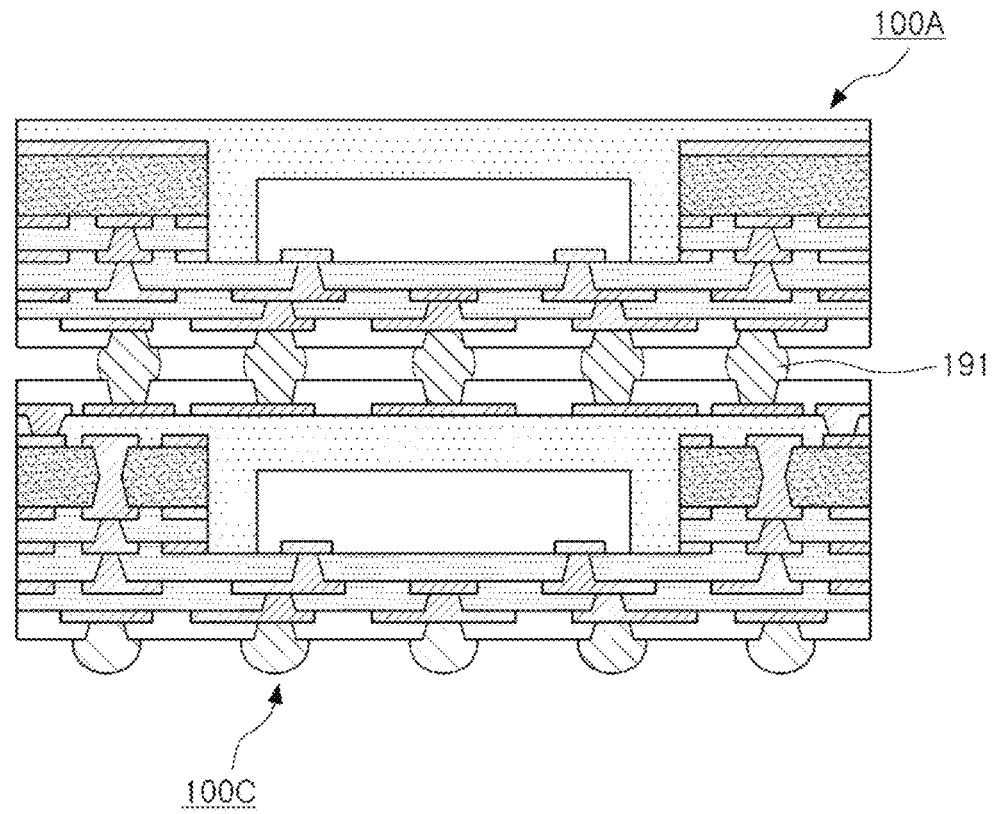
FIG. 41 is a cross-sectional view schematically illustrating another example of an electronic component package.

FIG. 41 is a cross-sectional view schematically illustrating another example of an electronic component package.

Referring to FIG. 41, an electronic component package according to another example may have a form in which the electronic component package 100A described above is stacked on the electronic component package 100C described above.

The electronic component package 100C may include the frame 110 having the through-hole 110X, the electronic component 120 disposed in the through-hole 110X of the frame 110, the redistribution parts 140 and 150 disposed below the frame 110 and the electronic component 120, the encapsulant 160 encapsulating the electronic component 120, the outer wiring layer 162 disposed on the encapsulant 160, and the outer vias 163 penetrating through the encapsulant 160, as described above. The frame 110 may include the first insulating layer 111A, the second insulating layer 111B, the first wiring layer 112 disposed between the first and second insulating layers 111A and 111B, the internal vias 115 penetrating through the first insulating layer 111A, the vias 113 penetrating through the second insulating layer 111B, the third wiring layer 131 disposed on the upper surface 110A of the first insulating layer 111A, and the second wiring layer 132 disposed on the lower surface 110B of the second insulating layer 111B. Since the respective components are the same as the components described above, a description thereof will be omitted.

The electronic component package 100A may include the frame 110 having the through-hole 110X, the electronic component 120 disposed in the through-hole 110X of the frame 110, the redistribution parts 140 and 150 disposed below the frame 110 and the electronic component 120, and the encapsulant 160 encapsulating the electronic component 120, as described above. The frame 110 may include the first insulating layer 111A, the second insulating layer 111B, the first wiring layer 112 disposed between the first and second insulating layers 111A and 111B, the metal layer 135 disposed on the upper surface of the first insulating layer 111A, the second wiring layer 132 disposed on the lower surface of the second insulating layer 111B, and the vias 113 penetrating through the second insulating layer 111B. Since the respective components are the same as the components described above, a description thereof will be omitted.

The electronic component package 100C and the electronic component package 100A may be stacked and bonded to each other by connection terminals 191. The connection terminals 191 may be the second external connection terminals 185 formed on the electronic component package 100C. Alternatively, the connection terminals 191 may be the first external connection terminals 175 formed beneath the electronic component package 100A. Alternatively, the connection terminals 191 may be terminals formed by integrating the second external connection terminals 185 formed on the electronic component package 100C and the first external connection terminals 175 formed beneath the electronic component package 100A with each other. A conductive material such as copper (Cu), aluminum (Al), silver (Ag), tin (Sn), gold (Au), nickel (Ni), lead (Pb), a solder, etc., may be used as a material of the connection terminal 191. The connection terminal 191 may be a land, a ball, a pin, or the like. The connection terminal 191 may be formed of multiple layers or a single layer. In a case in which the connection terminal 191 is formed of multiple layers, the connection terminal 191 may contain a copper pillar and a solder, and in a case in which the connection terminal 191 is formed of a single layer, the connection terminal 191 may contain a tin-silver solder or copper. However, this is only an example, and the connection terminal 191 is not limited thereto.

Figure 42:
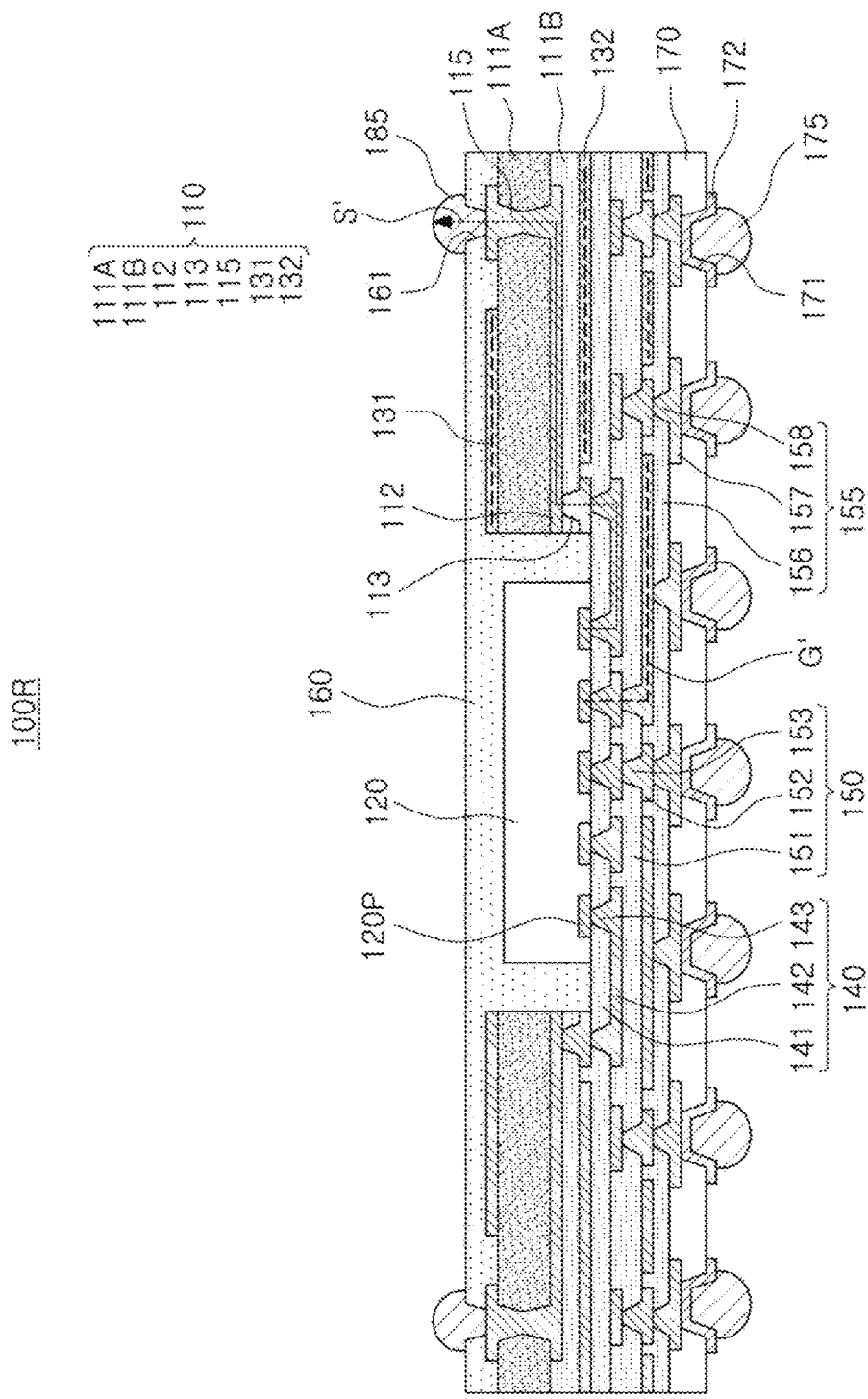
FIG. 42 is a cross-sectional view schematically illustrating another example of an electronic component package.

FIG. 42 is a cross-sectional view schematically illustrating another example of an electronic component package.

Referring to FIG. 42, an electronic component package 100R according to another example may include a frame 110 having a through-hole 110X, an electronic component 120 disposed in the through-hole 110X of the frame 110, redistribution parts 140, 150, and 155 disposed below the frame 110 and the electronic component 120, and an encapsulant 160 encapsulating the electronic component 120. The frame 110 may include a first insulating layer 111A, a second insulating layer 111B, a first wiring layer 112 disposed between the first and second insulating layers 111A and 111B, internal vias 115 penetrating through the first insulating layer 111A, vias 113 penetrating through the second insulating layer 111B, a third wiring layer 131 disposed on an upper surface 110A of the first insulating layer 111A, and a second wiring layer 132 disposed on a lower surface of the second insulating layer 111B.

The redistribution part 155 may include a redistribution part insulating layer 156, a redistribution part wiring layer 157 disposed on the redistribution part insulating layer 156, and a redistribution part via 158 penetrating through the redistribution part insulating layer 156 to thereby be electrically connected to the redistribution part wiring layer 157. The encapsulant 160 may have second opening parts 161 exposing at least portions of the third wiring layer 131 disposed on the upper surface 110A of the frame 110. In addition, second external connection terminals 185 externally exposed may be disposed in the second opening parts 161 of the encapsulant 160. The second external connection terminals 185 may be connected to the third wiring layer 131 exposed through the second opening part 161. A passivation layer 170 having first opening parts 171 may be disposed below the redistribution part 155, under-bump metal layers 172 may be disposed in the first opening part 171, and first external connection terminals 175 may be disposed on the under-bump metal layers 172.

The through-hole 110X may sequentially penetrate through the third wiring layer 131, the first insulating layer 111A, the first wiring layer 112, the second insulating layer 111B, and the second wiring layer 132. At least one of the first wiring layer 112 and the second insulating layer 111B may be at a level between upper and lower surfaces of the electronic component 120. The upper surface of the electronic component 120 as shown in FIG. 42 is at a level below the upper surface 110A of the frame 110 with respect to the redistribution parts 140 and 150; the present disclosure, however, is not limited thereto. The upper surface of the electronic component 120 may be at the same level as or above the upper surface 110A of the frame 110 but below an upper surface of the third wiring layer 131, or at the same level as or above the upper surface of the third wiring layer 131, with respect to the redistribution parts 140, 150, and 155, as long as the third wiring layer 131 and the electronic component 120 are both covered by the encapsulant 160.

Hereinafter, a signal movement path in the electronic component package 100R according to another example and a layout of a ground depending on the signal movement path will be described in more detail, a description of contents overlapping the contents described above will be omitted, and contents different from the contents described above will be mainly described.

The electronic component 120 may have an electrode pad for a signal (at least one along a path S', of the electrode pads 120P), the electrode pad for a signal (at least one along the path S', of the electrode pads 120P) may be electrically connected to a signal pattern of a wiring layer 142 of the redistribution part 140 (at least one signal pattern along the path S' in the wiring layer 142) through a first via for a signal of the redistribution part 140 (at least one along the path S', of the vias 143), the signal pattern of the wiring layer 142 of the redistribution part 140 (at least one signal pattern along the path S' in the wiring layer 142) may be electrically connected to a signal pattern of the second wiring layer 132 of the frame 110 (at least one signal pattern along the path S' in the second wiring layer 132) through a second via for a signal of the redistribution part 140 (at least another along the path S', of the vias 143), the signal pattern of the second wiring layer 132 of the frame 110 (at least one signal pattern along the path S' in the second wiring layer 132) may be electrically connected to a signal pattern of the first wiring layer 112 of the frame 110 (at least one signal pattern along the path S' in the first wiring layer 112) through a via for a signal of the frame 110 (at least one along the path S', of the vias 113), the signal pattern of the first wiring layer 112 of the frame 110 (at least one signal pattern along the path S' in the first wiring layer 112) may be electrically connected to a signal pattern of the third wiring layer 131 of the frame 110 (at least one signal pattern along the path S' in the third wiring layer 131) through an internal via for a signal of the frame 110 (at least one along the path S', of the internal vias 115), the signal pattern of the third wiring layer 131 of the frame 110 (at least one signal pattern along the path S' in the third wiring layer 131) may be electrically connected to an external connection terminal for a signal disposed in a fan-out region above the frame 110 (at least one along the path S', of the external connection terminals 185), and the second and third wiring layers 132 and 131 of the frame 110 may have a ground pattern providing a return path of the signal (at least one ground pattern along a path G' in the third wiring layer 131 and at least one ground pattern along the path G' in the second wiring layer 132).

For example, the purpose of some of the electrode pads 120P of the electronic component 120 may be for signal connection, and the purpose of the other of the electrode pads 120P may be for ground connection. Some of the signals may start from an electrode pad for signal connection (at least one along the path S', of the electrode pads 120P), move to a signal pattern of the wiring layer 142 of the redistribution part (at least one signal pattern along the path S' in the wiring layer 142) through a via for a signal of the redistribution part (at least one along the path S', of the vias 143), move to a signal pattern of the second wiring layer 132 of the frame 110 (at least one signal pattern along the path S' in the second wiring layer 132) through a via 143 for a signal of the redistribution part, move to a signal pattern of the first wiring layer 112 of the frame 110 (at least one signal pattern along the path S' in the first wiring layer 112) through a via for a signal of the frame 110 (at least one along the path S', of the vias 113), move to a signal pattern of the third wiring layer 131 of the frame 110 (at least one signal pattern along the path S' in the third wiring layer 131) through an internal via for a signal of the frame 110 (at least one along the path S', of the internal vias 115), and then move externally through a second external connection terminal for a signal (at least one along the path S', of the second external connection terminals 185).

In order to provide the return path of the signal along the movement path described above, ground patterns may be formed above and below the movement path described above. The ground patterns may be formed on the second wiring layer 132 and the third wiring layer 131 of the frame 110 as well as on the redistribution part wiring layers 142 and 152. In a case in which most of the first wiring layer 112 of the frame 110 has the signal pattern formed thereon, most of the second wiring layer 132 and the third wiring layer 131 corresponding to a lower portion and/or an upper portion of the first wiring layer 112 may have the ground pattern formed thereon. In addition, most of the redistribution part wiring layer 142 may have the signal pattern formed thereon, and most of the redistribution part wiring layer 152 may have the ground pattern formed thereon. As described above, the frame 110 may be utilized as a redistribution region for the signal pattern, the ground pattern, and the like, and since the frame 110 may be formed before the electronic component 120 is disposed, a process yield, or the like, may be improved. The ground pattern may have a plate shape, or the like, but is not limited thereto.

Figure 43:
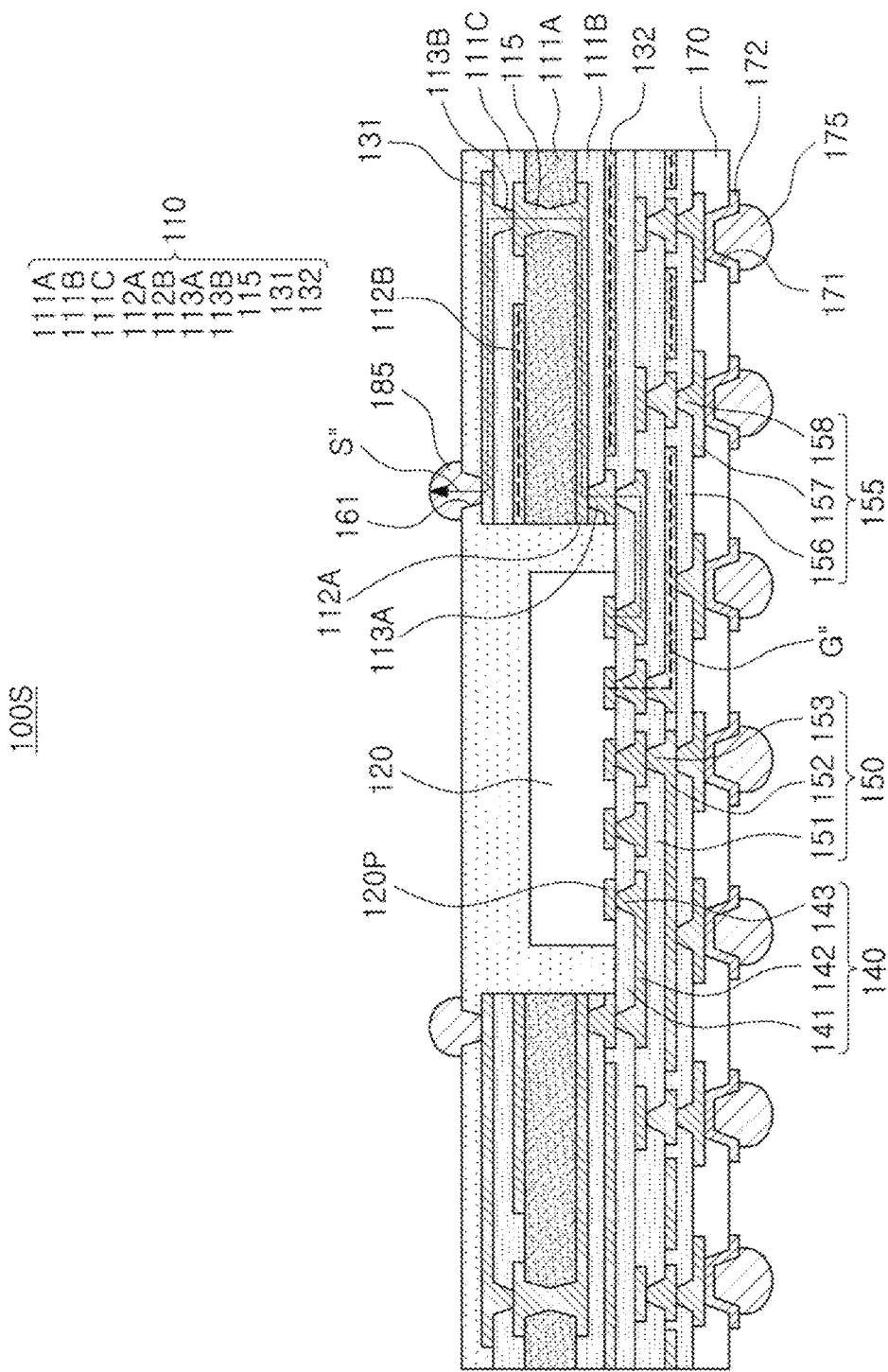
FIG. 43 is a cross-sectional view schematically illustrating another example of an electronic component package.

FIG. 43 is a cross-sectional view schematically illustrating another example of an electronic component package.

Referring to FIG. 43, an electronic component package 100S according to another example may include a frame 110 having a through-hole 110X, an electronic component 120 disposed in the through-hole 110X of the frame 110, redistribution parts 140, 150, and 155 disposed below the frame 110 and the electronic component 120, and an encapsulant 160 encapsulating the electronic component 120. The frame 110 may include a first insulating layer 111A, a second insulating layer 111B, a third insulating layer 111C, a plurality of first wiring layers 112A and 112B each disposed between the first and second insulating layers 111A and 111B and between the first and third insulating layers 111A and 111C, internal vias 115 penetrating through the first insulating layer 111A, first vias 113A penetrating through the second insulating layer 111B, and second vias 113B penetrating through the third insulating layer 111C. The frame 110 may further include a third wiring layer 131 disposed on an upper surface 110A of the third insulating layer 111C and a second wiring layer 132 disposed on a lower surface of the second insulating layer 111B.

The redistribution part 155 may include a redistribution part insulating layer 156, a redistribution part wiring layer 157 disposed on the redistribution part insulating layer 156, and a redistribution part via 158 penetrating through the redistribution part insulating layer 156 to thereby be electrically connected to the redistribution part wiring layer 157. The encapsulant 160 may have second opening parts 161 exposing at least portions of the third wiring layer 131 disposed on the upper surface 110A of the frame 110. In addition, second external connection terminals 185 externally exposed may be disposed in the second opening parts 161 of the encapsulant 160. The second external connection terminals 185 may be connected to the third wiring layer 131 exposed through the second opening part 161. A passivation layer 170 having first opening parts 171 may be disposed below the redistribution part 155, under-bump metal layers 172 may be disposed in the first opening part 171, and first external connection terminals 175 may be disposed on the under-bump metal layers 172.

The through-hole 110X may sequentially penetrate through the third wiring layer 131, the third insulating layer 111C, the first wiring layer 112B, the first insulating layer 111A, the first wiring layer 112A, the second insulating layer 111B, and the second wiring layer 132. At least one of the first wiring layer 112 and the second insulating layer 111B may be at a level between upper and lower surfaces of the electronic component 120. The upper surface of the electronic component 120 as shown in FIG. 43 is at a level below the upper surface 110A of the frame 110 with respect to the redistribution parts 140 and 150; the present disclosure, however, is not limited thereto. The upper surface of the electronic component 120 may be at the same level as or above the upper surface 110A of the frame 110 but below an upper surface of the third wiring layer 131, or at the same level as or above the upper surface of the third wiring layer 131, with respect to the redistribution parts 140, 150 and 155, as long as the third wiring layer 131 and the electronic component 120 are both covered by the encapsulant 160.

Hereinafter, a signal movement path in the electronic component package 100S according to another example and a layout of a ground depending on the signal movement path will be described in more detail, a description of contents overlapping the contents described above will be omitted, and contents different from the contents described above will be mainly described.

The electronic component 120 may have an electrode pad for a signal (at least one along a path S'', of the electrode pads 120P), the electrode pad for a signal (at least one along the path S'', of the electrode pads 120P) may be electrically connected to a signal pattern of a wiring layer 142 of the redistribution part 140 (at least one signal pattern along the path S'' in the wiring layer 142) through a first via for a signal of the redistribution part 140 (at least one along the path S'', of the vias 143), the signal pattern of the wiring layer 142 of the redistribution part 140 (at least one signal pattern along the path S'' in the wiring layer 142) may be electrically connected to a signal pattern of the second wiring layer 132 of the frame 110 (at least one signal pattern along the path S'' in the second wiring layer 132) through a second via for a signal of the redistribution part 140 (at least another along the path S", of the vias 143), the signal pattern of the second wiring layer 132 of the frame 110 (at least one signal pattern along the path S" in the second wiring layer 132) may be electrically connected to a signal pattern of the first wiring layer 112A of the frame 110 (at least one signal pattern along the path S" in the first wiring layer 112A) through a via for a lower signal of the frame 110 (at least one along the path S", of the vias 113A), the signal pattern of the first wiring layer 112A of the frame 110 (at least one signal pattern along the path S" in the first wiring layer 112A) may be electrically connected to a signal pattern of the first wiring layer 112B of the frame 110 (at least one signal pattern along the path S" in the first wiring layer 112B) through an internal via for a signal of the frame 110 (at least one along the path S", of the internal vias 115), the signal pattern of the first wiring layer 112B of the frame 110 (at least one signal pattern along the path S" in the first wiring layer 112B) may be electrically connected to a signal pattern of the third wiring layer 131 of the frame 110 (at least one signal pattern along the path S" in the third wiring layer 131) through a via for an upper signal of the frame 110, the signal pattern of the third wiring layer 131 of the frame 110 (at least one signal pattern along the path S" in the third wiring layer 131) may be electrically connected to an external connection terminal for a signal disposed in a fan-out region above the frame 110 (at least one along the path S", of the external connection terminals 185), and the second wiring layer 132 and the first wiring layer 112B of the frame 110 may have a ground pattern providing a return path of the signal (at least one ground pattern along a path G" in the second wiring layer 132 and at least one ground pattern along the path G" in the first wiring layer 112B).

For example, the purpose of some of the electrode pads 120P of the electronic component 120 may be for signal connection, and the purpose of the other of the electrode pads 120P may be for ground connection. Some of the signals may start from an electrode pad for signal connection (at least one along the path S", of the electrode pads 120P), move to a signal pattern of the redistribution part wiring layer 142 (at least one signal pattern along the path S" in the redistribution part wiring layer 142) through a first via for a signal of the redistribution part (at least one along the path S", of the vias 143), move to a signal pattern of the second wiring layer 132 of the frame 110 (at least one signal pattern along the path S" in the second wiring layer 132) through a second via for a signal of the redistribution part (at least one along the path S", of the vias 143), move to a signal pattern of the first wiring layer 112A of the frame 110 (at least one signal pattern along the path S" in the first wiring layer 112A) through a via for a lower signal of the frame 110 (at least one along the path S", of the vias 113A), move to a signal pattern of the first wiring layer 112B of the frame 110 (at least one signal pattern along the path S" in the first wiring layer 112B) through an internal via for a signal of the frame 110 (at least one along the path S", of the internal vias 115), move to a signal pattern of the third wiring layer 131 of the frame 110 (at least one signal pattern along the path S" in the third wiring layer 131) through a via for an upper signal of the frame 110 (at least one along the path S", of the vias 113B), and then move externally through a second external connection terminal for a signal (at least one along the path S", of the second external connection terminals 185).

In order to provide the return path of the signal along the movement path described above, ground patterns may be formed above and below the movement path described above. The ground patterns may be formed on the second wiring layer 132 and the first wiring layer 112B of the frame 110 as well as on the redistribution part wiring layers 142 and 152. In a case in which most of the first wiring layer 112A of the frame 110 has the signal pattern formed thereon, most of the second wiring layer 132 and the first wiring layer 112B corresponding to a lower portion and/or an upper portion of the first wiring layer 112A may have the ground pattern formed thereon. In addition, most of the redistribution part wiring layer 142 may have the signal pattern formed thereon, and most of the redistribution part wiring layer 152 may have the ground pattern formed thereon. As described above, the frame 110 may be utilized as a redistribution region for the signal pattern, the ground pattern, and the like, and since the frame 110 may be formed before the electronic component 120 is disposed as described above, a process yield, or the like, may be improved. The ground pattern may have a plate shape, or the like, but is not limited thereto.

Figure 44:
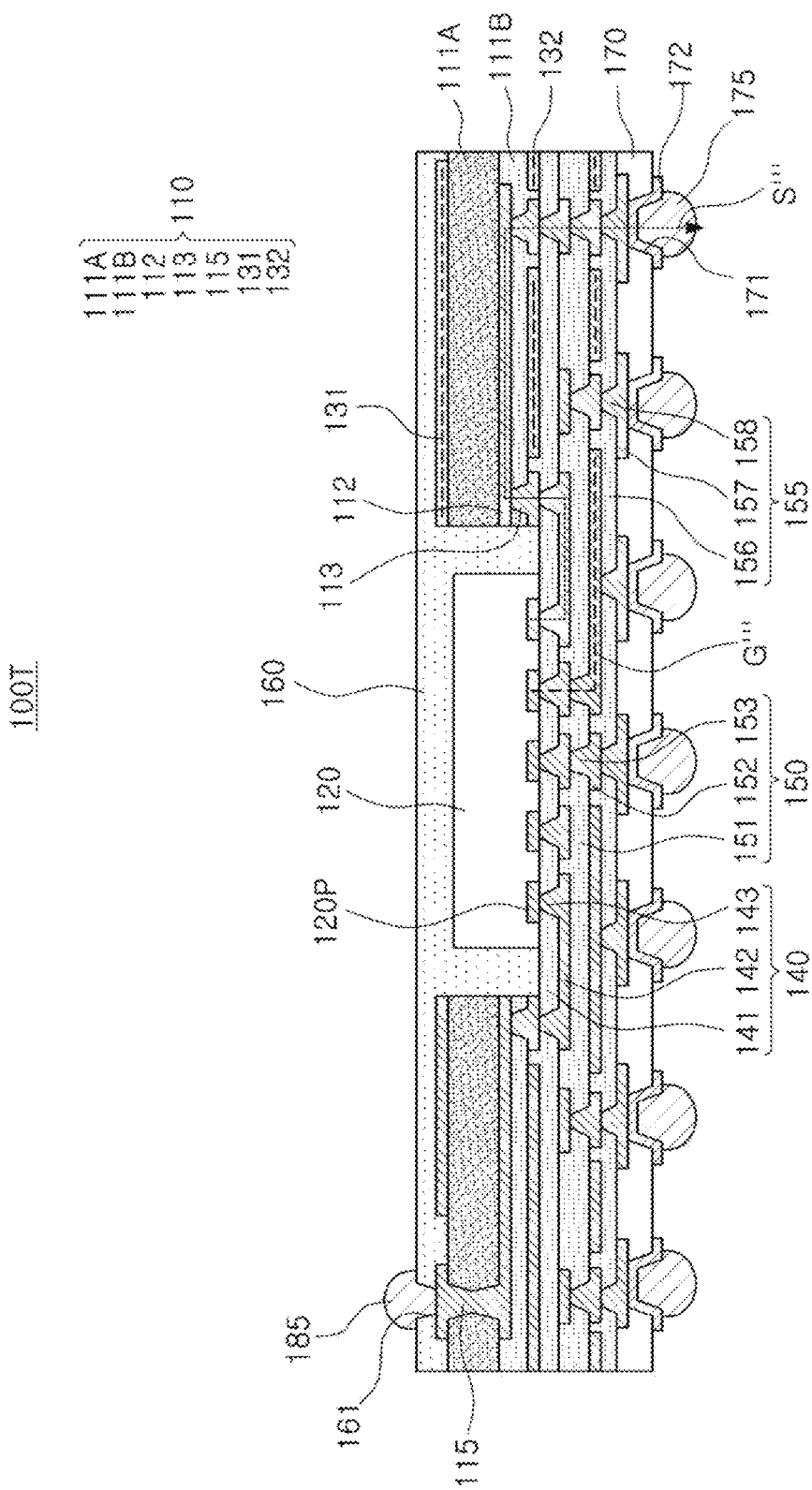
FIG. 44 is a cross-sectional view schematically illustrating another example of an electronic component package.

FIG. 44 is a cross-sectional view schematically illustrating another example of an electronic component package.

Referring to FIG. 44, an electronic component package 100T according to another example may include a frame 110 having a through-hole 110X, an electronic component 120 disposed in the through-hole 110X of the frame 110, redistribution parts 140, 150, and 155 disposed below the frame 110 and the electronic component 120, and an encapsulant 160 encapsulating the electronic component 120. The frame 110 may include a first insulating layer 111A, a second insulating layer 111B, a first wiring layer 112 disposed between the first and second insulating layers 111A and 111B, internal vias 115 penetrating through the first insulating layer 111A, vias 113 penetrating through the second insulating layer 111B, a third wiring layer 131 disposed on an upper surface 110A of the first insulating layer 111A, and a second wiring layer 132 disposed on a lower surface 110B of the second insulating layer 111B.

The redistribution part 155 may include a redistribution part insulating layer 156, a redistribution part wiring layer 157 disposed on the redistribution part insulating layer 156, and a redistribution part via 158 penetrating through the redistribution part insulating layer 156 to thereby be electrically connected to the redistribution part wiring layer 157. The encapsulant 160 may have second opening parts 161 exposing at least portions of the third wiring layer 131 disposed on the upper surface 110A of the frame 110. In addition, second external connection terminals 185 externally exposed may be disposed in the second opening parts 161 of the encapsulant 160. The second external connection terminals 185 may be connected to the third wiring layer 131 exposed through the second opening part 161. A passivation layer 170 having first opening parts 171 may be disposed below the redistribution part 155, under-bump metal layers 172 may be disposed in the first opening part 171, and first external connection terminals 175 may be disposed on the under-bump metal layers 172.

The through-hole 110X may sequentially penetrate through the third wiring layer 131, the first insulating layer 111A, the first wiring layer 112, the second insulating layer 111B, and the second wiring layer 132. At least one of the first wiring layer 112 and the second insulating layer 111B may be at a level between upper and lower surfaces of the electronic component 120. The upper surface of the electronic component 120 as shown in FIG. 44 is at a level below the upper surface 110A of the frame 110 with respect to the redistribution parts 140 and 150; the present disclosure, however, is not limited thereto. The upper surface of the electronic component 120 may be at the same level as or above the upper surface 110A of the frame 110 but below an upper surface of the third wiring layer 131, or at the same level as or above the upper surface of the third wiring layer 131, with respect to the redistribution parts 140, 150 and 155, as long as the third wiring layer 131 and the electronic component 120 are both covered by the encapsulant 160.

Hereinafter, a signal movement path in the electronic component package 100T according to another example and a layout of a ground depending on the signal movement path will be described in more detail, a description of contents overlapping the contents described above will be omitted, and contents different from the contents described above will be mainly described.

The electronic component 120 may have an electrode pad for a signal (at least one along a path S''', of the electrode pads 120P), the electrode pad for a signal (at least one along the path S''', of the electrode pads 120P) may be electrically connected to a first signal pattern of a wiring layer 142 of the redistribution part 140 (at least one signal pattern along the path S''' in the wiring layer 142) through a first via for a signal of the redistribution part 140 (at least one along the path S''', of the vias 143), the first signal pattern of the wiring layer 142 of the redistribution part 140 (at least one signal pattern along the path S''' in the wiring layer 142) may be electrically connected to a first signal pattern of the second wiring layer 132 of the frame 110 (at least one signal pattern along the path S''' in the second wiring layer 132) through a second via for a signal of the redistribution part 140 (at least another along the path S''', of the vias 143), the first signal pattern of the second wiring layer 132 of the frame 110 (at least one signal pattern along the path S''' in the second wiring layer 132) may be electrically connected to a signal pattern of the first wiring layer 112 of the frame 110 (at least one signal pattern along the path S''' in the first wiring layer 112) through a first via for a signal of the frame 110 (at least one along the path S''', of the vias 113), the signal pattern of the first wiring layer 112 of the frame 110 (at least one signal pattern along the path S''' in the first wiring layer 112) may be electrically connected to a second signal pattern of the second wiring layer 132 of the frame 110 (at least one signal pattern along the path S''' in the second wiring layer 132) through a second via for a signal of the frame 110 (at least one along the path S''', of the vias 113), the second signal pattern of the second wiring layer 132 of the frame 110 (at least another signal pattern along the path S''' in the second wiring layer 132) may be electrically connected to a second signal pattern of the wiring layer 142 of the redistribution part 140 (at least another signal pattern along the path S''' in the wiring layer 142) through a via for a third signal of the redistribution part 140 (at least still another along the path S''', of the vias 113), the second signal pattern of the wiring layer 142 of the redistribution part 140 (at least another signal pattern along the path S''' in the wiring layer 142) may be electrically connected to an external connection terminal for a signal disposed in a fan-out region of one side of the redistribution parts 140, 150, and 155 (at least one along the path S''', of the external connection terminals 175) through vias for a signal of the redistribution parts 150 and 155 (at least one along the path S''', of the vias 153 and at least one along the path S''', of the vias 158), signal patterns of the wiring layers 152 and 157 (at least one signal pattern along the path S''' in the wiring layer 152 and at least one signal pattern along the path S''' in the wiring layer 157), and the like, and the second and third wiring layers 132 and 131 of the frame 110 may have a ground pattern providing a return path of the signal (at least one ground pattern along a path G''' in the third wiring layer 131 and at least one ground pattern along the path G''' in the second wiring layer 132).

For example, the purpose of some of the electrode pads 120P of the electronic component 120 may be for signal connection, and the purpose of the other of the electrode pads 120P may be for ground connection. Some of the signals may start from an electrode pad 120P for signal connection, move to a signal pattern of the redistribution part wiring layer 142 (at least one signal pattern along the path S''' in the redistribution part wiring layer 142) through a first via for a signal of the redistribution part 140 (at least one along the path S''', of the vias 143), move to a first signal pattern of the second wiring layer 132 of the frame 110 (at least one signal pattern along the path S''' in the second wiring layer 132) through a second via for a signal of the redistribution part 140 (at least one along the path S''', of the vias 143), move to a signal pattern of the first wiring layer 112 of the frame 110 (at least one signal pattern along the path S''' in the first wiring layer 112) through a first via for a signal of the frame 110 (at least one along the path S''', of the vias 113), move to a signal pattern of the second wiring layer 132 of the frame 110 (at least another signal pattern along the path S''' in the second wiring layer 132) through a second via for a signal of the frame 110 (at least another along the path S''', of the vias 113), move to a second signal pattern of the wiring layer 142 of the redistribution part 140 (at least another signal pattern along the path S''' in the wiring layer 142) through a via for a third signal of the redistribution part 140 (at least still another along the path S''', of the vias 143), move to a signal pattern of the wiring layer 152 of the redistribution part 150 (at least one signal pattern along the path S''' in the wiring layer 152) through a via for a signal of the redistribution part 150 (at least one along the path S''', of the vias 153), move to a signal pattern of the wiring layer 157 of the redistribution part 155 (at least one signal pattern along the path S''' in the wiring layer 157) through a via for a signal of the redistribution part 155 (at least one along the path S''', of the vias 158), pass through an under-bump metal layer (at least one along the path S''', of the under-bump metal layers 172) and then move externally through a first external connection terminal for a signal disposed in a fan-out region (at least one along the path S''', of the first external connection terminals 175).

In order to provide the return path of the signal along the movement path described above, ground patterns may be formed above and below the movement path described above. The ground patterns may be formed on the second wiring layer 132 and the third wiring layer 131 of the frame 110 as well as on the redistribution part wiring layers 142 and 152. In a case in which most of the first wiring layer 112 of the frame 110 has the signal pattern formed thereon, most of the second wiring layer 132 and the third wiring layer 131 corresponding to a lower portion and/or an upper portion of the first wiring layer 112 may have the ground pattern formed thereon. In addition, most of the redistribution part wiring layer 142 may have the signal pattern formed thereon, and most of the redistribution part wiring layer 152 may have the ground pattern formed thereon. As described above, the frame 110 may be utilized as a redistribution region for the signal pattern, the ground pattern, and the like, and since the frame 110 may be formed before the electronic component 120 is disposed as described above, a process yield, or the like, may be improved. The ground pattern may have a plate shape, or the like, but is not limited thereto.

A form in which a plurality of electronic component packages are stacked is not limited to the forms according to the examples described above, and may be a form in which the electronic component packages 100A to 100T according to the various examples described above are combined with each other, a form in which another type of electronic component package is disposed on the electronic component packages 100A to 100T according to the various examples described above, a form in which the electronic component packages 100A to 100T according to the various examples described above is disposed on another type of electronic component package, or the like.

The electronic component packages 100A to 100T according to the present disclosure and modified examples thereof may be applied to an electronic product in various forms other than the forms described above. For example, a modified example of an electronic component package having internal vias, a cover layer, an outer wiring layer, and outer vias among modified examples of the electronic component packages may be disposed as a lower package, and various separate surface-mounting technology (SMT) passive components (not illustrated) may be disposed on a surface of the modified example of the electronic component package. In addition, several types of electronic component packages or several other types of electronic component packages (not illustrated in the drawings) may be disposed together with passive components as an upper package. The passive components may also be disposed in opening parts, and may be physically and/or electrically connected to various exposed wiring layers through the opening parts.

As set forth above, according to an example embodiment in the present disclosure, an electronic component package in which a decrease in a yield of an electronic component is significantly suppressed, and a method of manufacturing the same, may be provided.

Meanwhile, for convenience, a term "lower portion" has been used to indicate a direction toward a mounted surface of the electronic component package in relation to cross sections of the drawings, a term "upper portion" has been used to indicate an opposite direction to the direction indicated by the term "lower portion", and a term "side portion" has been used to indicate a direction perpendicular to the directions indicated by the terms "upper portion and lower portion". In addition, a phrase "positioned at the lower portion, the upper portion, or the side portion" has been used as a concept including a case in which a target component is positioned in a corresponding direction, but does not directly contact a reference component, as well as a case in which the target component directly contacts the reference component in the corresponding direction. However, these directions have been defined for convenience of explanation, and the scope of the present disclosure is not particularly limited by the directions defined as described above.

Meanwhile, a word "connected" is a concept including a case in which any component is indirectly connected to another component by an adhesive, or the like, as well as a case in which any component is directly connected to another component. In addition, a word "electrically connected" is a concept including both of a case in which any component is physically connected to another component and a case in which any component is not physically connected to another component. In addition, terms "first", "second", and the like, are used to distinguish one component from another component, and do not limit a sequence, importance, and the like, of the corresponding components. In some cases, a first component may be named a second component and a second component may also be similarly named a first component, without departing from the scope of the present disclosure.

Meanwhile, a term "example" does not mean the same example embodiment, but is provided in order to emphasize and describe different unique features. However, the above suggested examples may also be implemented to be combined with a feature of another example. For example, even though particulars described in a specific example are not described in another example, it may be understood as a description related to another example unless described otherwise.

Meanwhile, terms used in the present disclosure are used only in order to describe an example rather than limiting the scope of the present disclosure. Here, singular forms include plural forms unless interpreted otherwise in a context.

While exemplary embodiments have been shown and described above, it will be apparent to those skilled in the art that modifications and variations could be made without departing from the scope of the present invention as defined by the appended claims.

What is claimed is:

1. An electronic component package, comprising:
 a frame having a through-hole, a plurality of insulating layers, one or more first wiring layers, disposed between the plurality of insulating layers, a second wiring layer disposed at one side of the plurality of insulating layers, and a third wiring layer disposed at another side of the plurality of insulating layers;
 an electronic component disposed in the through-hole of the frame; and
 a redistribution part disposed on one side of the frame and the electronic component,
 wherein the one or more first wiring layers are electrically connected to the electronic component through the redistribution part,
 the electronic component has an electrode pad for a signal, the electrode pad for a signal is electrically connected to a signal pattern of a wiring layer of the redistribution part through a first via for a signal of the redistribution part, the signal pattern of the wiring layer of the redistribution part is electrically connected to a signal pattern of the second wiring layer of the frame through a second via for a signal of the redistribution part, the signal pattern of the second wiring layer of the frame is electrically connected to a signal pattern of the first wiring layer of the frame through a via for a signal of the frame, the signal pattern of the first wiring layer of the frame is electrically connected to a signal pattern of the third wiring layer of the frame through an internal via for a signal of the frame, and the signal pattern of the third wiring layer of the frame is electrically connected to an external connection terminal for a signal disposed in a fan-out region of another side of the frame, and
 the second and third wiring layers of the frame have ground patterns.

2. An electronic component package comprising:
 a frame including a first insulating layer, two or more wiring layers disposed on one side of the first insulating layer, and a second insulating layer disposed between the two or more wiring layers;
 an electronic component disposed in a through-hole penetrating through the frame; and
 a redistribution part electrically connected to the two or more wiring layers and the electronic component, and having one side on which the electronic component is disposed, wherein the two or more wiring layers and the second insulating layer are disposed between the redistribution part and the first insulating layer, the frame further includes a third wiring layer disposed on another side of the first insulating layer, and the electronic component has an electrode pad for a signal, the electrode pad for a signal is electrically connected to a signal pattern of a wiring layer of the redistribution part through a first via for a signal of the redistribution part, the signal pattern of the wiring layer of the redistribution part is electrically connected to a signal pattern of one of the two or more wiring layers of the frame through a second via for a signal of the redistribution part, the signal pattern of the one of the two or more wiring layers of the frame is electrically connected to a signal pattern of another of the two or more wiring layers of the frame through a via for a signal of the frame, the signal pattern of the another of the two or more wiring layers of the frame is electrically connected to a signal pattern of the third wiring layer of the frame through an internal via for a signal of the frame, and the signal pattern of the third wiring layer of the frame is electrically connected to an external connection terminal for a signal disposed in a fan-out region.

* * * * *